(12) United States Patent
Chang et al.

(10) Patent No.: US 12,040,407 B2
(45) Date of Patent: *Jul. 16, 2024

(54) SEMICONDUCTOR DEVICES INCLUDING BACKSIDE VIAS AND METHODS OF FORMING THE SAME

(71) Applicant: Taiwan Semiconductor Manufacturing Co., Ltd., Hsinchu (TW)

(72) Inventors: Che-Lun Chang, Hsinchu (TW); Wei-Yang Lee, Taipei (TW); Chia-Pin Lin, Xinpu Township (TW); Yuan-Ching Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 11 days.

This patent is subject to a terminal disclaimer.

(21) Appl. No.: 17/814,132

(22) Filed: Jul. 21, 2022

(65) Prior Publication Data

US 2022/0367727 A1    Nov. 17, 2022

Related U.S. Application Data

(63) Continuation of application No. 17/003,170, filed on Aug. 26, 2020, now Pat. No. 11,417,767.

(Continued)

(51) Int. Cl.
*H01L 29/786*    (2006.01)
*H01L 21/02*    (2006.01)
(Continued)

(52) U.S. Cl.
CPC .. *H01L 29/78618* (2013.01); *H01L 21/02532* (2013.01); *H01L 21/02603* (2013.01);
(Continued)

(58) Field of Classification Search
CPC ......... H01L 29/78618; H01L 21/02532; H01L 21/02603; H01L 21/28518; H01L 23/5286;
(Continued)

(56) References Cited

U.S. PATENT DOCUMENTS 4,624,004 A    11/1986 Calviello
6,468,889 B1    10/2002 Iacoponi et al.
(Continued)

FOREIGN PATENT DOCUMENTS

| | | |
|---|---|---|
| CN | 101154647 A | 4/2008 |
| DE | 102014109352 A1 | 11/2015 |
| JP | 2010171166 A | 8/2010 |

*Primary Examiner* — Tong-Ho Kim
(74) *Attorney, Agent, or Firm* — Slater Matsil, LLP

(57) ABSTRACT

Semiconductor devices including backside vias with enlarged backside portions and methods of forming the same are disclosed. In an embodiment, a device includes a first transistor structure in a first device layer; a front-side interconnect structure on a front-side of the first device layer; a first dielectric layer on a backside of the first device layer; a first contact extending through the first dielectric layer to a source/drain region of the first transistor structure; and a backside interconnect structure on a backside of the first dielectric layer and the first contact, the first contact including a first portion having first tapered sidewalls and a second portion having second tapered sidewalls, widths of the first tapered sidewalls narrowing in a direction towards the backside interconnect structure, and widths of the second tapered sidewalls widening in a direction towards the backside interconnect structure.

20 Claims, 62 Drawing Sheets

Related U.S. Application Data

(60) Provisional application No. 63/030,560, filed on May 27, 2020.

(51) Int. Cl.
  *H01L 21/285* (2006.01)
  *H01L 23/528* (2006.01)
  *H01L 29/06* (2006.01)
  *H01L 29/417* (2006.01)
  *H01L 29/423* (2006.01)
  *H01L 29/45* (2006.01)
  *H01L 29/66* (2006.01)
  *H01L 29/78* (2006.01)

(52) U.S. Cl.
  CPC .... *H01L 21/28518* (2013.01); *H01L 23/5286* (2013.01); *H01L 29/0673* (2013.01); *H01L 29/41733* (2013.01); *H01L 29/42392* (2013.01); *H01L 29/45* (2013.01); *H01L 29/66545* (2013.01); *H01L 29/66553* (2013.01); *H01L 29/66636* (2013.01); *H01L 29/66742* (2013.01); *H01L 29/7848* (2013.01); *H01L 29/78696* (2013.01)

(58) Field of Classification Search
  CPC ........... H01L 29/0673; H01L 29/41733; H01L 29/42392; H01L 29/45; H01L 29/66545; H01L 29/66553; H01L 29/66636; H01L 29/66742; H01L 29/7848; H01L 29/78696; H01L 21/76897; H01L 21/76898; H01L 21/823475; H01L 23/481; H01L 23/5283; H01L 29/0847; H01L 29/41791; H01L 23/485; H01L 21/76838; H01L 21/76804; H01L 21/823871; H01L 21/823807; H01L 21/823828; H01L 21/823857
  USPC .......................................................... 257/347
  See application file for complete search history.

(56) References Cited

U.S. PATENT DOCUMENTS

| | | | |
|---|---|---|---|
| 6,838,332 | B1 | 1/2005 | Sanchez et al. |
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,417,767 | B2 * | 8/2022 | Chang ............... H01L 21/02532 |
| 2008/0073752 | A1 | 3/2008 | Asai et al. |
| 2009/0280643 | A1 | 11/2009 | Andry et al. |
| 2014/0367753 | A1 | 12/2014 | Huang et al. |
| 2015/0137307 | A1 | 5/2015 | Stuber |
| 2015/0311144 | A1 | 10/2015 | Williams et al. |
| 2017/0053872 | A1 | 2/2017 | Lee et al. |
| 2017/0154817 | A1 | 6/2017 | Moon |
| 2018/0006126 | A1 | 1/2018 | Hook et al. |
| 2018/0122714 | A1 | 5/2018 | Cheng et al. |
| 2018/0323174 | A1 | 11/2018 | Mueller et al. |
| 2018/0330968 | A1 | 11/2018 | Williams et al. |
| 2019/0221649 | A1 | 7/2019 | Glass et al. |
| 2019/0259699 | A1 | 8/2019 | Morrow et al. |
| 2021/0358842 | A1 * | 11/2021 | Huang ................ H01L 23/5329 |

* cited by examiner

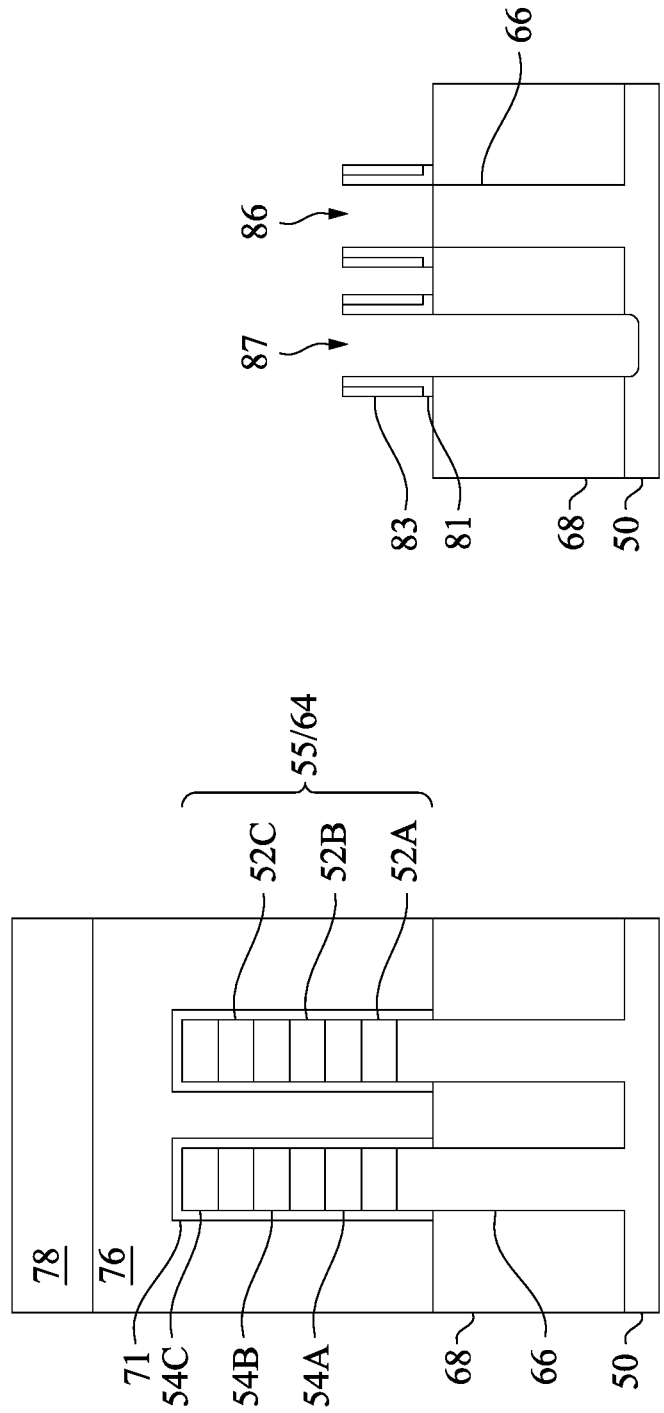

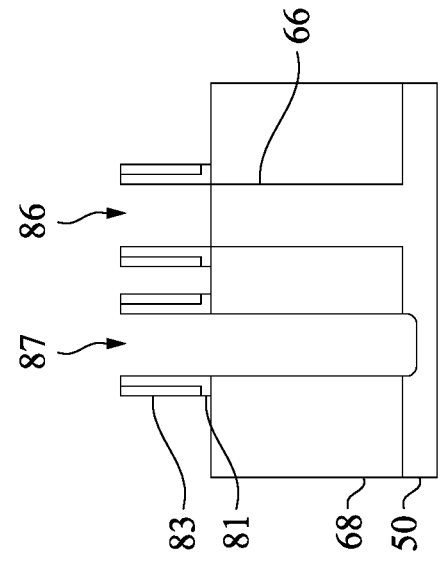
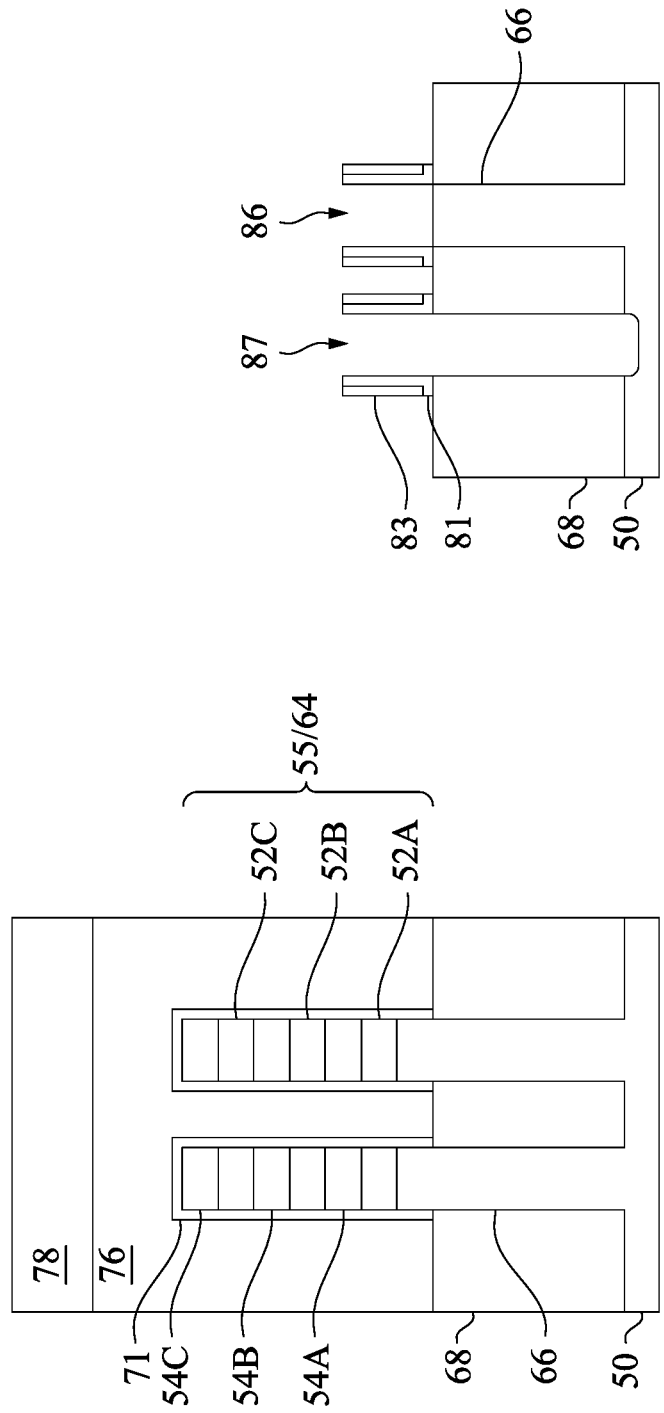
Fig. 11B
Fig. 11A

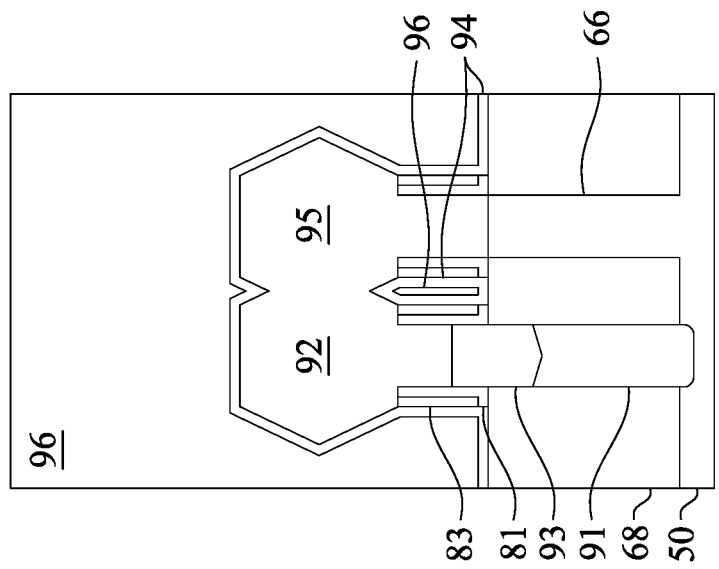
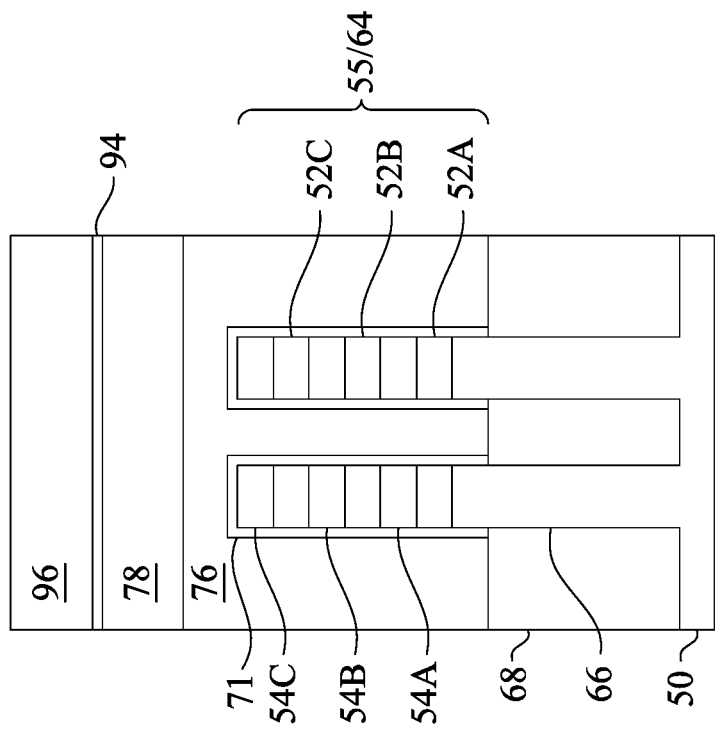
Fig. 13B
Fig. 13A

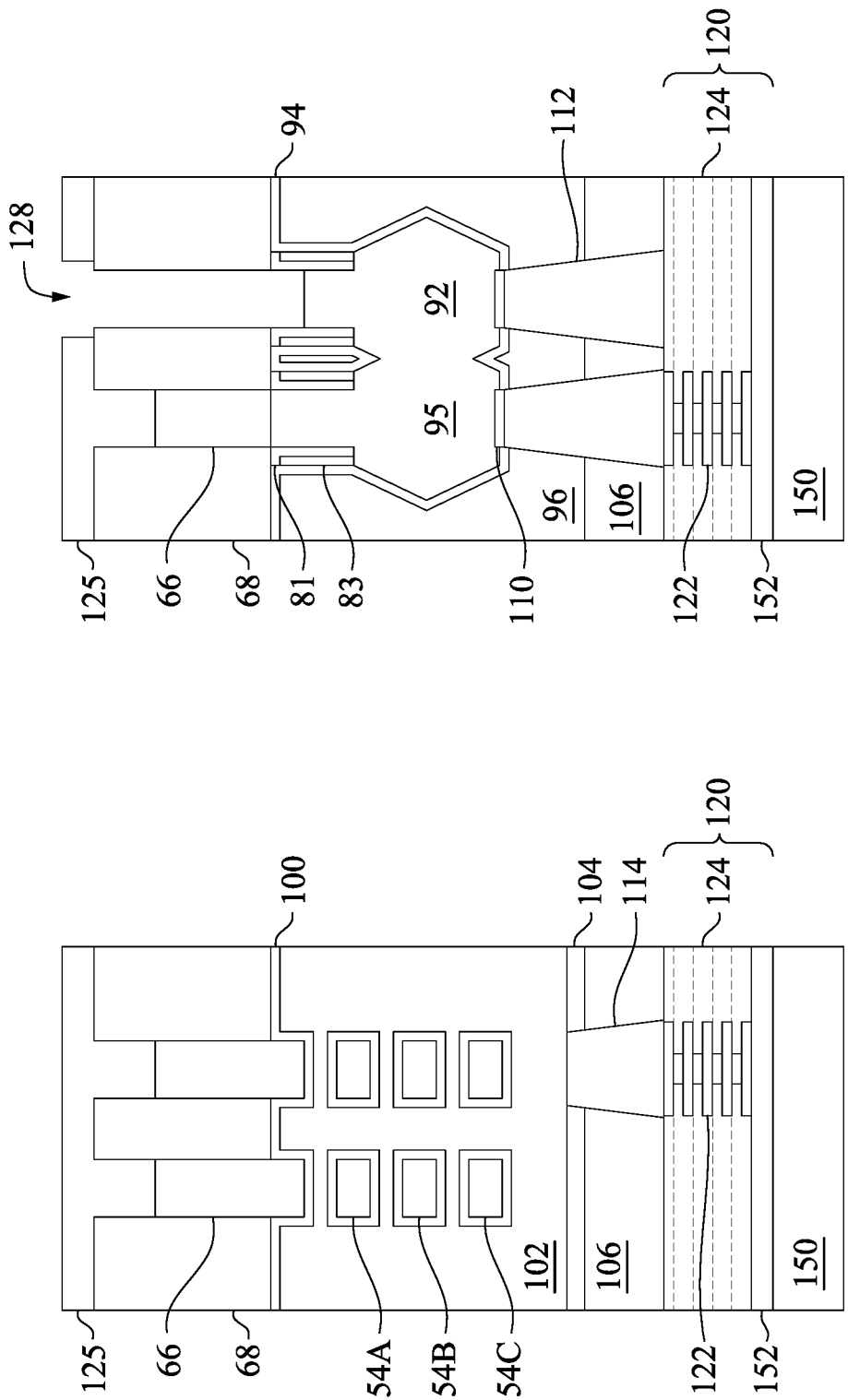

SEMICONDUCTOR DEVICES INCLUDING BACKSIDE VIAS AND METHODS OF FORMING THE SAME

PRIORITY CLAIM AND CROSS-REFERENCE

This application is a continuation of U.S. patent application Ser. No. 17/003,170, entitled "Semiconductor Devices Including Backside Vias and Methods of Forming the Same," and filed on Aug. 26, 2020, now U.S. Pat. No. 11,417,767, issued Aug. 16, 2022; which claims the benefit of U.S. Provisional Patent Application No. 63/030,560, filed on May 27, 2020; which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 24D, 24E, 24F, 24G, 25A, 25B, 25C, 26A, 26B, 26C, 26D, 27A, 27B, 27C, 27D, 28A, 28B, 28C, 29A, 29B, 29C, 30A, 30B, and 30C are cross-sectional views and top-down views of intermediate stages in the manufacturing of nano-FETs, in accordance with some embodiments.

DETAILED DESCRIPTION

Figure 1:
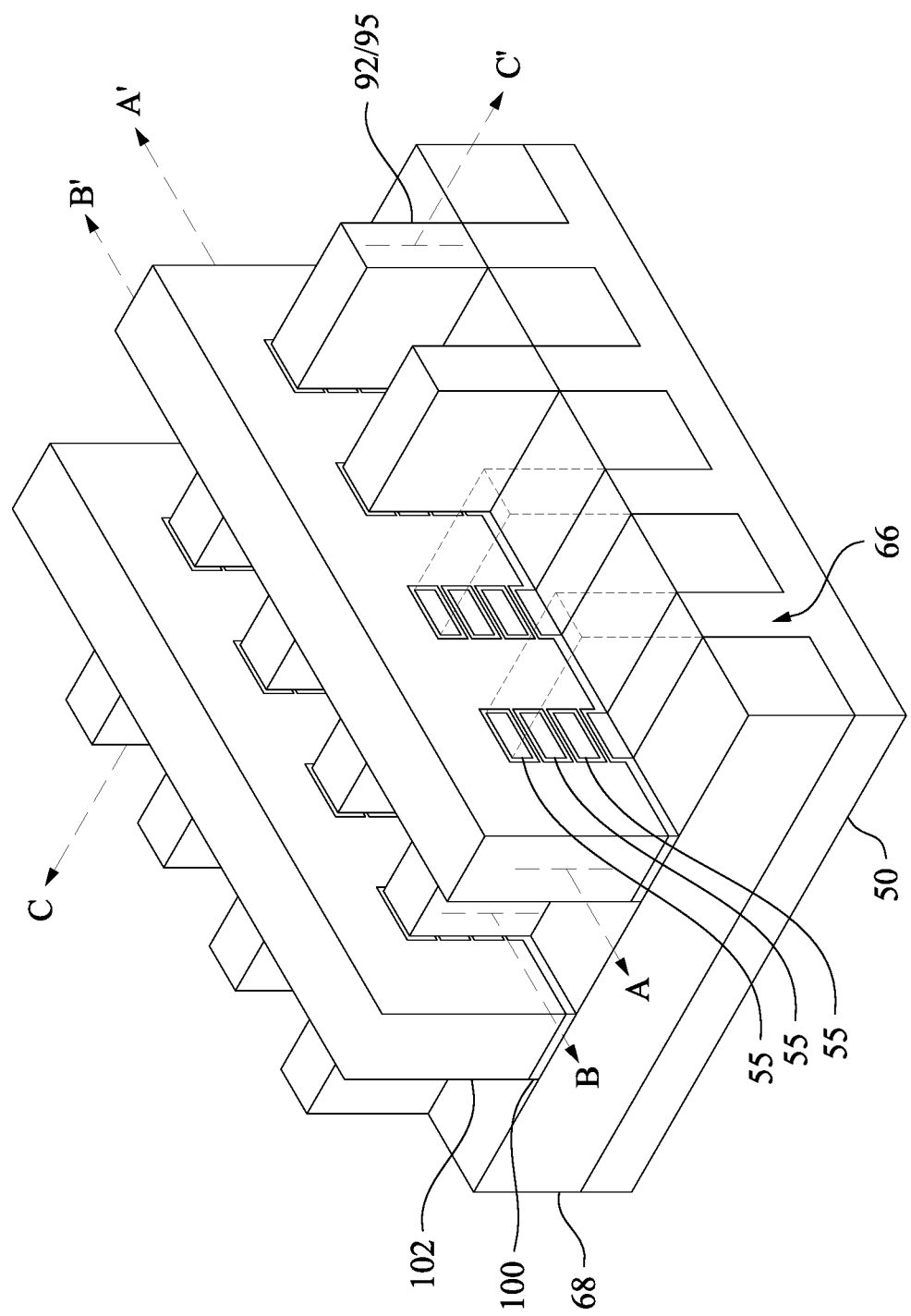
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming backside vias in semiconductor devices and semiconductor devices including the same. The methods include etching a substrate adjacent gate structures to form first recesses and forming first epitaxial materials in the first recesses, forming second epitaxial materials over the first epitaxial materials, and forming epitaxial source/drain regions over the second epitaxial materials. The first epitaxial materials may be formed of silicon germanium having an atomic germanium concentration from about 20% to about 60% and the second epitaxial materials may be formed of silicon germanium having an atomic germanium concentration from about 0% to about 20%. The substrate is thinned to expose the first epitaxial material and third epitaxial materials are grown over the first epitaxial material. The third epitaxial materials may be formed of silicon germanium having an atomic germanium concentration from about 20% to about 60%. A dielectric material is filled surrounding at least portion of the third epitaxial materials, the third epitaxial materials, the first epitaxial materials, and the second epitaxial materials are removed to form second recesses exposing the epitaxial source/drain regions, and backside vias are formed in the second recesses. Forming the third epitaxial materials over the first epitaxial materials allows for the formation of larger backside vias, increases a landing area of the subsequently formed backside vias in the dielectric material, reduces resistance of the backside vias, reduces device RC time delay, and improves device performance.

Some embodiments discussed herein are described in the context of IC dies including nano-FETs. However, various embodiments may be applied to IC dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. First epitaxial source/drain regions 92 and second epitaxial source/drain regions 95 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the first epitaxial source/drain regions 92 or the second epitaxial source/drain regions 95 of a nano-FET. Cross-section B-B' is parallel to cross-section A-A' and extends through first epitaxial source/drain regions 92 or second epitaxial source/drain regions 95 of multiple nano-FETs. Cross-section C-C' is perpendicular to cross-section A-A' and is parallel to a longitudinal axis of a fin 66 of the nano-FET and in a direction of, for example, a current flow between the first epitaxial source/drain regions 92 or the second epitaxial source/drain regions 95 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 30C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, and 30A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 24E, 25B, 26B, 27B, 28B, 29B, and 30B illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, 22C, 23C, 24C, 24F, 25C, 26C, 26D, 27C, 27D, 28C, 29C, and 30C illustrate reference cross-section C-C' illustrated in FIG. 1. FIGS. 24D and 24G illustrate top-down views.

Figure 2:
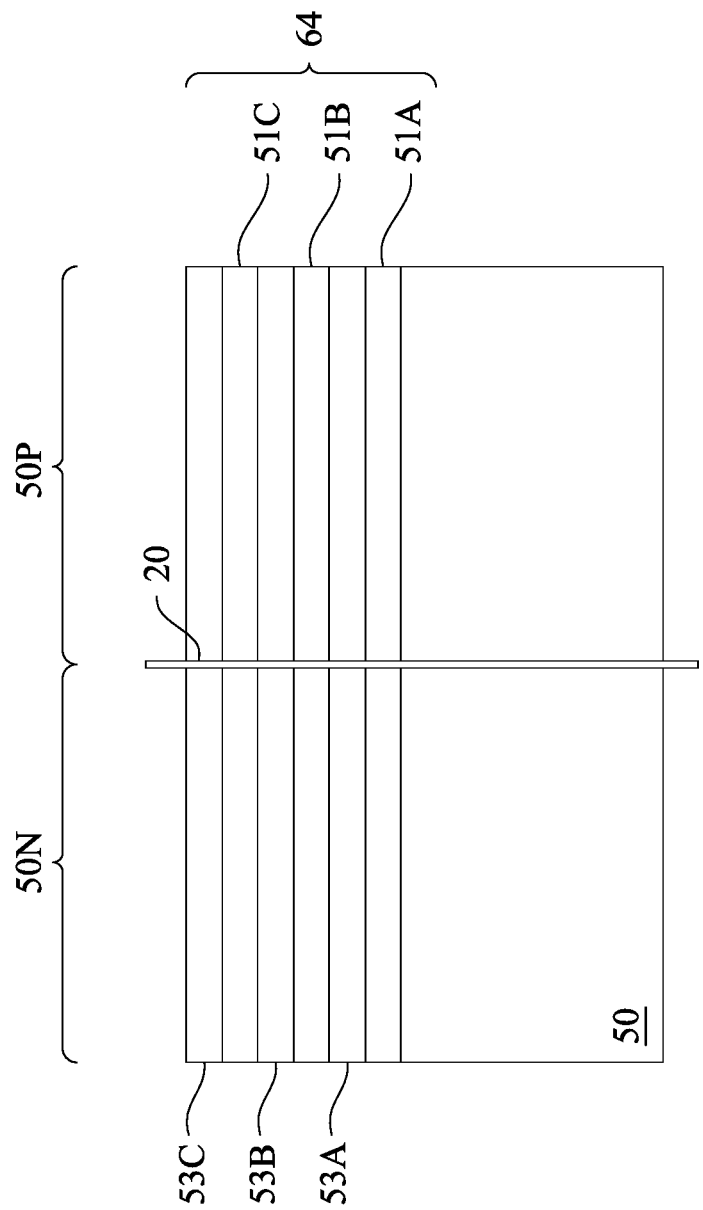

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
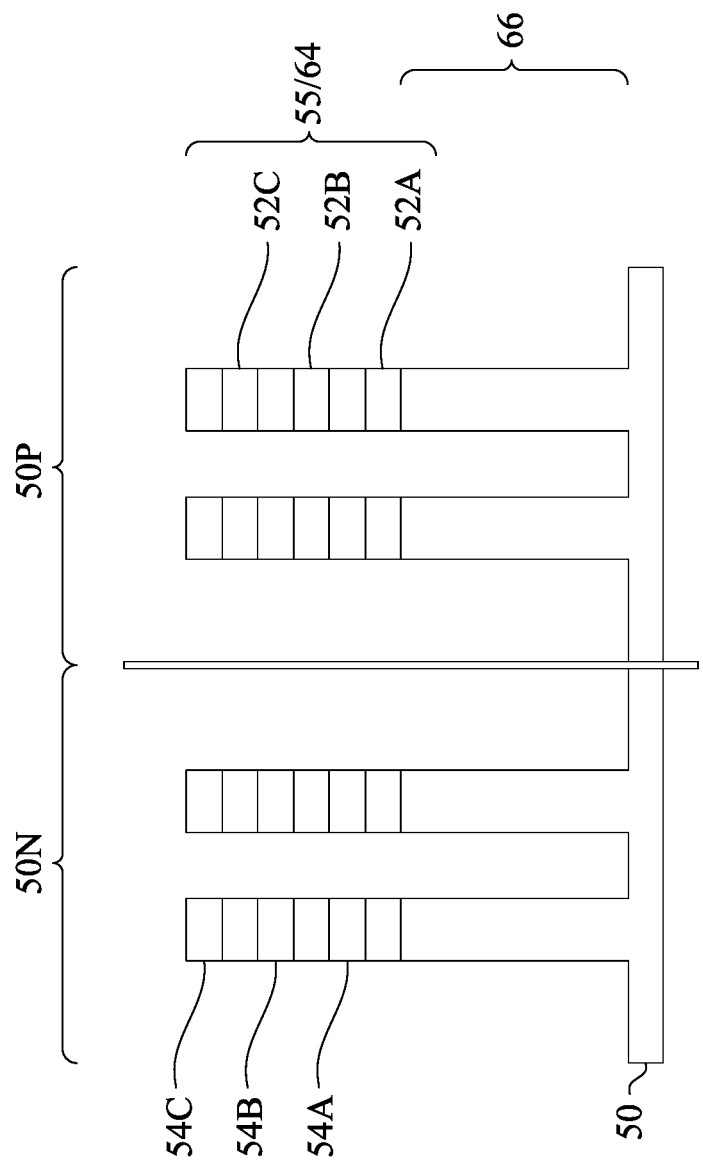

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
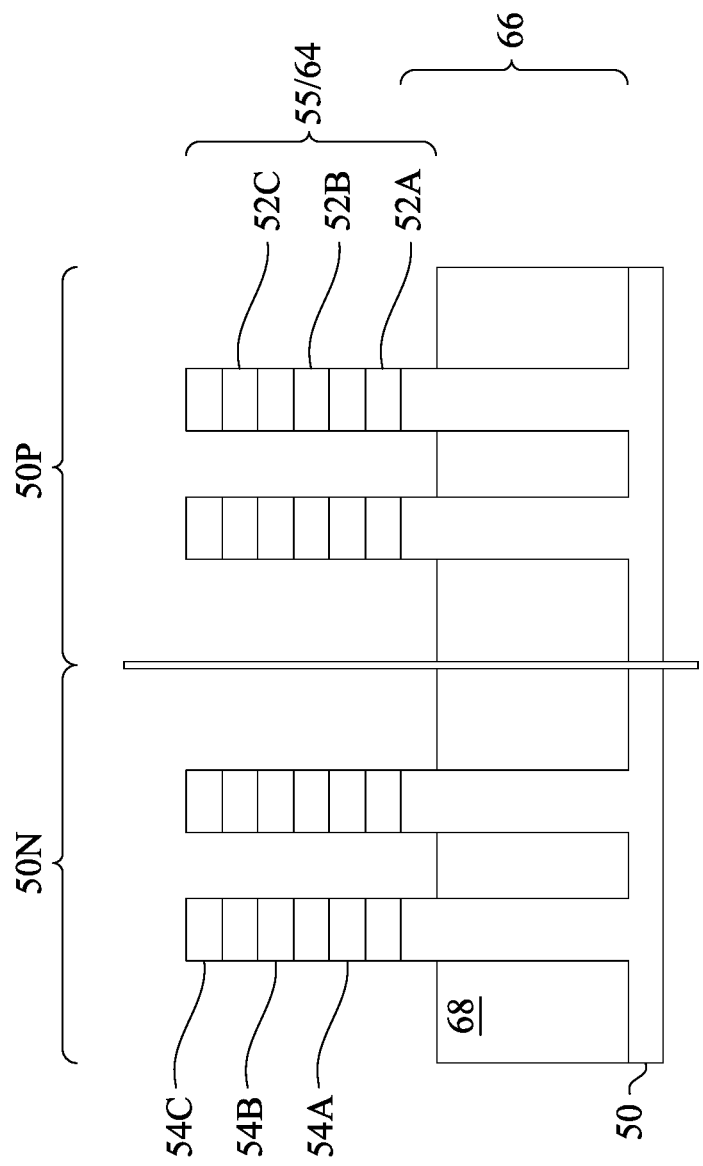

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
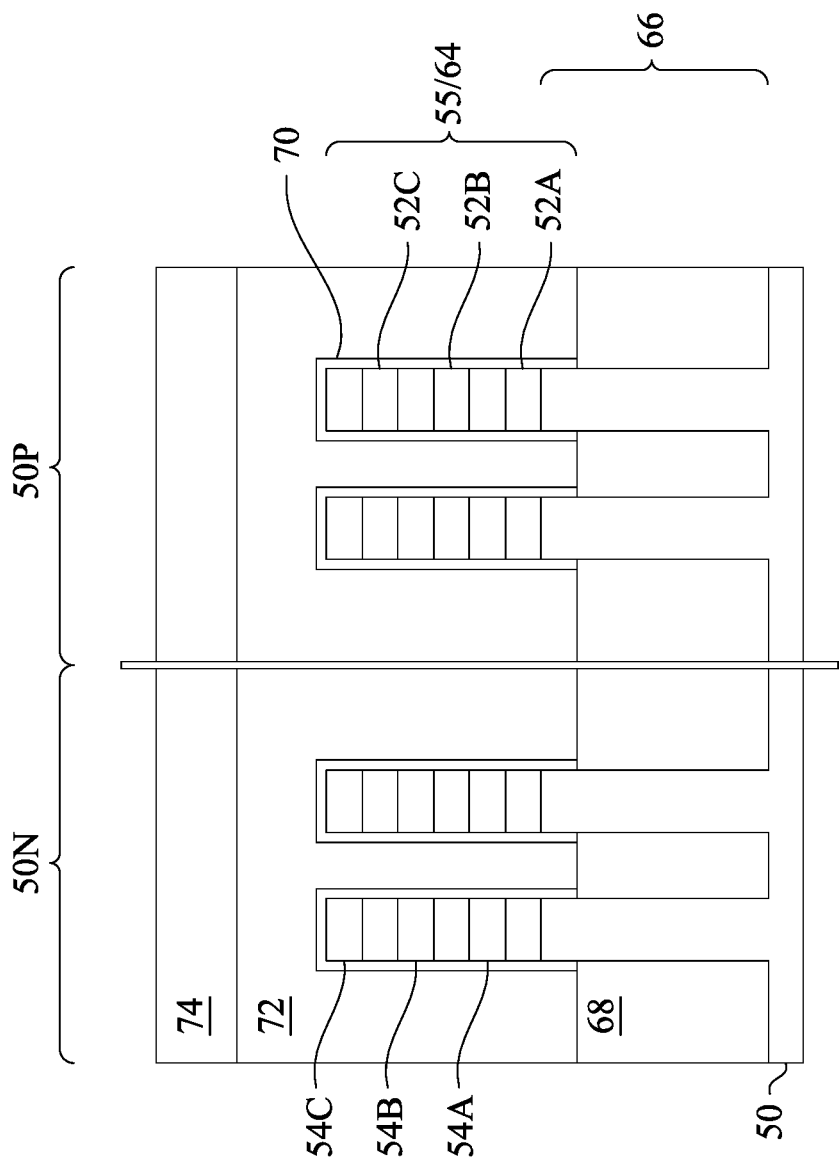

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
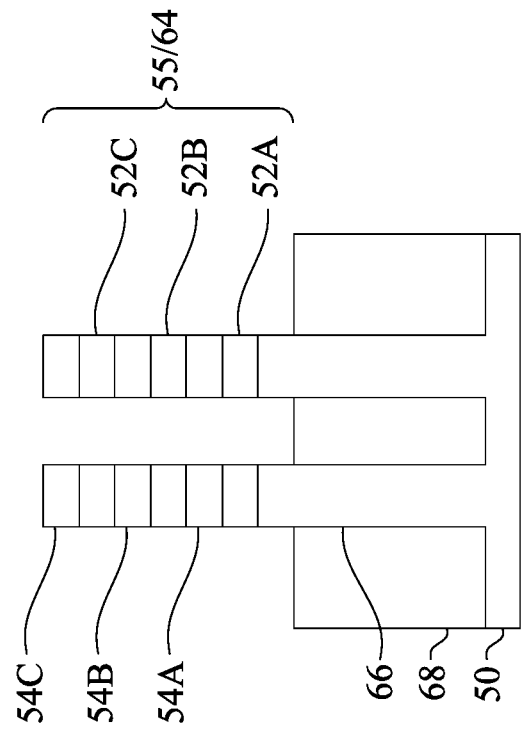
Figure 6A:
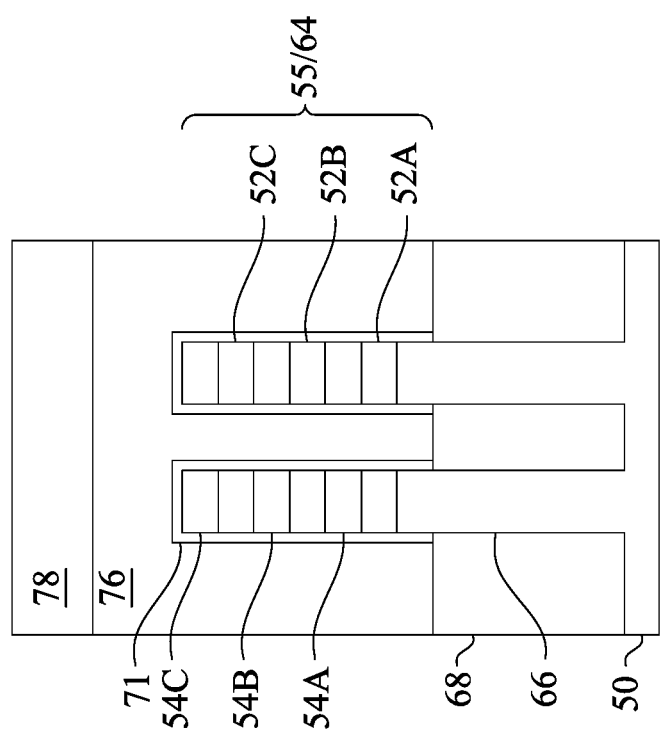
Figure 6C:
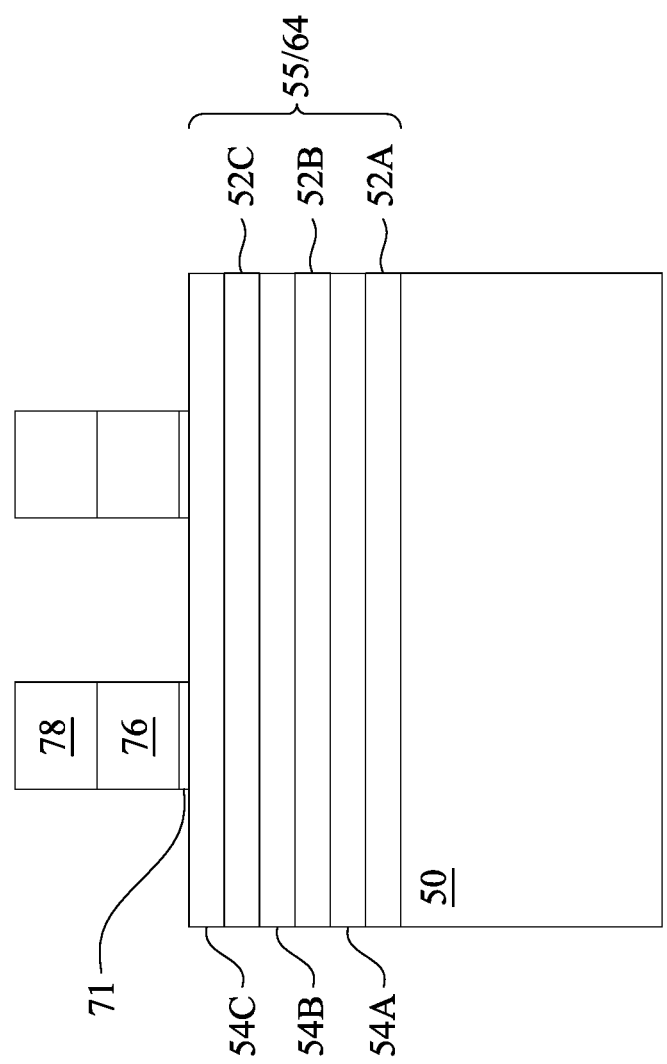

FIGS. 6A through 20C illustrate various additional steps in the manufacturing of embodiment devices. FIGS. 6A through 20C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
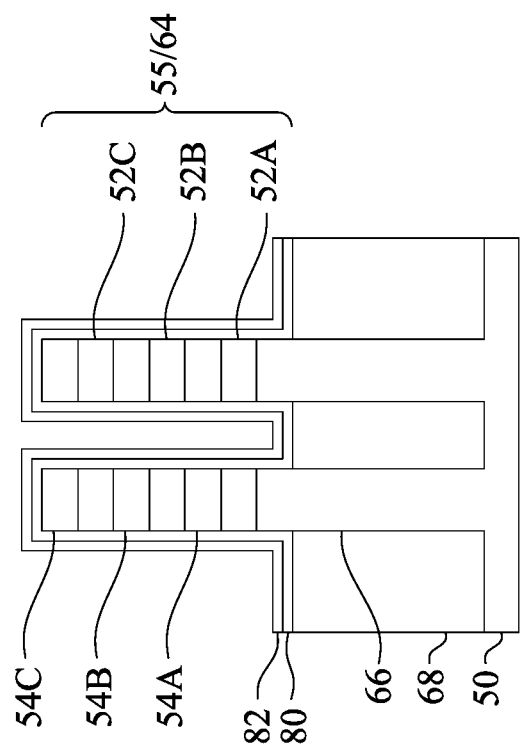
Figure 7A:
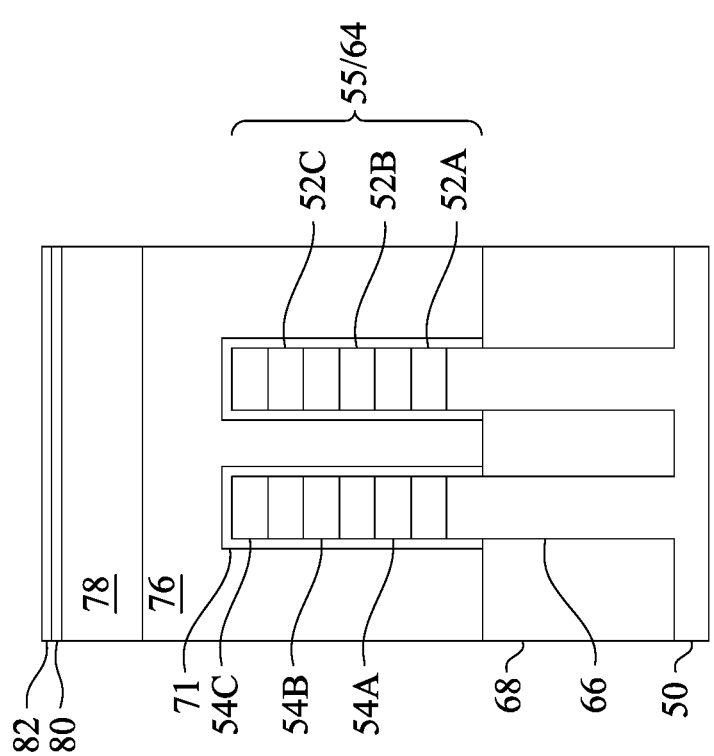
Figure 7C:
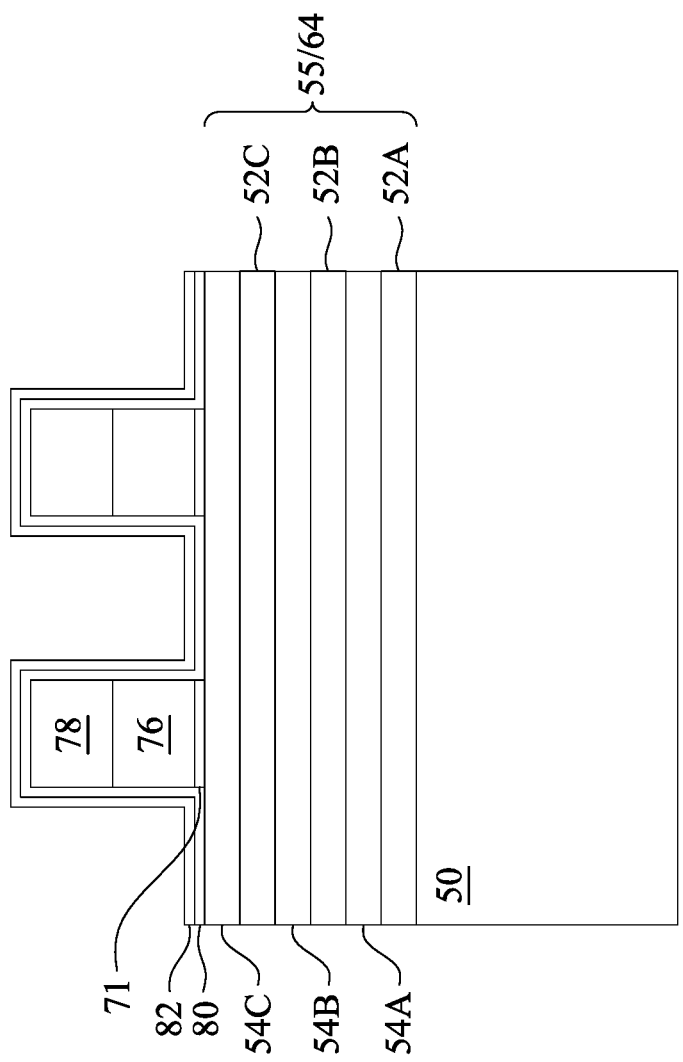

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about 1×10$^{19}$ atoms/cm$^3$. An anneal may be used to repair implant damage and to activate the implanted impurities.

Figure 8B:
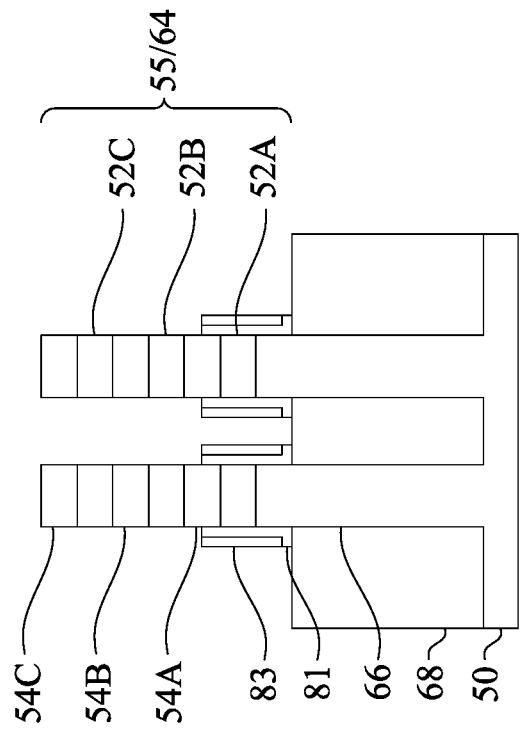
Figure 8A:
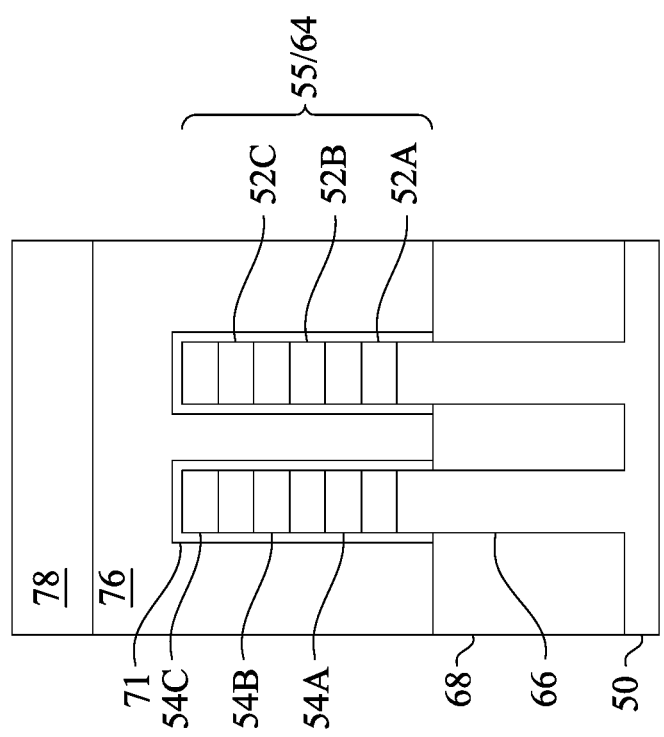
Figure 8C:
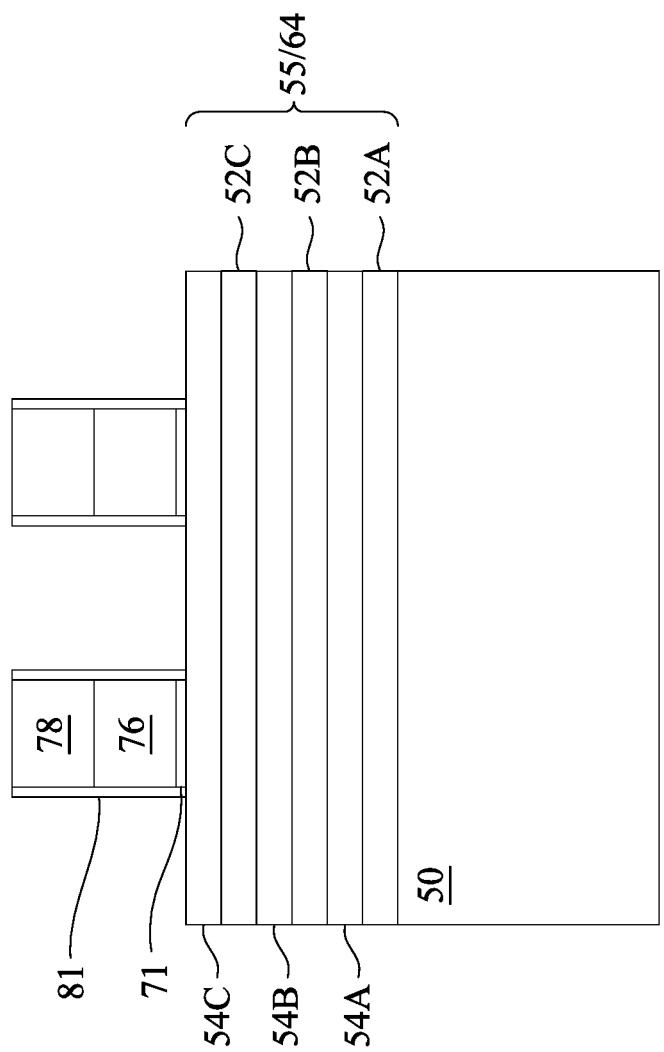

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
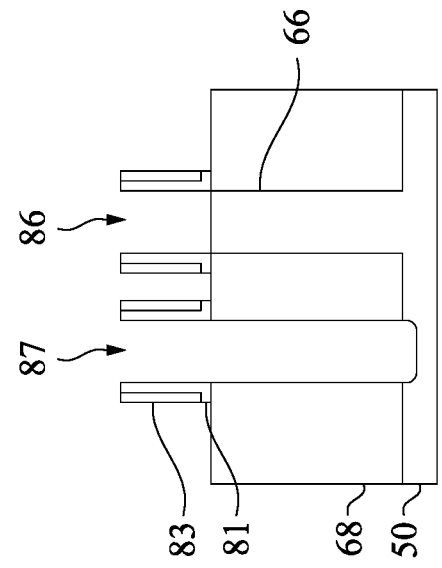
Figure 9A:
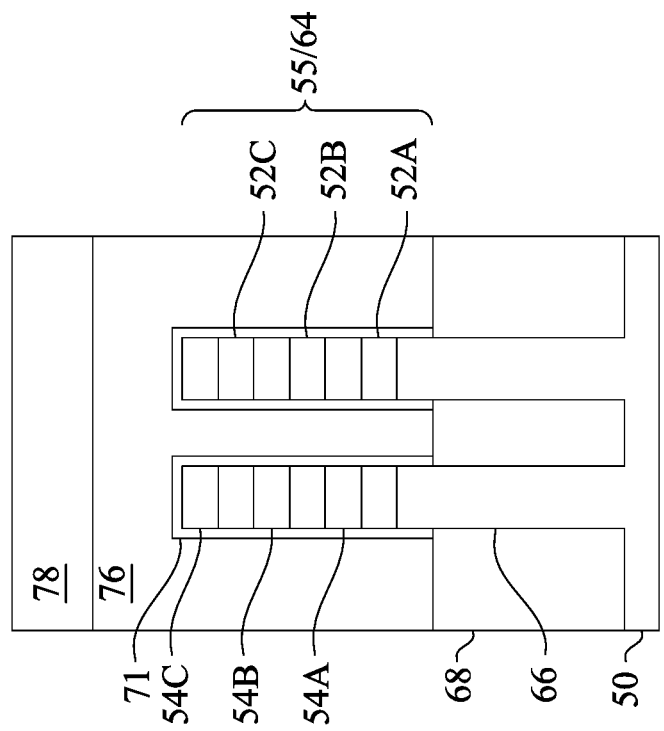
Figure 9C:
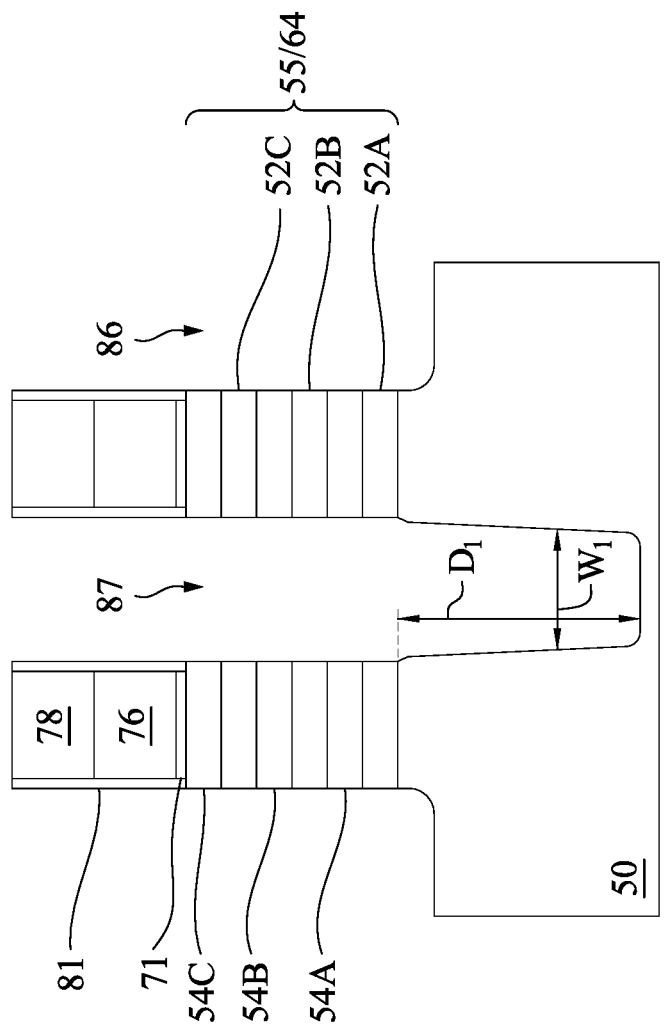

In FIGS. 9A through 9C, first recesses 86 and second recesses 87 are formed in the fins 66, the nanostructures 55, and the substrate 50, in accordance with some embodiments. Epitaxial source/drain regions will be subsequently formed in the first recesses 86 and epitaxial materials and epitaxial source/drain regions will be subsequently formed in the second recesses 87. The first recesses 86 and the second recesses 87 may extend through the first nanostructures 52 and the second nanostructures 54, and into the substrate 50. As illustrated in FIG. 9B, top surfaces of the STI regions 58 may be level with bottom surfaces of the first recesses 86. In various embodiments, the fins 66 may be etched such that bottom surfaces of the first recesses 86 are disposed below the top surfaces of the STI regions 68 or the like.

As illustrated in FIGS. 9B and 9C, bottom surfaces of the second recesses 87 may be disposed below the bottom surfaces of the first recesses 86 and the top surfaces of the STI regions 68. The first recesses 86 and the second recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed. The second recesses 87 may have depths $D_1$ below bottom surfaces of the first nanostructures 52A ranging from about 40 nm to about 100 nm. The depth of the second recesses 87 may be selected to control the dimensions of subsequently formed backside vias (such as the backside vias 130, discussed below with respect to FIGS. 27A through 27C). The second recesses 87 may have widths $W_1$ ranging from about 10 nm to about 30 nm. As illustrated in FIG. 9C, the second recesses 87 may have tapered sidewalls, which become narrower as the second recesses 87 extend into the substrate 50.

Figure 10C:
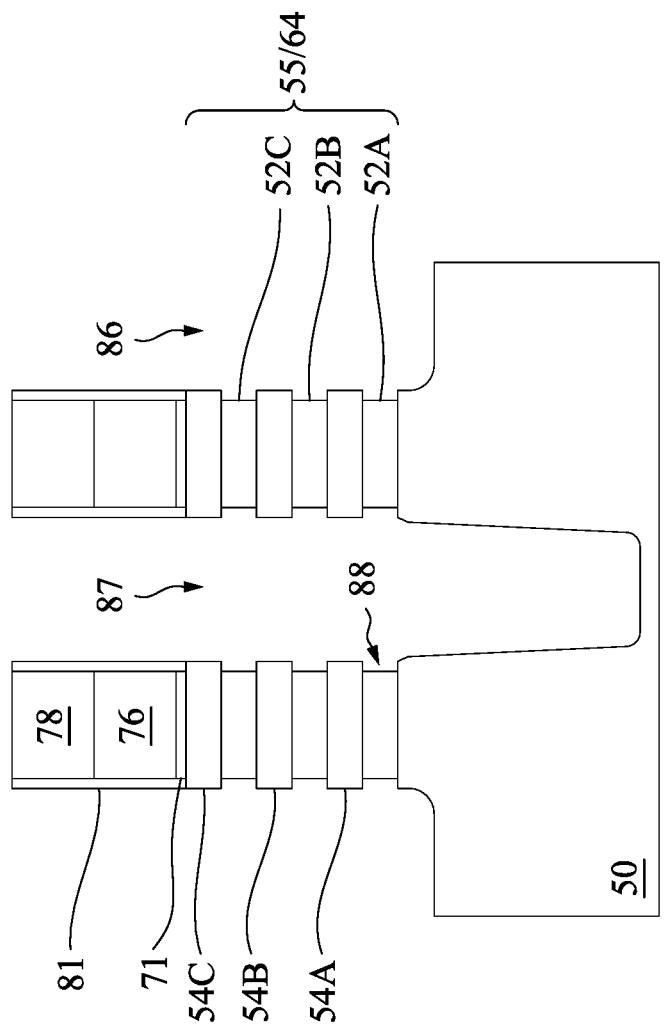

In FIGS. 10A through 10C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and a gate structure. As will be discussed in greater detail below, epitaxial source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11C:
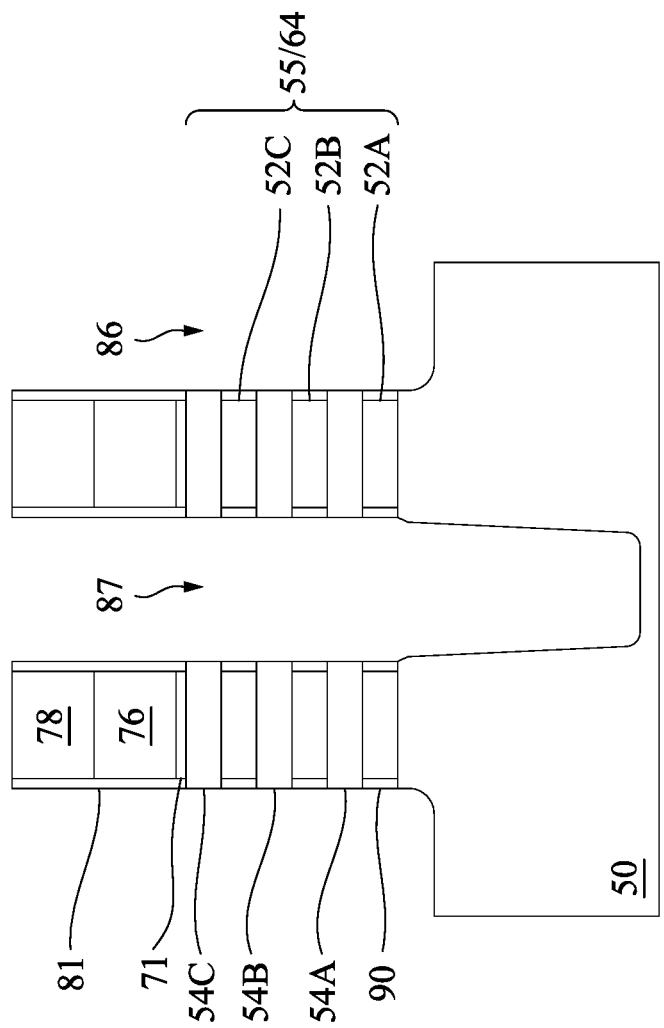
Figure 11D:
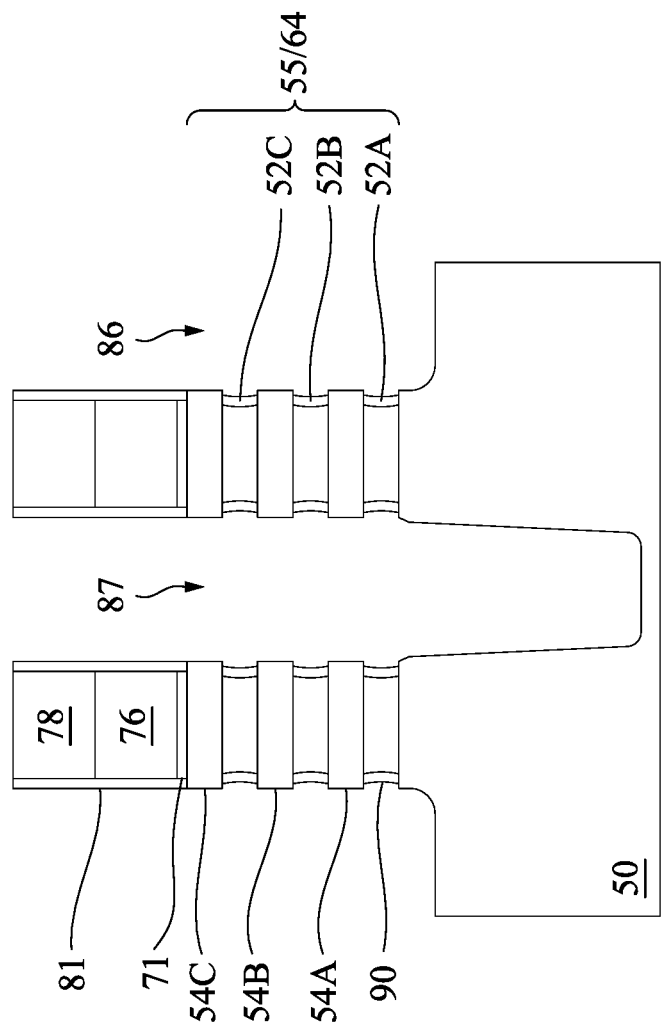

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the first epitaxial source/drain regions 92 and the second epitaxial source/drain regions 95, discussed below with respect to FIGS. 12A through 12E) by subsequent etching processes, such as etching processes used to form gate structures.

In FIGS. 12A through 12E, first epitaxial materials 91 and second epitaxial materials 93 are formed in the second recesses 87, first epitaxial source/drain regions 92 are formed in the first recesses 86, and second epitaxial source/drain regions 95 are formed in the second recesses 87. In some embodiments, the first epitaxial materials 91 and the second epitaxial materials 93 may be sacrificial materials, which are subsequently removed to form backside vias (such as the backside vias 130, discussed below with respect to FIGS. 27A through 27C). As illustrated in FIGS. 12B through 12E, top surfaces of the second epitaxial materials 93 may be disposed above bottom surfaces of the first recesses 86. However, in some embodiments, the top surfaces of the second epitaxial materials 93 may be disposed level with or below the bottom surfaces of the first recesses 86.

The first epitaxial materials 91 and the second epitaxial materials 93 may be formed in the second recesses 87 by masking the first recesses 86. The first epitaxial materials 91 and the second epitaxial materials 93 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 and the second epitaxial materials 93 may include any acceptable material, such as silicon germanium or the like. The first epitaxial materials 91 and the second epitaxial materials 93 may be formed of materials having high etch selectivity to materials of the first epitaxial source/drain regions 92, the second epitaxial source/drain regions 95, the substrate 50, and dielectric layers (such as the STI regions 68 and the second dielectric layer 125, discussed below with respect to FIGS. 25A through 25C). As such, the first epitaxial materials 91 and the second epitaxial materials 93 may be removed and replaced with the backside vias without significantly removing the first epitaxial source/drain regions 92, the second epitaxial source/drain regions 95, the substrate 50, and the dielectric layers.

In some embodiments, the second epitaxial materials 93 may be formed of materials having a lower germanium concentration than the materials of the first epitaxial materials 91. For example, an atomic concentration of germanium in the second epitaxial materials 93 may range from about 0% to about 20%, while an atomic concentration of germanium in the first epitaxial materials 91 may range from about 20% to about 60%. The materials having the higher germanium concentrations may be etched at a higher rate as compared to the materials having the lower germanium concentrations. Forming the second epitaxial materials 93 of the materials having lower germanium concentrations and the first epitaxial materials 91 of the materials having higher germanium concentrations allows for the first epitaxial materials 91 to be etched at a high etch rate and the second epitaxial materials 93 to be etched at a lower etch rate, protecting the epitaxial source/drain regions during a subsequent etching process used to remove the first epitaxial materials 91 and the second epitaxial materials 93 (discussed below with respect to FIGS. 26A through 26D). In some embodiments, forming the first epitaxial materials 91 which are separated from subsequently formed first epitaxial source/drain regions 92 of the materials having higher germanium concentrations provides efficiency benefits due to the high etch rate. Forming the second epitaxial materials 93 which are adjacent to the first epitaxial source/drain regions of the materials having lower germanium concentrations provides greater etch precision due to the lower etch rate. Providing both the first epitaxial materials 91 and the second epitaxial materials 93 allows for the first epitaxial materials 91 and the second epitaxial materials 93 to be removed quickly, while also preventing damage to the first epitaxial source/drain regions 92.

The first epitaxial materials 91 may have a thickness $T_4$ ranging from about 40 nm to about 100 nm, the second epitaxial materials 93 may have a thickness $T_5$ ranging from about 10 nm to about 40 nm, and a ratio of the thickness $T_4$ to the thickness $T_5$ may be from about 2 to about 5. The thicknesses of the first epitaxial materials 91 and the second epitaxial materials 93 may be selected to control the dimensions of subsequently formed backside vias (such as the backside vias 130, discussed below with respect to FIGS. 27A through 27C). Moreover, the relative thicknesses of the first epitaxial materials 91 and the second epitaxial materials 93 may be selected to be in the above ranges in order to provide sufficient thickness of the second epitaxial materials 93 to control the etching of the first epitaxial materials 91 and the second epitaxial materials 93 and to protect the first epitaxial source/drain regions 92, while maximizing the etch rate of the first epitaxial materials 91 and the second epitaxial materials 93.

The first epitaxial materials 91 and the second epitaxial materials 93 may have combined heights equal to the depths $D_1$. For example, the first epitaxial materials 91 and the second epitaxial materials 93 may have combined heights ranging from about 40 nm to about 100 nm. The combined heights of the first epitaxial materials 91 and the second epitaxial materials 93 may be selected to control the dimensions of subsequently formed backside vias (such as the backside vias 130, discussed below with respect to FIGS. 27A through 27C). The first epitaxial materials 91 and the second epitaxial materials 93 may have widths equal to the widths $W_1$. For example, the first epitaxial materials 91 and the second epitaxial materials 93 may have widths ranging from about 10 nm to about 30 nm. As illustrated in FIG. 9C, the first epitaxial materials 91 and the second epitaxial materials 93 may have tapered sidewalls, which become narrower as the first epitaxial materials 91 and the second epitaxial materials 93 extend into the substrate 50.

Figure 12B:
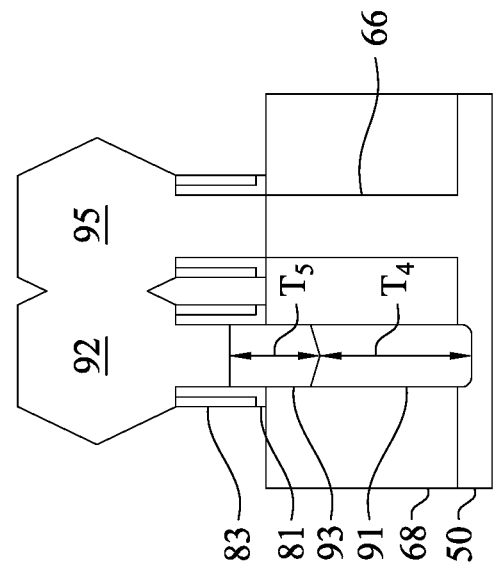

The first epitaxial source/drain regions 92 are then formed in the first recesses 86 and over the second epitaxial materials 93 and the second epitaxial source/drain regions 95 are formed in the second recesses 87. In some embodiments, the first epitaxial source/drain regions 92 and the second epitaxial source/drain regions 95 may exert stress on the second nanostructures 54, thereby improving performance. As illustrated in FIG. 12C, the first epitaxial source/drain regions 92 are formed in the first recesses 86 and the second epitaxial source/drain regions 95 are formed in the second recesses 87 such that each dummy gate 76 is disposed between respective neighboring pairs of the first epitaxial source/drain regions 92/second epitaxial source/drain regions 95. In some embodiments, the first spacers 81 are used to separate the first epitaxial source/drain regions 92 and the second epitaxial source/drain regions 95 from the dummy gates 76 and the first inner spacers 90 are used to separate the first epitaxial source/drain regions 92 and the second epitaxial source/drain regions 95 from the nanostructures 55 by an appropriate lateral distance so that the first epitaxial source/drain regions 92 and the second epitaxial source/drain regions 95 do not short out with subsequently formed gates of the resulting nano-FETs. As illustrated in FIGS. 12B through 12E, bottom surfaces of the first epitaxial source/drain regions 92 may be disposed above bottom surfaces of the second epitaxial source/drain regions 95. In some embodiments, the bottom surfaces of the first epitaxial source/drain regions 92 may be disposed level with or below the bottom surfaces of the second epitaxial source/drain regions 95.

The first epitaxial source/drain regions 92 and the second epitaxial source/drain regions 95 in the n-type region 50N, e.g., the NMOS region, may be formed by masking the p-type region 50P, e.g., the PMOS region. Then, the first epitaxial source/drain regions 92 and the second epitaxial source/drain regions 95 are epitaxially grown in the first recesses 86 and the second recesses 87, respectively, in the n-type region 50N. The first epitaxial source/drain regions 92 and the second epitaxial source/drain regions 95 may include any acceptable material appropriate for n-type nano-FETs. For example, if the second nanostructures 54 are silicon, the first epitaxial source/drain regions 92 and the second epitaxial source/drain regions 95 may include materials exerting a tensile strain on the second nanostructures 54, such as silicon, silicon carbide, phosphorous doped silicon carbide, silicon phosphide, or the like. The first epitaxial source/drain regions 92 and the second epitaxial source/drain regions 95 may have surfaces raised from respective upper surfaces of the nanostructures 55 and may have facets.

Moreover, the first epitaxial source/drain regions 92 in the n-type region 50N may include materials having a high etch selectivity to the materials of the first epitaxial materials 91 and the second epitaxial materials 93. For example, the first epitaxial source/drain regions 92 may have lower germanium concentrations than the first epitaxial materials 91 and the second epitaxial materials 93, such that the first epitaxial materials 91 and the second epitaxial materials 93 may be removed without significantly removing the first epitaxial source/drain regions 92.

The first epitaxial source/drain regions 92 and the second epitaxial source/drain regions 95 in the p-type region 50P, e.g., the PMOS region, may be formed by masking the n-type region 50N, e.g., the NMOS region. Then, the first epitaxial source/drain regions 92 and the second epitaxial source/drain regions 95 are epitaxially grown in the first recesses 86 and the second recesses 87, respectively, in the p-type region 50P. The first epitaxial source/drain regions 92 and the second epitaxial source/drain regions 95 may include any acceptable material appropriate for p-type nano-FETs. For example, if the first nanostructures 52 are silicon germanium, the first epitaxial source/drain regions 92 and the second epitaxial source/drain regions 95 may comprise materials exerting a compressive strain on the first nanostructures 52, such as silicon-germanium, boron doped silicon-germanium, germanium, germanium tin, or the like. The first epitaxial source/drain regions 92 and the second epitaxial source/drain regions 95 may also have surfaces raised from respective surfaces of the multi-layer stack 56 and may have facets.

Moreover, the first epitaxial source/drain regions 92 in the p-type region 50P may include materials having a high etch selectivity to the materials of the first epitaxial materials 91 and the second epitaxial materials 93. For example, the first epitaxial source/drain regions 92 may have lower germanium concentrations than the first epitaxial materials 91 and the second epitaxial materials 93. In some embodiments, an atomic concentration of germanium in the first epitaxial source/drain regions 92 may range from about 15% to about 50%. In some embodiments, portions of the first epitaxial source/drain regions 92 adjacent the second epitaxial materials 93 (such as the first semiconductor material layer 92A, discussed in further detail below) may have lower concentrations of germanium and a remainder of the first epitaxial source/drain regions 92 may have higher germanium concentrations. For example, the portions of the first epitaxial source/drain regions 92 adjacent the second epitaxial materials 93 may have atomic concentrations of germanium ranging from about 10% to about 30%, while remaining portions of the first epitaxial source/drain regions 92 have atomic concentrations of germanium ranging from about 15% to about 50%. As such, the first epitaxial materials 91 and the second epitaxial materials 93 may be removed without significantly removing the first epitaxial source/drain regions 92.

The first epitaxial source/drain regions 92, the second epitaxial source/drain regions 95, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the first epitaxial source/drain regions 92 and the second epitaxial source/drain regions 95 may be in situ doped during growth.

As a result of the epitaxy processes used to form the first epitaxial source/drain regions 92 and the second epitaxial source/drain regions 95 in the n-type region 50N and the p-type region 50P, upper surfaces of the first epitaxial source/drain regions 92 and the second epitaxial source/drain regions 95 have facets which expand laterally outward beyond sidewalls of the nanostructures 55. In some embodiments, these facets cause adjacent first epitaxial source/drain regions 92 and the second epitaxial source/drain regions 95 of a same nano-FET to merge as illustrated by FIG. 12B. In other embodiments, adjacent first epitaxial source/drain regions 92 and the second epitaxial source/drain regions 95 remain separated after the epitaxy process is completed as illustrated by FIG. 12D. In the embodiments illustrated in FIGS. 12B and 12D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The first epitaxial source/drain regions 92 and the second epitaxial source/drain regions 95 may comprise one or more semiconductor material layers. For example, the first epitaxial source/drain regions 92 may comprise a first semiconductor material layer 92A, a second semiconductor material layer 92B, and a third semiconductor material layer 92C. The second epitaxial source/drain regions 95 may comprise a first semiconductor material layer 95A, a second semiconductor material layer 95B, and a third semiconductor material layer 95C. Any number of semiconductor material layers may be used for the first epitaxial source/drain regions 92 and the second epitaxial source/drain regions 95. Each of the first semiconductor material layers 92A/95A, the second semiconductor material layers 92B/95B, and the third semiconductor material layers 92C/95C may be formed of different semiconductor materials and may be doped to different dopant concentrations. In some embodiments, the first semiconductor material layers 92A/95A may have a dopant concentration less than the second semiconductor material layers 92B/95B and greater than the third semiconductor material layers 92C/95C. In some embodiments, the first semiconductor material layer 92A may have a lower germanium concentration than the second semiconductor material layer 92B and the third semiconductor material layer 92C in order to provide good etch selectivity between the first semiconductor material layer 92A and the first epitaxial materials 91 and the second epitaxial materials 93. In embodiments in which the first epitaxial source/drain regions 92 and the second epitaxial source/drain regions 95 comprise three semiconductor material layers, the first semiconductor material layers 92A/95A may be deposited, the second semiconductor material layers 92B/95B may be deposited over the first semiconductor material layers 92A/95A, and the third semiconductor material layers 92C/95C may be deposited over the second semiconductor material layers 92B/95B.

Figure 12A:
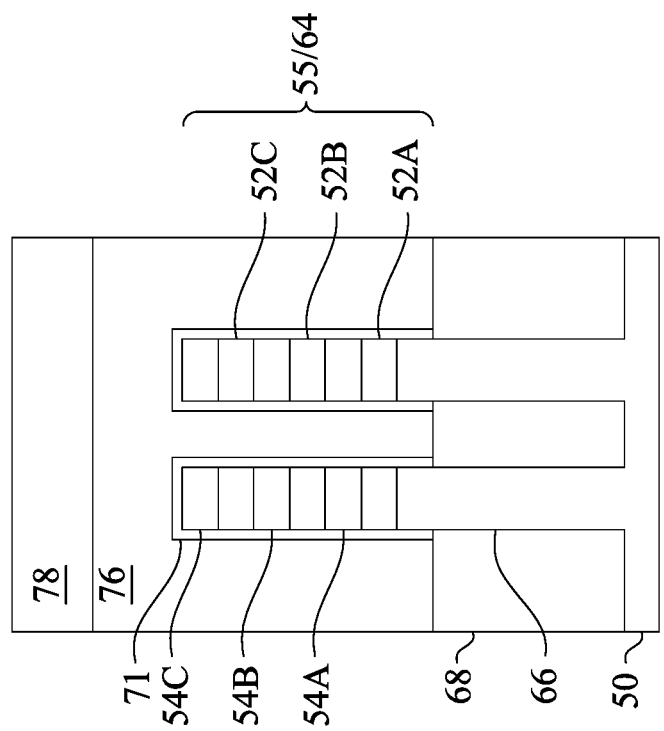
Figure 12D:
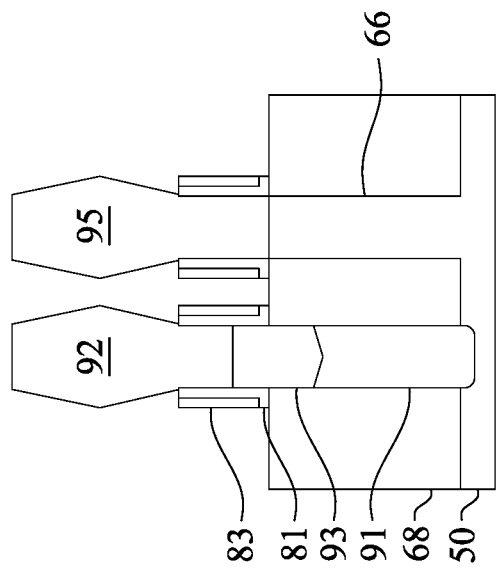
Figure 12C:
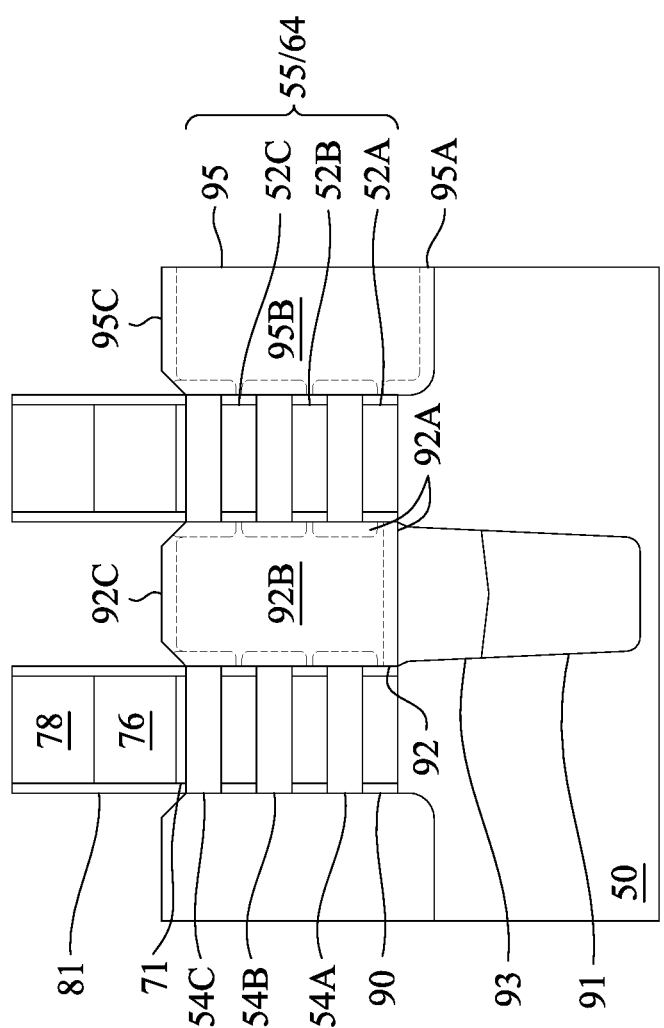
Figure 12E:
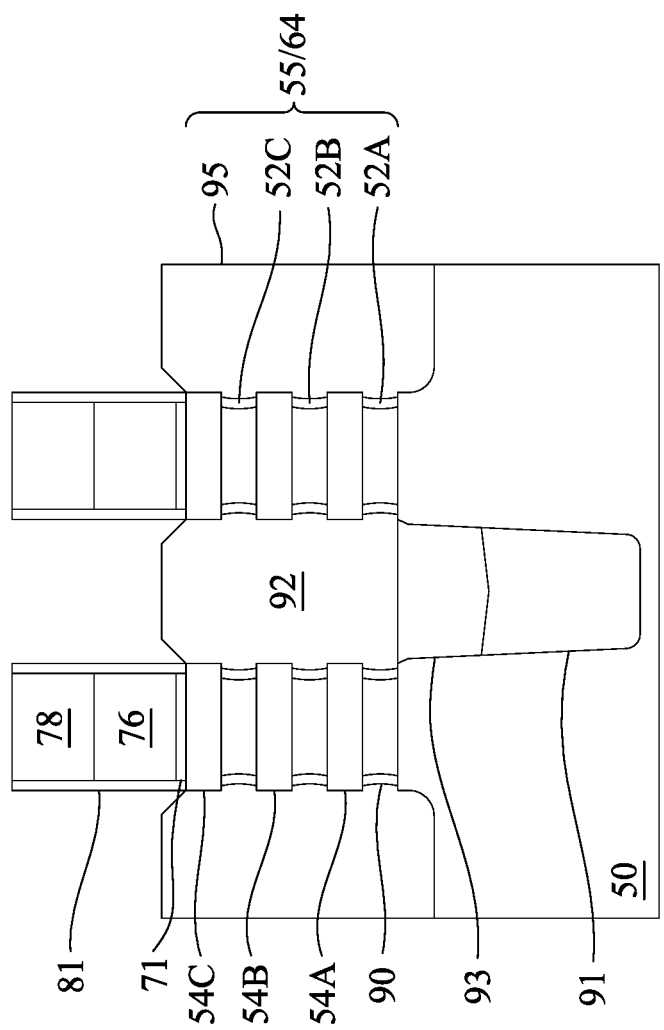

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the first epitaxial source/drain regions 92 and the second epitaxial source/drain regions 95 may be formed in contact with the first inner spacers 90 and may extend past sidewalls of the second nanostructures 54.

Figure 13C:
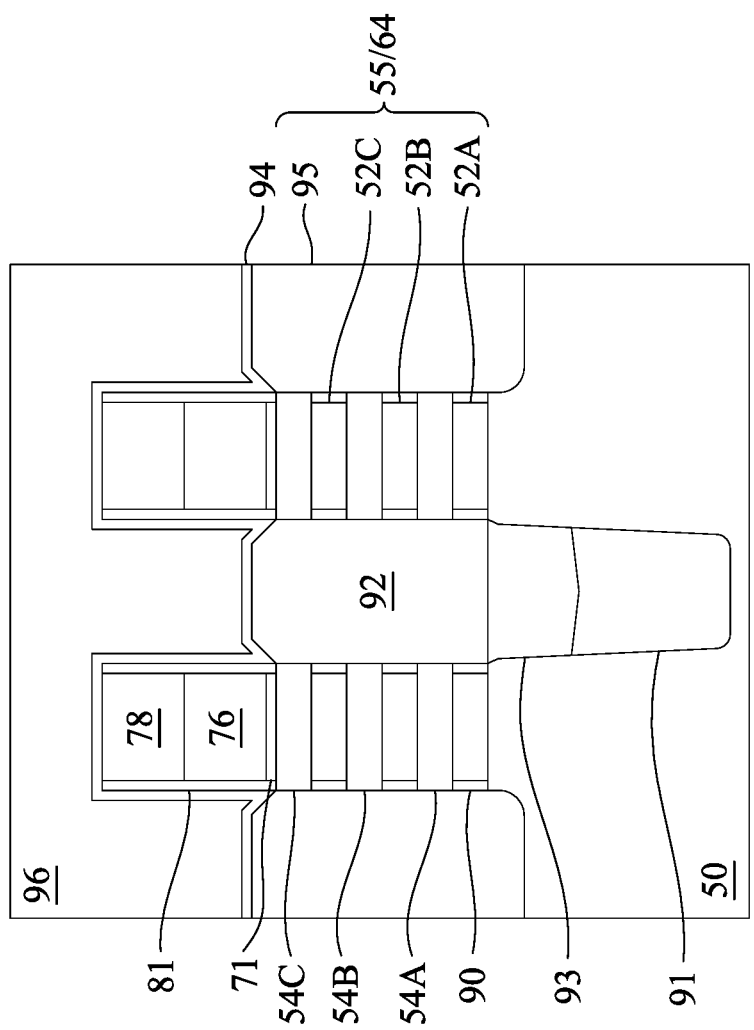

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the first epitaxial source/drain regions 92, the second epitaxial source/drain regions 95, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
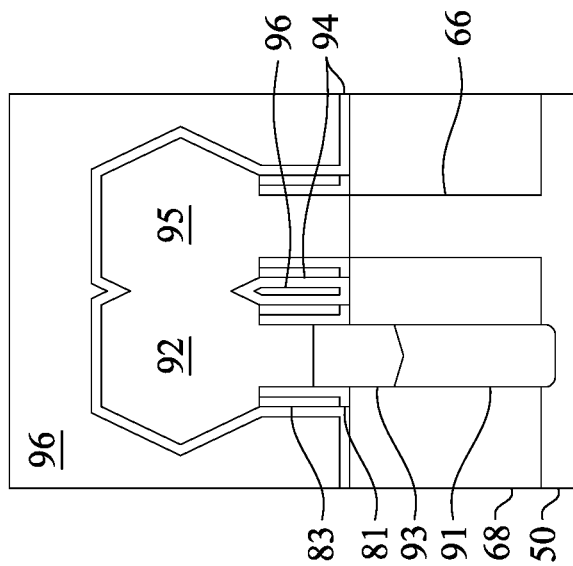
Figure 14A:
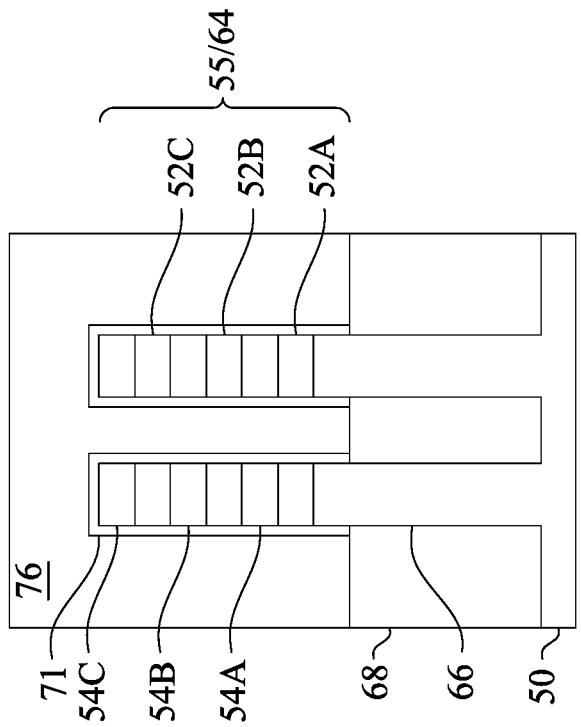
Figure 14C:
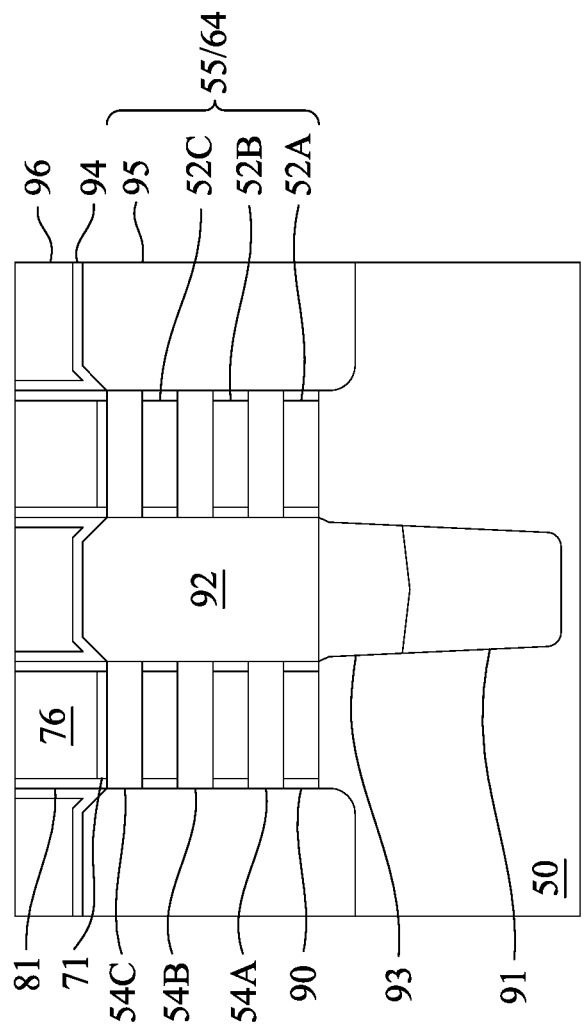

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15B:
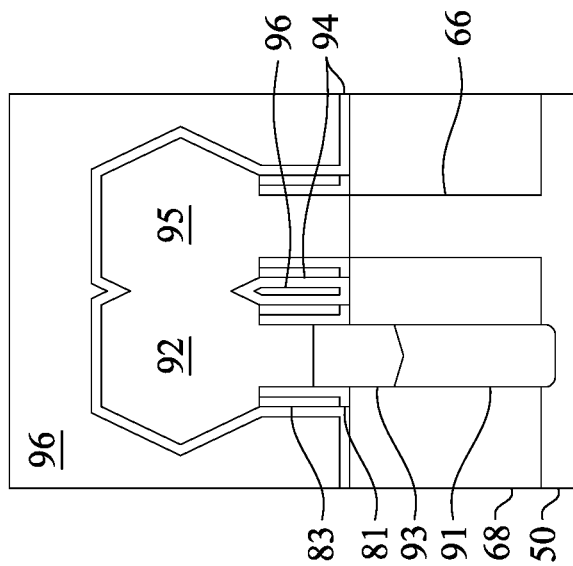
Figure 15A:
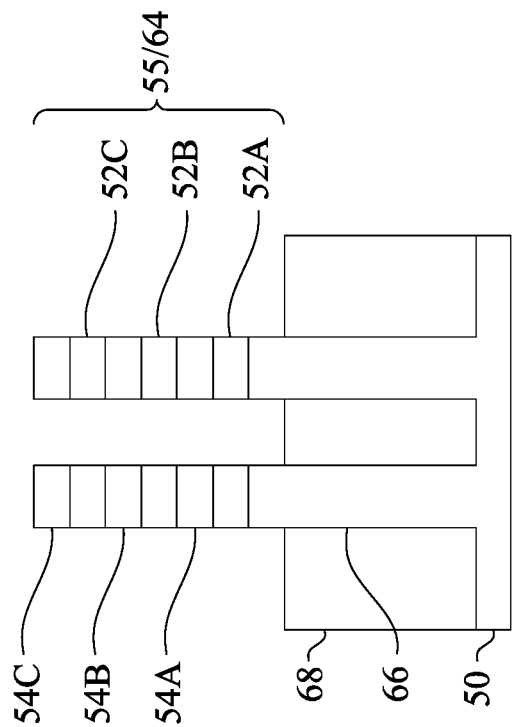
Figure 15C:
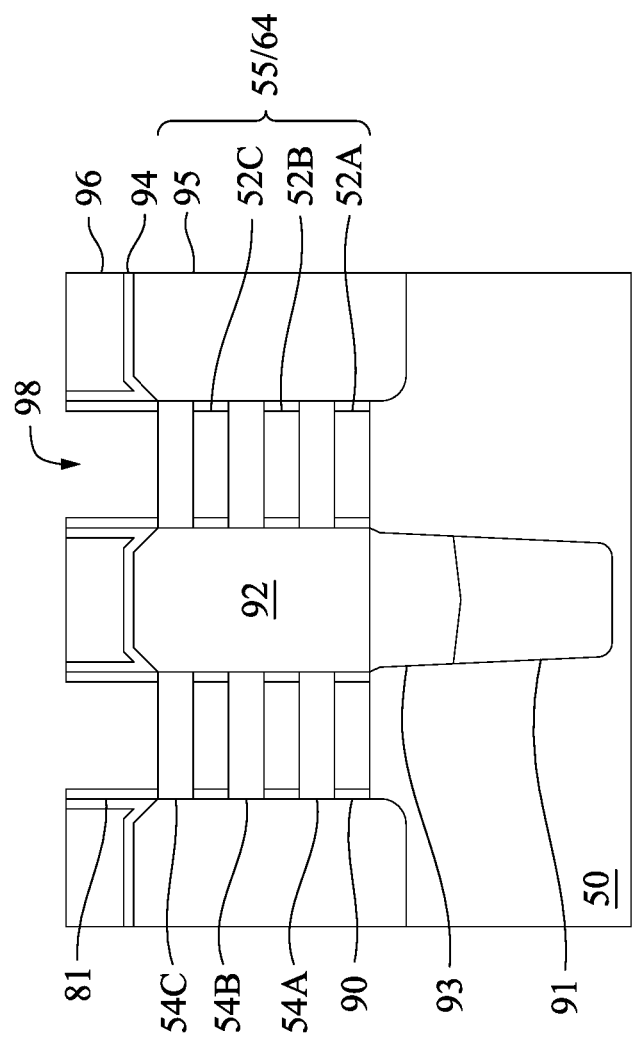

In FIGS. 15A through 15C, the dummy gates 76, and the masks 78 if present, are removed in one or more etching steps, so that third recesses 98 are formed. Portions of the dummy gate dielectrics 60 in the third recesses 98 are also be removed. In some embodiments, the dummy gates 76 and the dummy gate dielectrics 60 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nano-FETs. Portions of the nanostructures 55 which act as the channel regions are disposed between neighboring pairs of the first epitaxial source/drain regions 92 and the second epitaxial source/drain regions 95. During the removal, the dummy gate dielectrics 60 may be used as etch stop layers when the dummy gates 76 are etched. The dummy gate dielectrics 60 may then be removed after the removal of the dummy gates 76.

Figure 16B:
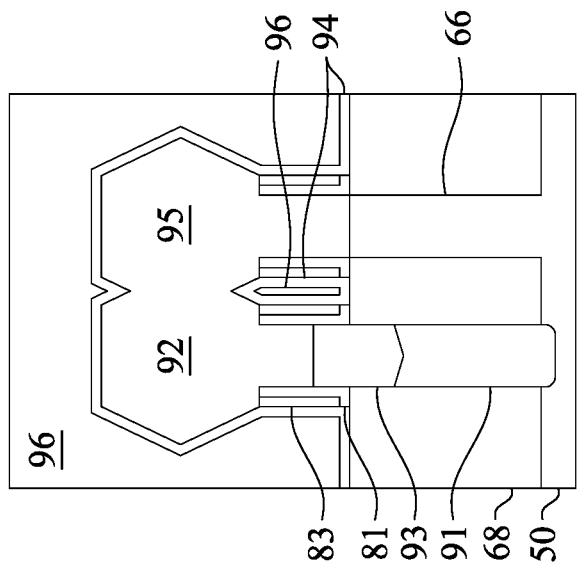
Figure 16A:
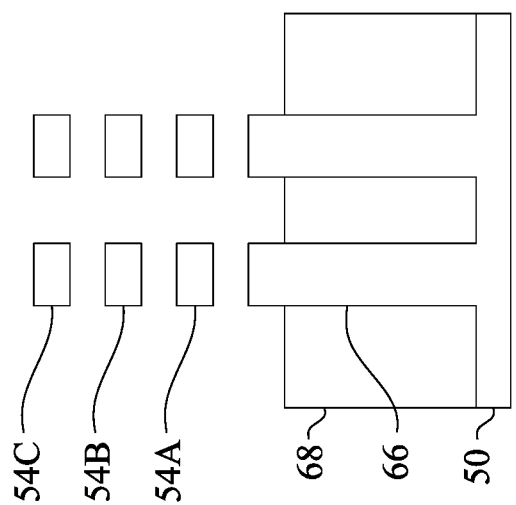
Figure 16C:
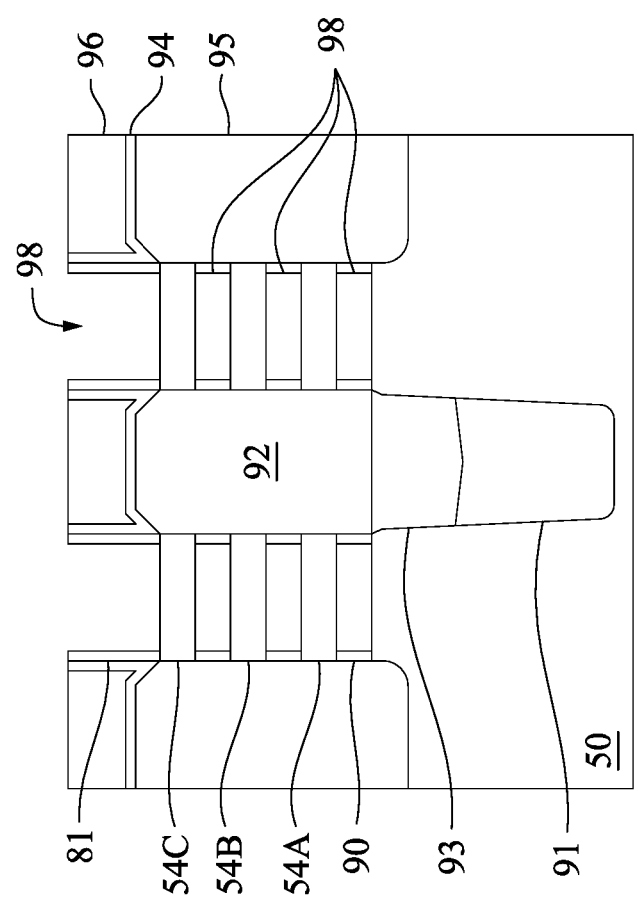

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52.

Figure 17B:
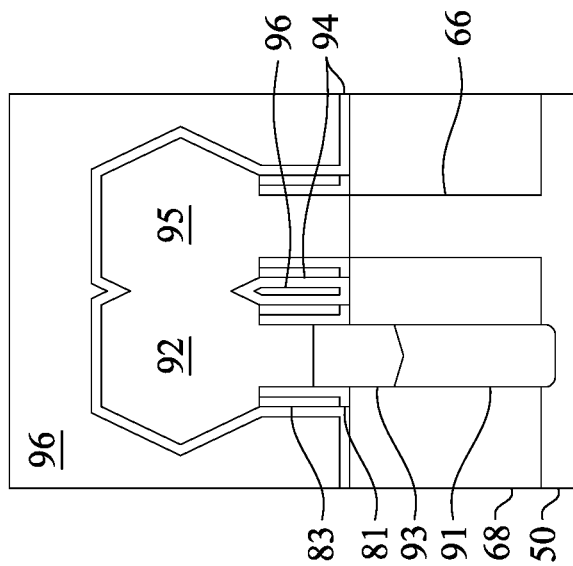
Figure 17A:
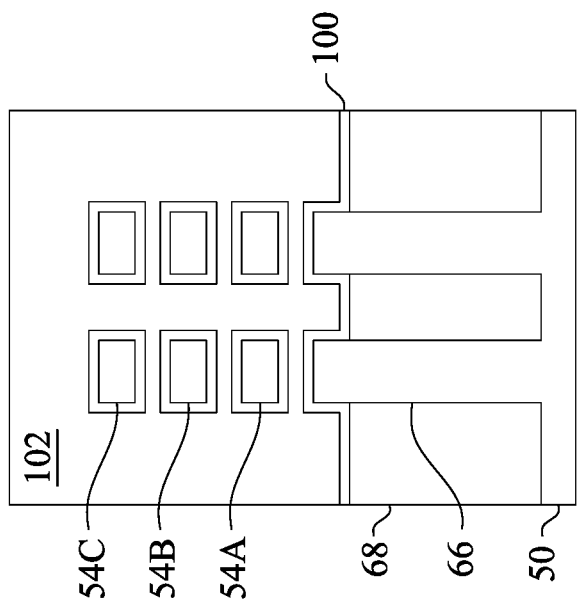
Figure 17C:
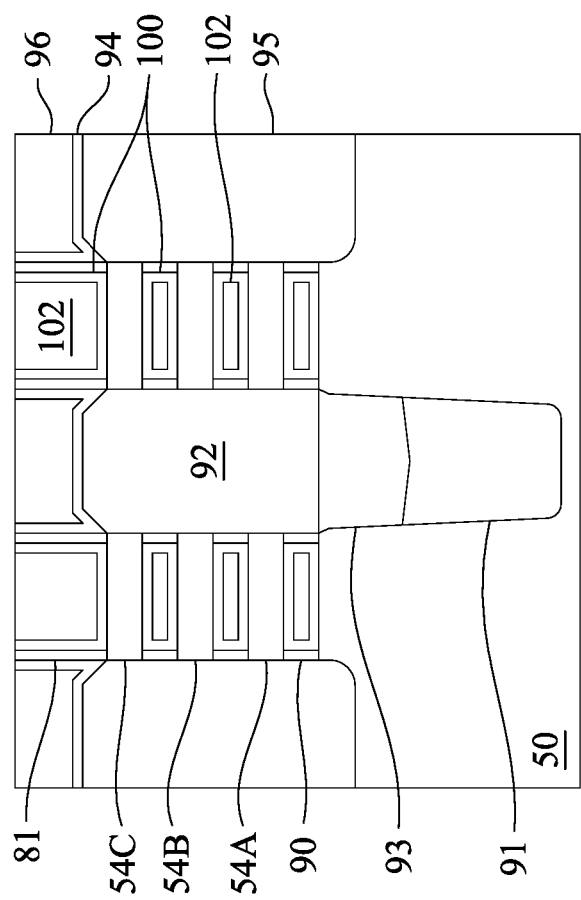

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k-value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited between adjacent ones of the second nanostructures 54 and between the second nanostructure 54A and the substrate 50.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
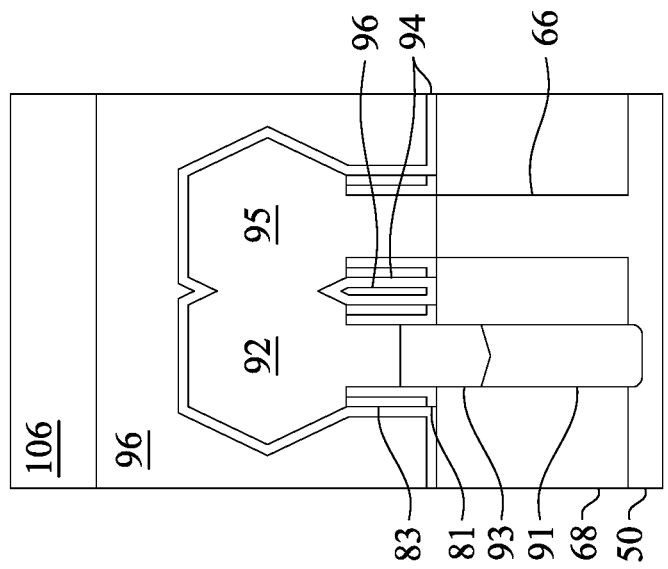
Figure 18A:
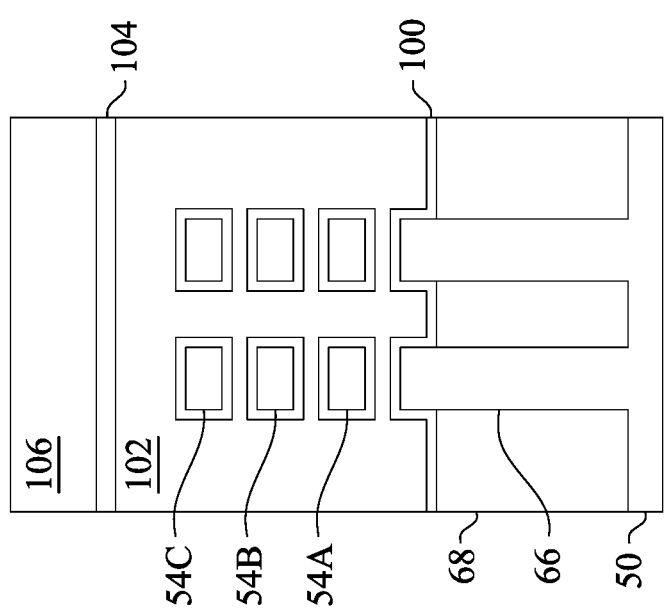
Figure 18C:
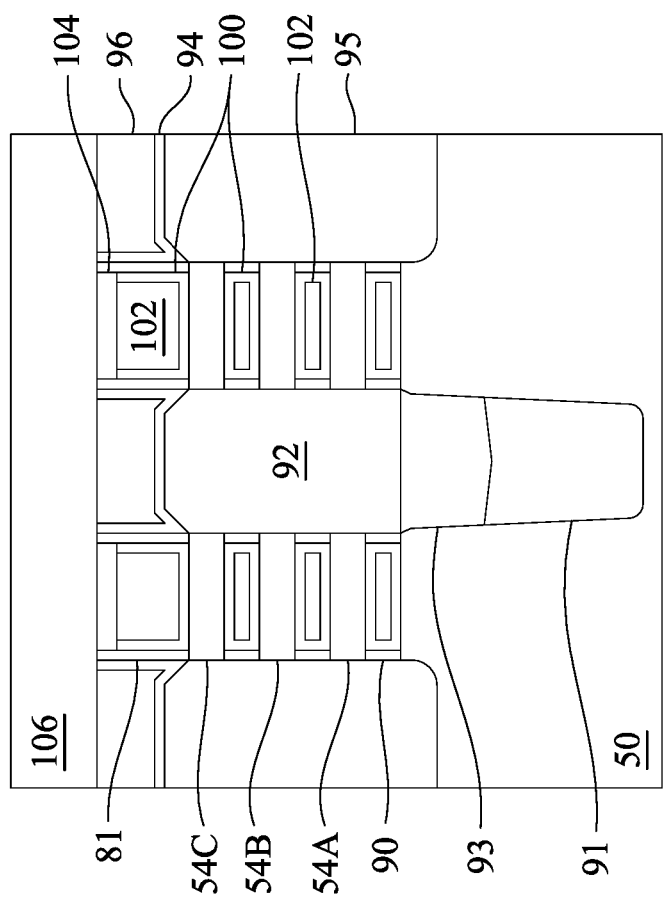

In FIGS. 18A through 18C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 20A through 20C) penetrate through the gate masks 104 to contact the top surfaces of the recessed gate electrodes 102.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
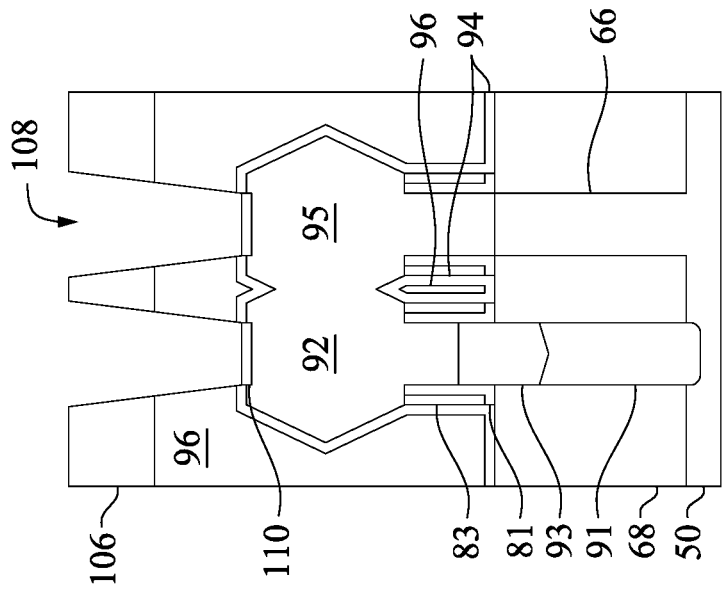
Figure 19A:
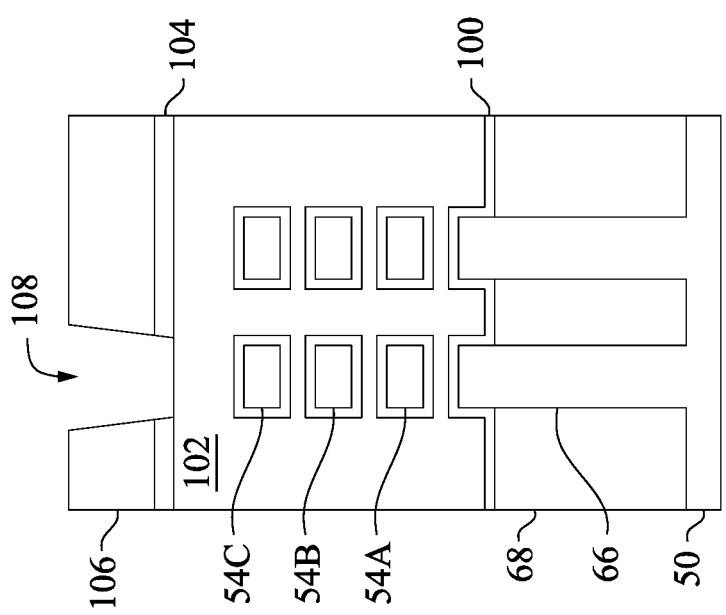
Figure 19C:
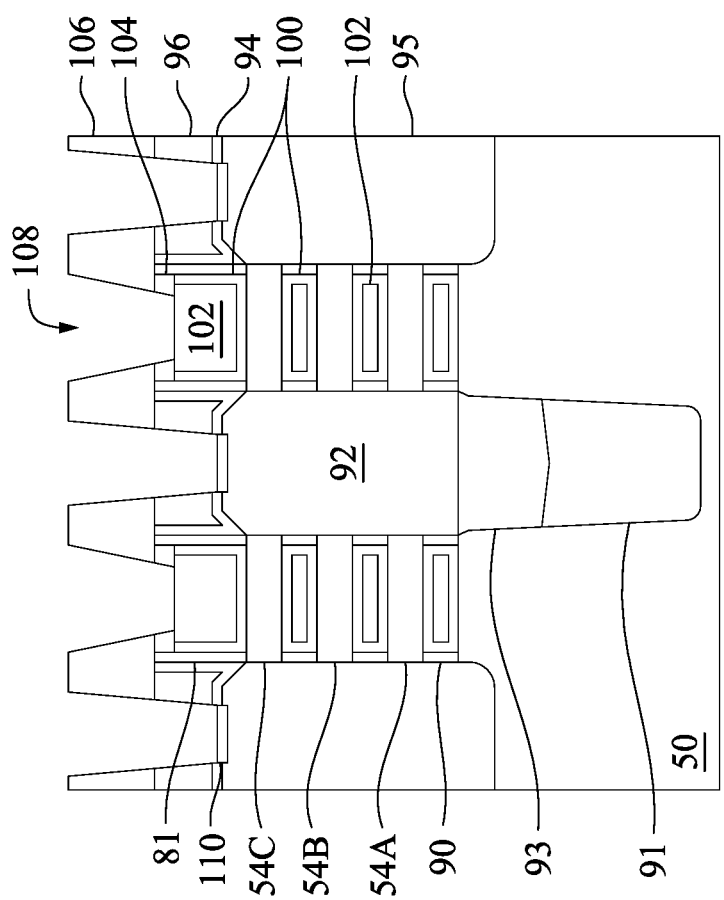

In FIGS. 19A through 19C, the second ILD 106, the first ILD 96, the CESL 94, and the gate masks 104 are etched to form fourth recesses 108 exposing surfaces of the first epitaxial source/drain regions 92, the second epitaxial source/drain regions 95, and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the first epitaxial source/drain regions 92, the second epitaxial source/drain regions 95, and/or the gate structures, and a bottom of the fourth recesses 108 may be level with (e.g., at a same level, or having a same distance from the substrate 50), or lower than (e.g., closer to the substrate 50) the first epitaxial source/drain regions 92, the second epitaxial source/drain regions 95, and/or the gate structures. Although FIG. 19C illustrates the fourth recesses 108 as exposing the first epitaxial source/drain regions 92, the second epitaxial source/drain regions 95, and the gate structures in a same cross-section, in various embodiments, the first epitaxial source/drain regions 92, the second epitaxial source/drain regions 95, and the gate structures may be exposed in different cross-sections, thereby reducing the risk of shorting subsequently formed contacts.

After the fourth recesses 108 are formed, first silicide regions 110 are formed over the first epitaxial source/drain regions 92 and the second epitaxial source/drain regions 95. In some embodiments, the first silicide regions 110 are formed by first depositing a metal (not separately illustrated) capable of reacting with the semiconductor materials of the underlying first epitaxial source/drain regions 92 and the second epitaxial source/drain regions 95 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the first epitaxial source/drain regions 92 and the second epitaxial source/drain regions 95, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and have thicknesses ranging from about 2 nm to about 10 nm.

Figure 20B:
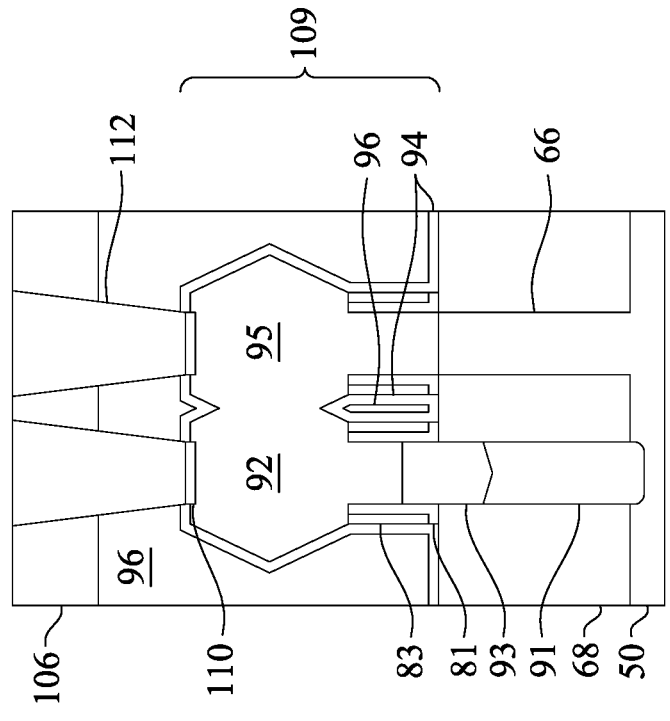
Figure 20A:
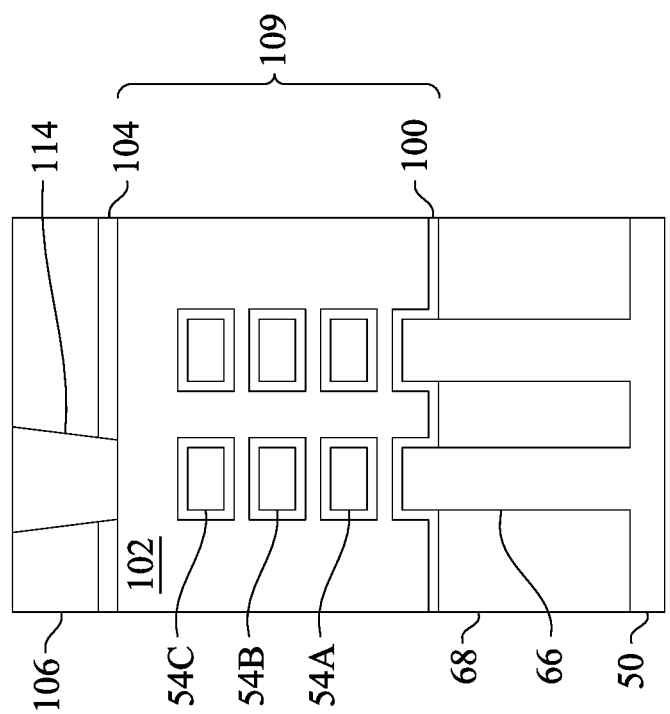
Figure 20C:
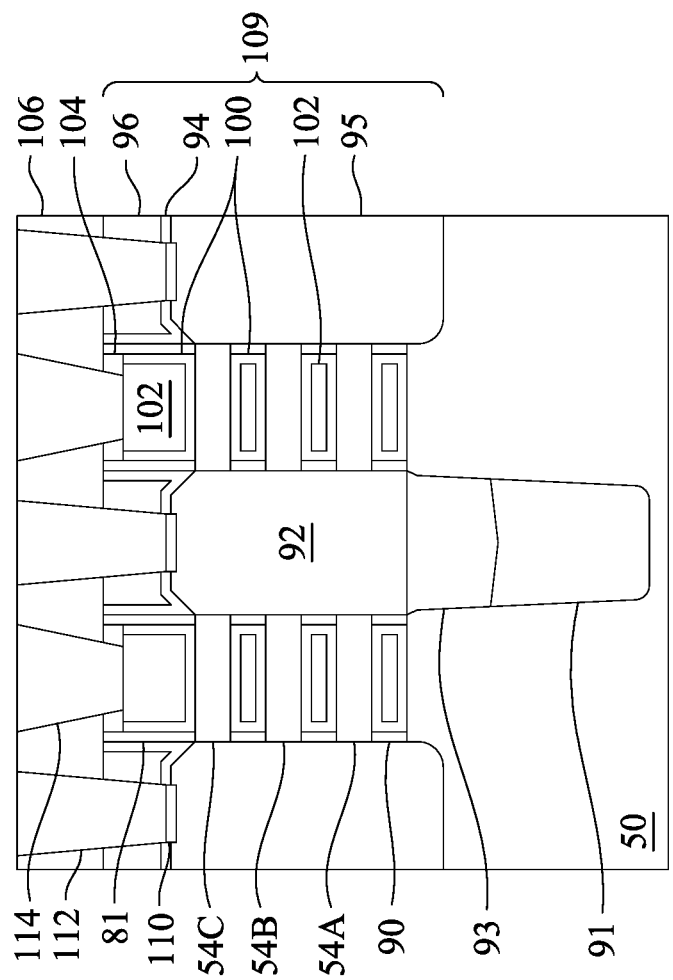

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first epitaxial source/drain regions 92 and the second epitaxial source/drain regions 95 through the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The first epitaxial source/drain regions 92, the second epitaxial source/drain regions 95, the second nanostructures 54, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 21A through 21C) being formed over a front-side thereof and a second interconnect structure (such as the backside interconnect structure 136, discussed below with respect to FIGS. 29A through 29C) being formed over a backside thereof. Although the device layer is described as having nano-FETs, other embodiments may include a device layer having different types of transistors (e.g., planar FETs, finFETs, thin film transistors (TFTs), or the like).

Although FIGS. 20A through 20C illustrate a source/drain contact 112 extending to each of the first epitaxial source/drain regions 92 and the second epitaxial source/drain regions 95, the source/drain contacts 112 may be omitted from certain ones of the first epitaxial source/drain regions 92. For example, as explained in greater detail below, conductive features (e.g., backside vias or power rails) may be subsequently attached through a backside of one or more of the first epitaxial source/drain regions 92. For these particular first epitaxial source/drain regions 92, the source/drain contacts 112 may be omitted or may be dummy contacts that are not electrically connected to any overlying conductive lines (such as the first conductive features 122, discussed below with respect to FIGS. 21A through 21C).

FIGS. 21A through 30C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. FIGS. 21A, 22A, 23A, 24A, 25A, 26A, 27A, 28A, 29A, and 30A illustrate reference cross-section A-A' illustrated in FIG. 1. FIGS. 21B, 22B, 23B, 24B, 24E, 25B, 26B, 27B, 28B, 29B, and 30B illustrate reference cross-section B-B' illustrated in FIG. 1. FIGS. 21C, 22C, 23C, 24C, 24F, 25C, 26C, 26D, 27C, 27D, 28C, 29C, and 30C illustrate reference cross-section C-C' illustrated in FIG. 1. FIGS. 24D and 24G illustrate top-down views. The process steps described in FIGS. 21A through 30C may be applied to both the n-type region 50N and the p-type region 50P. As noted above, a back-side conductive feature (e.g., a backside via, a power rail, or the like) may be connected to one or more of the first epitaxial source/drain regions 92. As such, the source/drain contacts 112 may be optionally omitted from the first epitaxial source/drain regions 92.

Figure 21B:
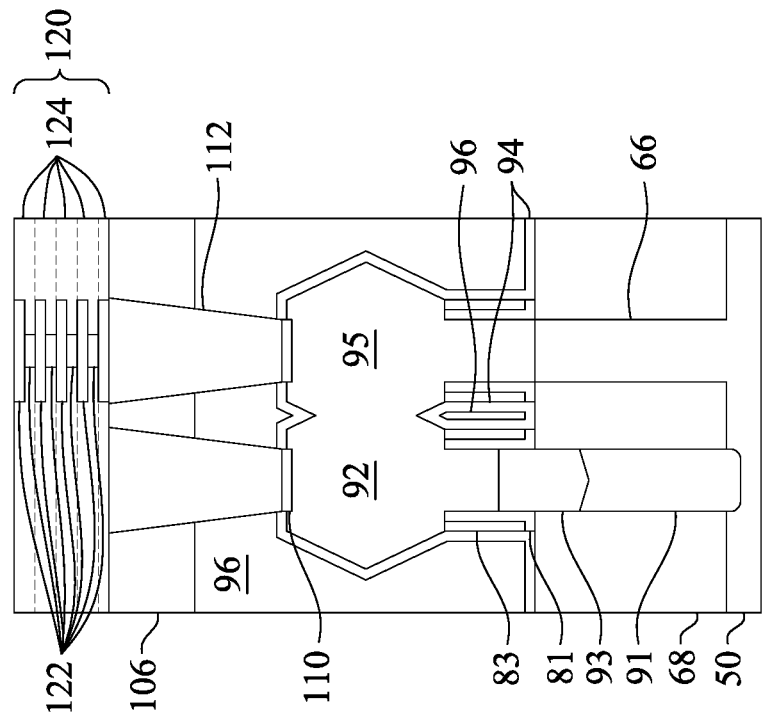
Figure 21A:
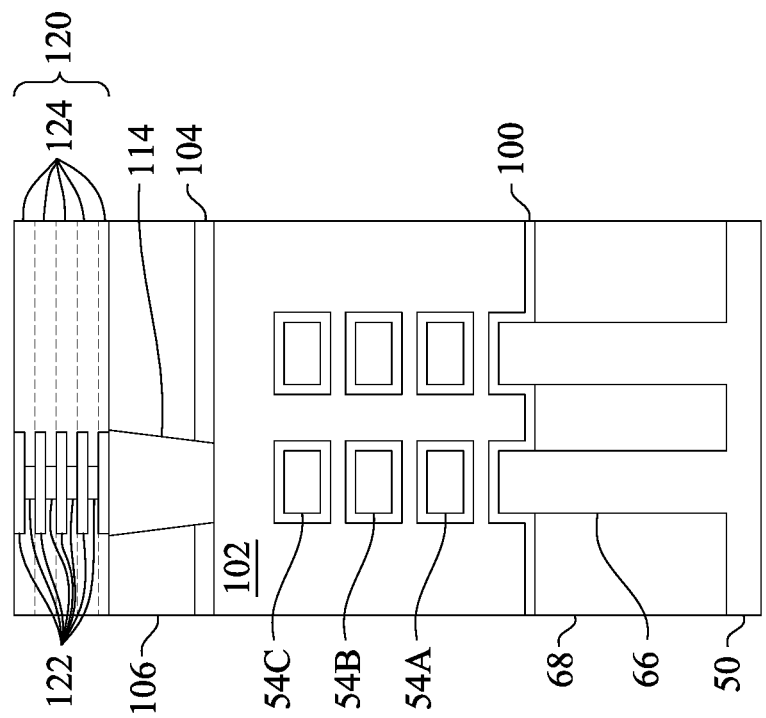
Figure 21C:
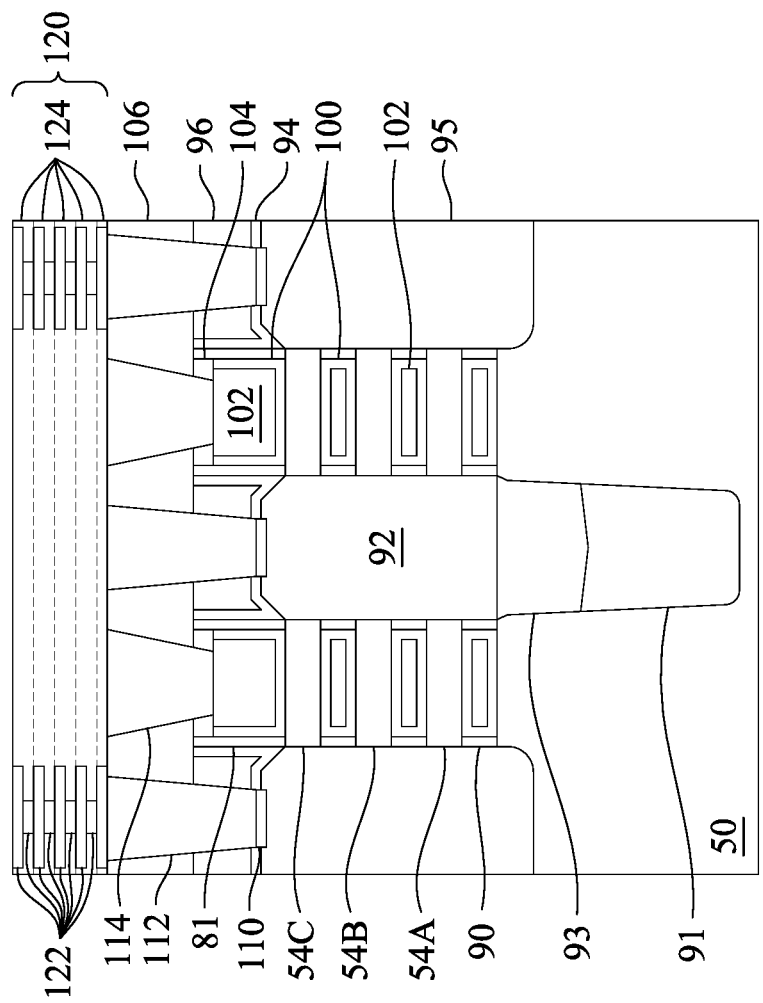

In FIGS. 21A through 21C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22B:
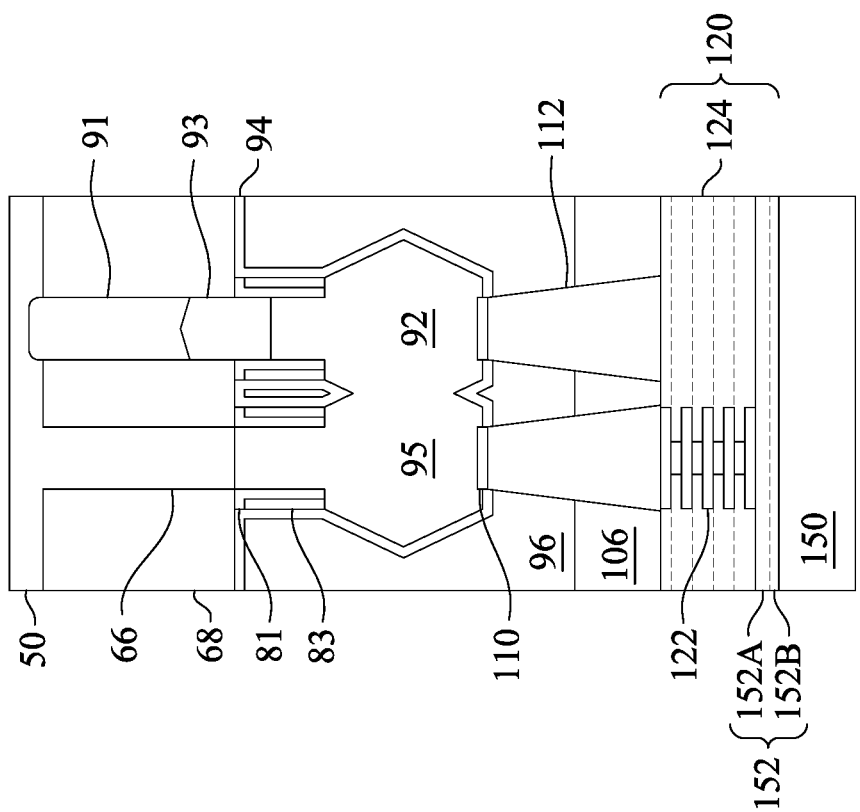
Figure 22A:
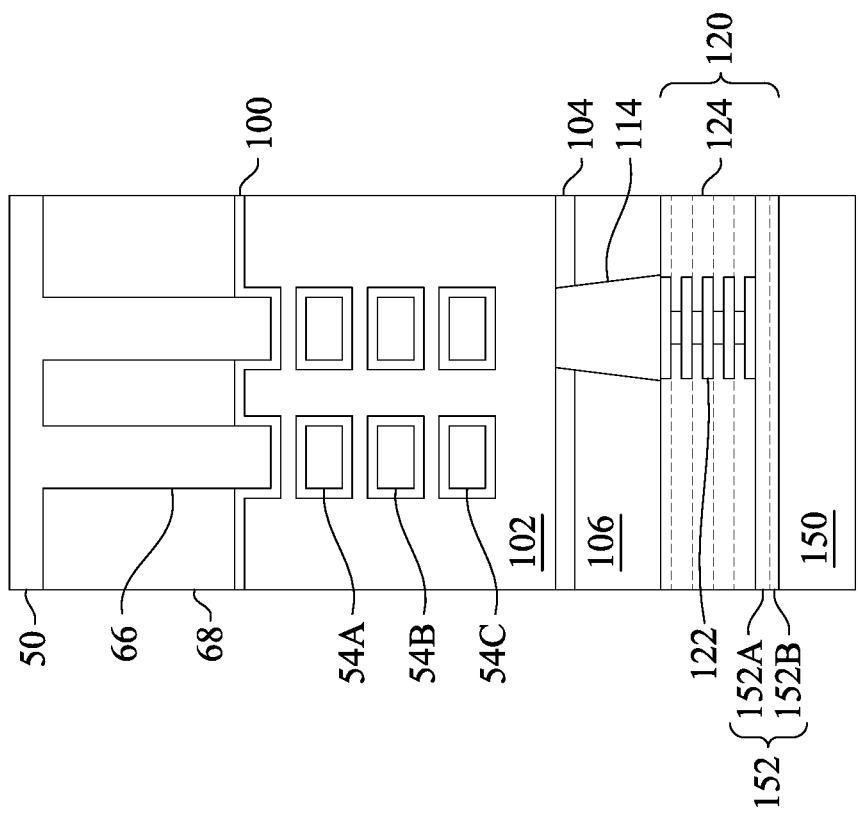
Figure 22C:
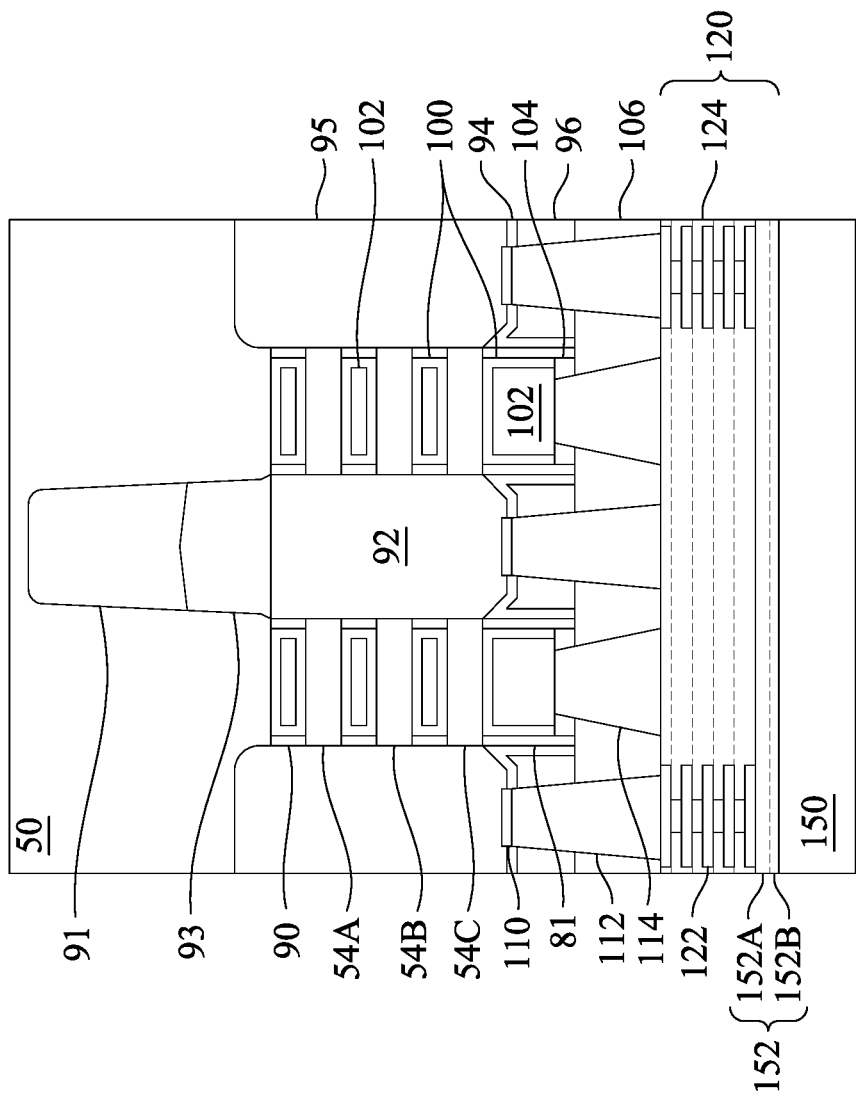

In FIGS. 22A through 22C, a first carrier substrate 150 is bonded to a top surface of the front-side interconnect structure 120 by a first bonding layer 152A and a second bonding layer 152B (collectively referred to as a bonding layer 152). The first carrier substrate 150 may be a glass carrier substrate, a ceramic carrier substrate, a wafer (e.g., a silicon wafer), or the like. The first carrier substrate 150 may provide structural support during subsequent processing steps and in the completed device.

In various embodiments, the first carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high-density plasma (HDP) oxide or the like) that is deposited by CVD, ALD, PVD, or the like. The second bonding layer 152B may likewise be an oxide layer that is formed on a surface of the first carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The first carrier substrate 150 is then aligned with the front-side interconnect structure 120 and the two are pressed against each other to initiate a pre-bonding of the first carrier substrate 150 to the front-side interconnect structure 120. The pre-bonding may be performed at room temperature (e.g., from about 21° C. to about 25° C.). After the pre-bonding, an annealing process may be applied by, for example, heating the front-side interconnect structure 120 and the first carrier substrate 150 to a temperature of about 170° C.

Further in FIGS. 22A through 22C, after the first carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed.

Figure 23B:
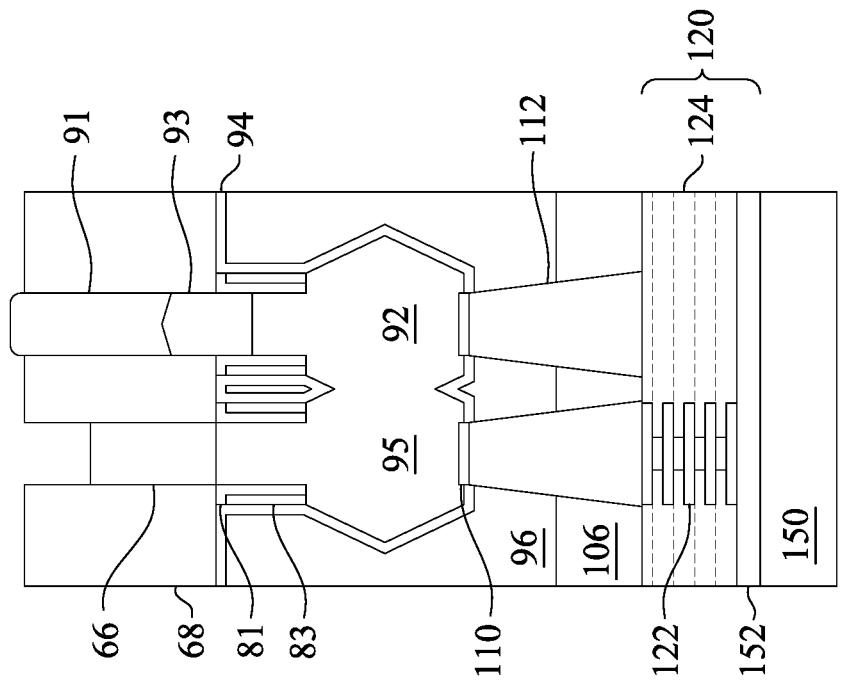
Figure 23A:
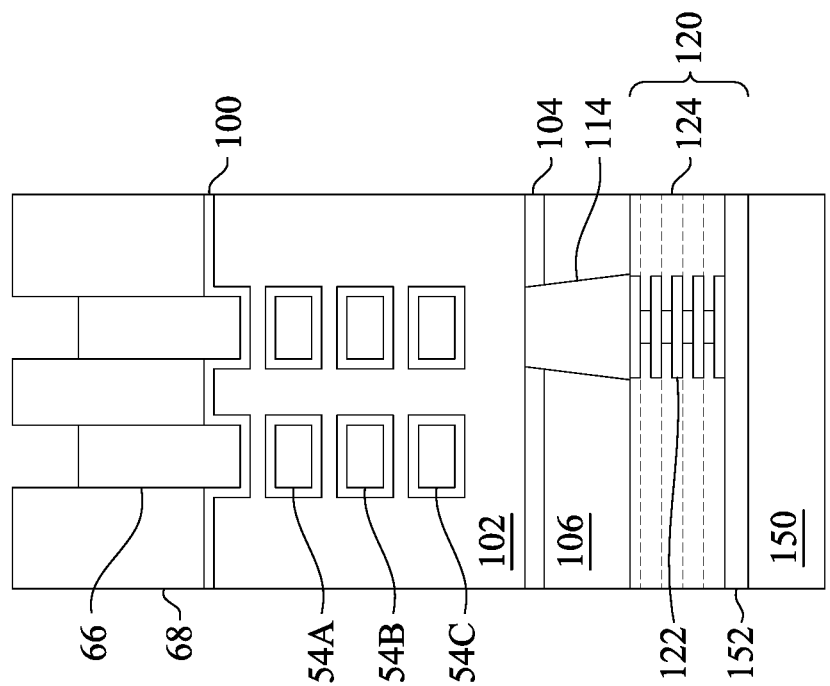
Figure 23C:
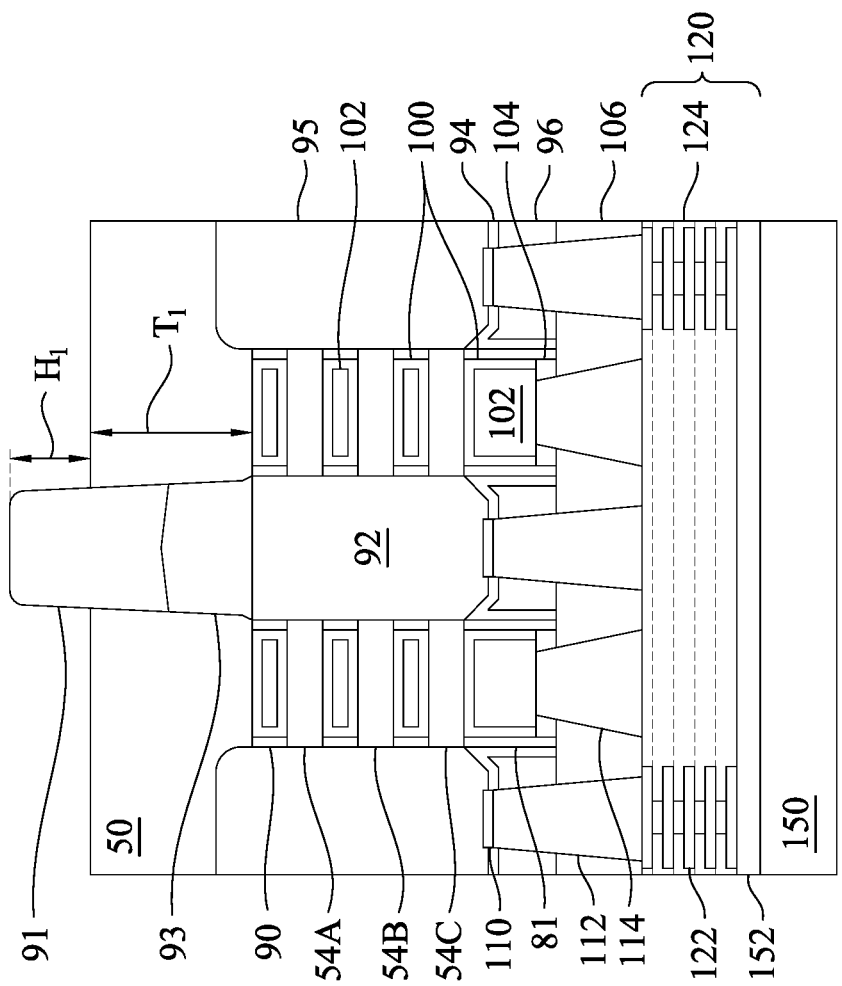

In FIGS. 23A through 23C, a thinning process may be applied to the backside of the substrate 50. The thinning process may comprise a planarization process (e.g., a mechanical grinding, a CMP, or the like), an etch-back process, a combination thereof, or the like. In some embodiments, the thinning process may comprise a suitable etching process, such as an isotropic etching process (e.g., a wet etching process), an anisotropic etching process (e.g., a dry etching process), or the like. The substrate 50 may be thinned by an etching process which is selective to the material of the substrate 50 (e.g., etches the material of the substrate 50 at a faster rate than the material of the STI regions 68 and the first epitaxial materials 91). As illustrated in FIGS. 23A through 23C, following the thinning of the substrate 50, backside surfaces of the STI regions 68 and the first epitaxial materials 91 and portions of sidewalls of the STI regions 68 and the first epitaxial materials 91 may be exposed. Portions of the substrate 50 may remain over the gate structure (e.g., the gate electrodes 102 and the gate dielectric layers 100) and the nanostructures 55 after the thinning process. A thickness $T_1$ of the substrate 50 over the gate structure may be from about 30 nm to about 90 nm. In some embodiments, the substrate 50 may be completely removed. As illustrated in FIG. 23C, backside surfaces of the first epitaxial materials 91 may be disposed a height $H_1$ over backside surfaces of the substrate 50 ranging from about 5 nm to about 35 nm.

In FIGS. 24A through 24G, third epitaxial materials 126 are formed over the exposed backside surfaces of the first epitaxial materials 91. In some embodiments, the third epitaxial materials 126 may be sacrificial materials, which are subsequently removed to form backside vias (such as the backside vias 130, discussed below with respect to FIGS. 27A through 27C). The third epitaxial materials 126 may be epitaxially grown over the first epitaxial materials 91 using a process such as CVD, ALD, VPE, MBE, or the like. The third epitaxial materials 126 may include any acceptable material, such as silicon germanium or the like. The third epitaxial materials 126 may be formed of materials having high etch selectivity to materials of the substrate 50 and dielectric layers (such as the STI regions 68 and the second dielectric layer 125, discussed below with respect to FIGS. 25A through 25C). As such, the third epitaxial materials 126 may be removed and replaced with the backside vias without significantly removing the substrate 50, and the dielectric layers.

In some embodiments, the third epitaxial materials 126 may be formed of materials having a high germanium concentration, similar to the first epitaxial materials 91. For example, an atomic concentration of germanium in the third epitaxial materials 126 may range from about 20% to about 60%. The materials having the higher germanium concentrations may be etched at a higher rate as compared to the materials having the lower germanium concentrations (e.g., the second epitaxial materials 93). Forming the third epitaxial materials 126 of the materials having higher germanium concentrations allows for the third epitaxial materials 126 to be etched at a high etch rate during a subsequent etching process used to remove the third epitaxial materials 126, the first epitaxial materials 91, and the second epitaxial materials 93 (discussed below with respect to FIGS. 26A through 26D).

In some embodiments, an optional dielectric mask 127 may be formed over exposed surfaces of the substrate 50 and the fins 66 prior to forming the third epitaxial materials 126 in order to prevent formation of the third epitaxial materials 126 along surfaces of the substrate 50 and the fins 66. The dielectric mask 127 may include an oxide (e.g., silicon oxide or the like), a nitride (e.g., silicon nitride or the like), combinations thereof, or the like. The dielectric mask 127 may be deposited by CVD, ALD or the like and may be etched back such that sidewalls and backside surfaces of the first epitaxial materials 91 are exposed. The dielectric mask 127 may be removed after forming the third epitaxial materials 126.

In some embodiments, the third epitaxial materials 126 may be formed by alternating deposition and etch-back processes. The deposition processes may include CVD, ALD, VPE, MBE, combinations thereof, or the like. The deposition processes may include precursors such as germanium-containing precursors (e.g., germane ($GeH_4$) or the like), silicon-containing precursors (e.g., silane ($SiH_4$) or the like), combinations thereof, or the like. The deposition processes may further include carrier gases such as hydrogen ($H_2$), nitrogen ($N_2$), combinations thereof, or the like. Ratios of the precursor flow rates to the carrier gas flow rates may be tuned in order to ensure that the third epitaxial materials 126 are selectively grown over the first epitaxial materials 91 and not along surfaces of the STI regions 68, the dielectric mask 127, and/or the substrate 50. Ratios of the germanium-containing precursor flow rates to the silicon-containing precursor flow rates may also be used to control the composition of the third epitaxial materials 126.

The etch-back processes may include precursors such as hydrogen chloride (HCl), silane ($SiH_4$), combinations thereof, or the like. The etch-back processes may further include carrier gases such as hydrogen ($H_2$), nitrogen ($N_2$), combinations thereof, or the like. In embodiments in which the etch-back processes include hydrogen chloride and silane, the silane may passivate portions of the third epitaxial materials 126, while the hydrogen chloride attacks and etches un-passivated portions of the third epitaxial materials 126. As such, the etch-back process may be used to control the shape of the third epitaxial materials 126. In some embodiments, sidewall portions of the third epitaxial materials 126 may be passivated, while backside surfaces of the third epitaxial materials 126 are etched. This process may be used to increase critical dimensions (e.g., widths) of the third epitaxial materials 126, which reduces device resistance, without requiring greater heights of the third epitaxial materials 126.

Figure 24B:
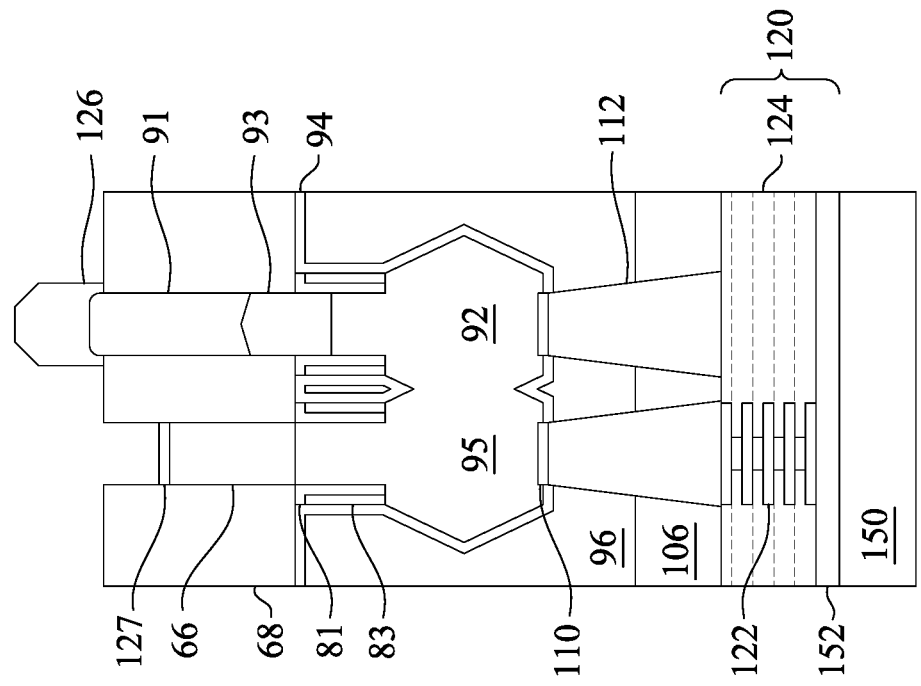
Figure 24A:
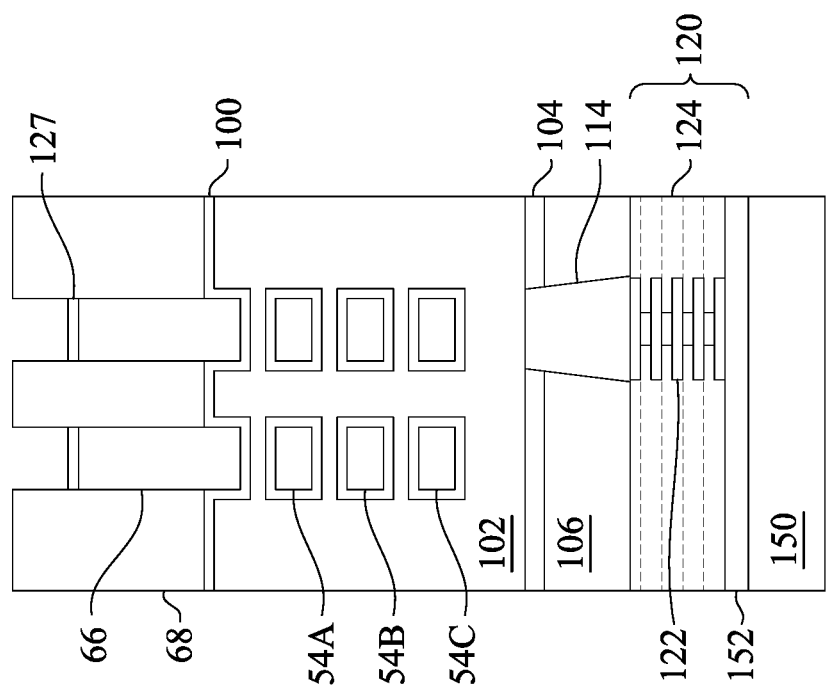
Figure 24C:
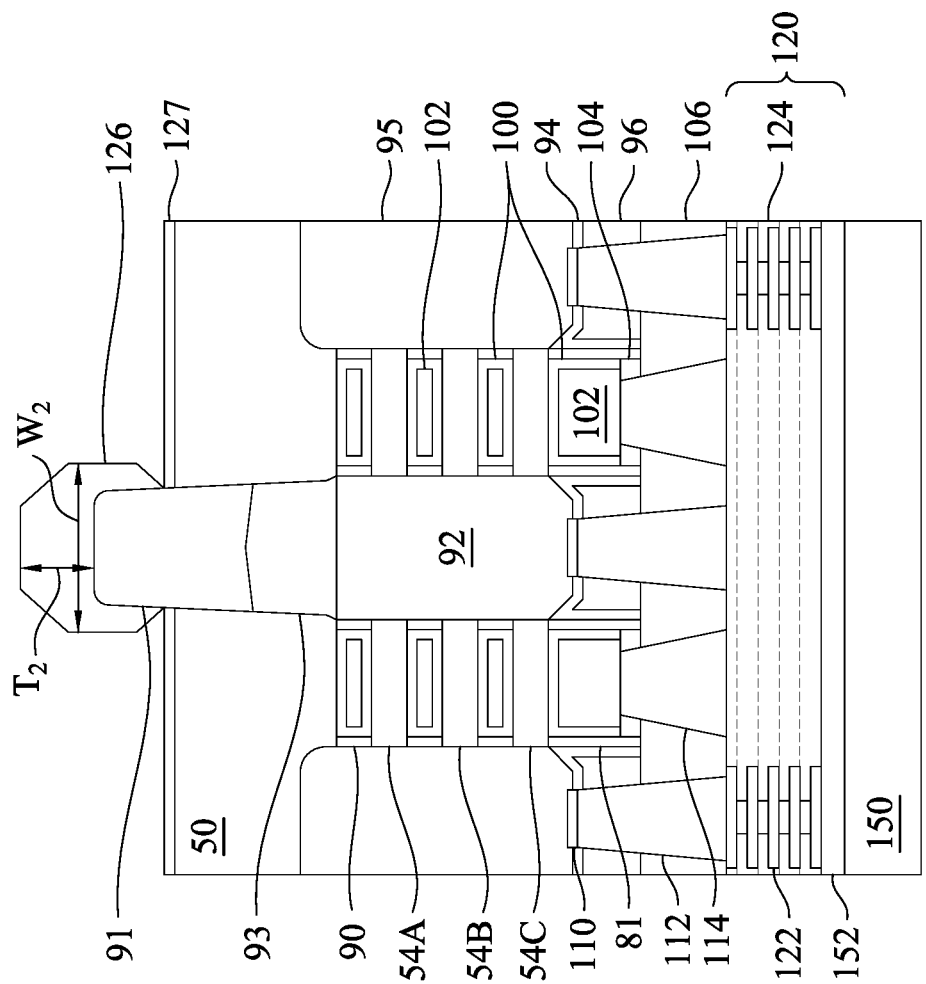
Figure 24D:
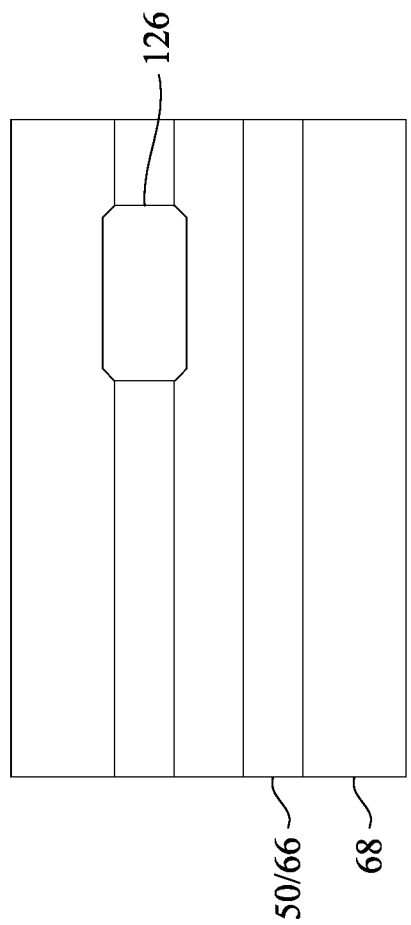
Figure 24F:
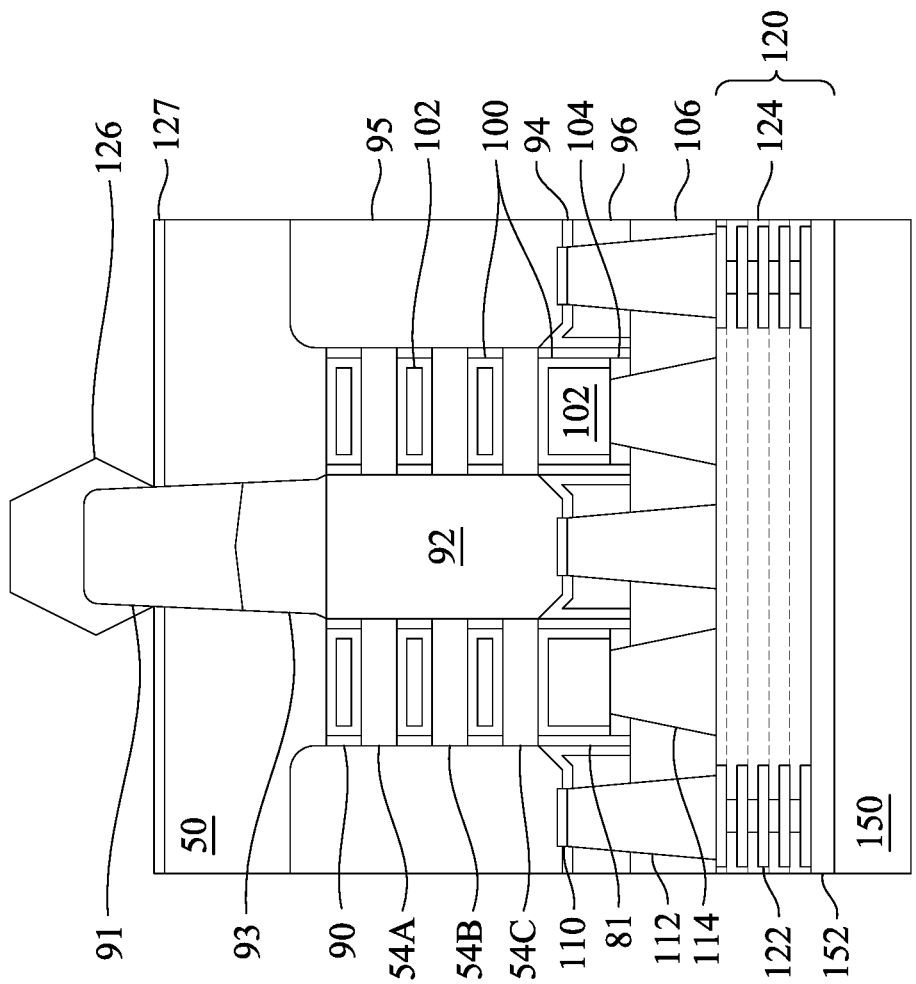
Figure 24E:
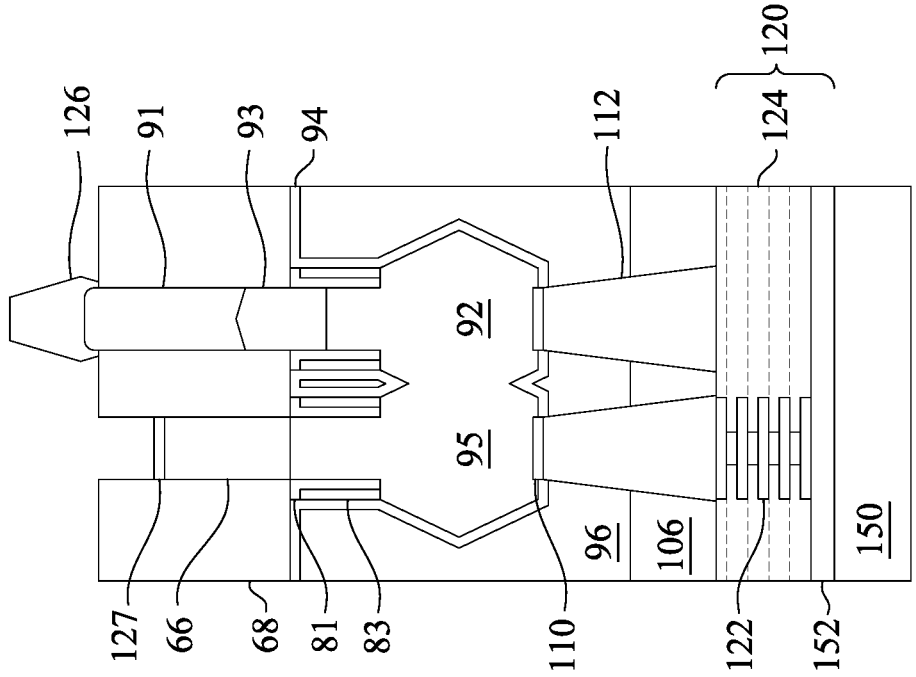
Figure 24G:
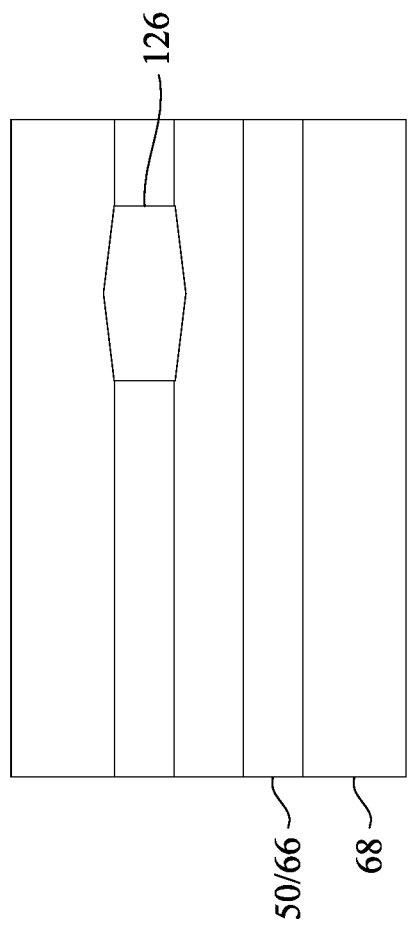

As illustrated in FIGS. 24B through 24D, the third epitaxial materials 126 may have octagonal shapes or hammer-head shapes in cross-sectional views and a top-down view. As illustrated in FIGS. 24E through 24G, the third epitaxial materials 126 may have hexagonal shapes or hammer-head shapes in cross-sectional views and a top-down view. The third epitaxial materials 126 may have a thickness $T_2$ over backside surfaces of the first epitaxial materials ranging from about 5 nm to about 30 nm. The third epitaxial materials 126 may have widths $W_2$ ranging from about 20 nm to about 70 nm. The shape and size of the third epitaxial materials 126 may be controlled in order to control the size and shape of subsequently formed backside vias, which may replace the first epitaxial materials 91, the second epitaxial materials 93, and the third epitaxial materials 126.

Figures 25A, 25B:
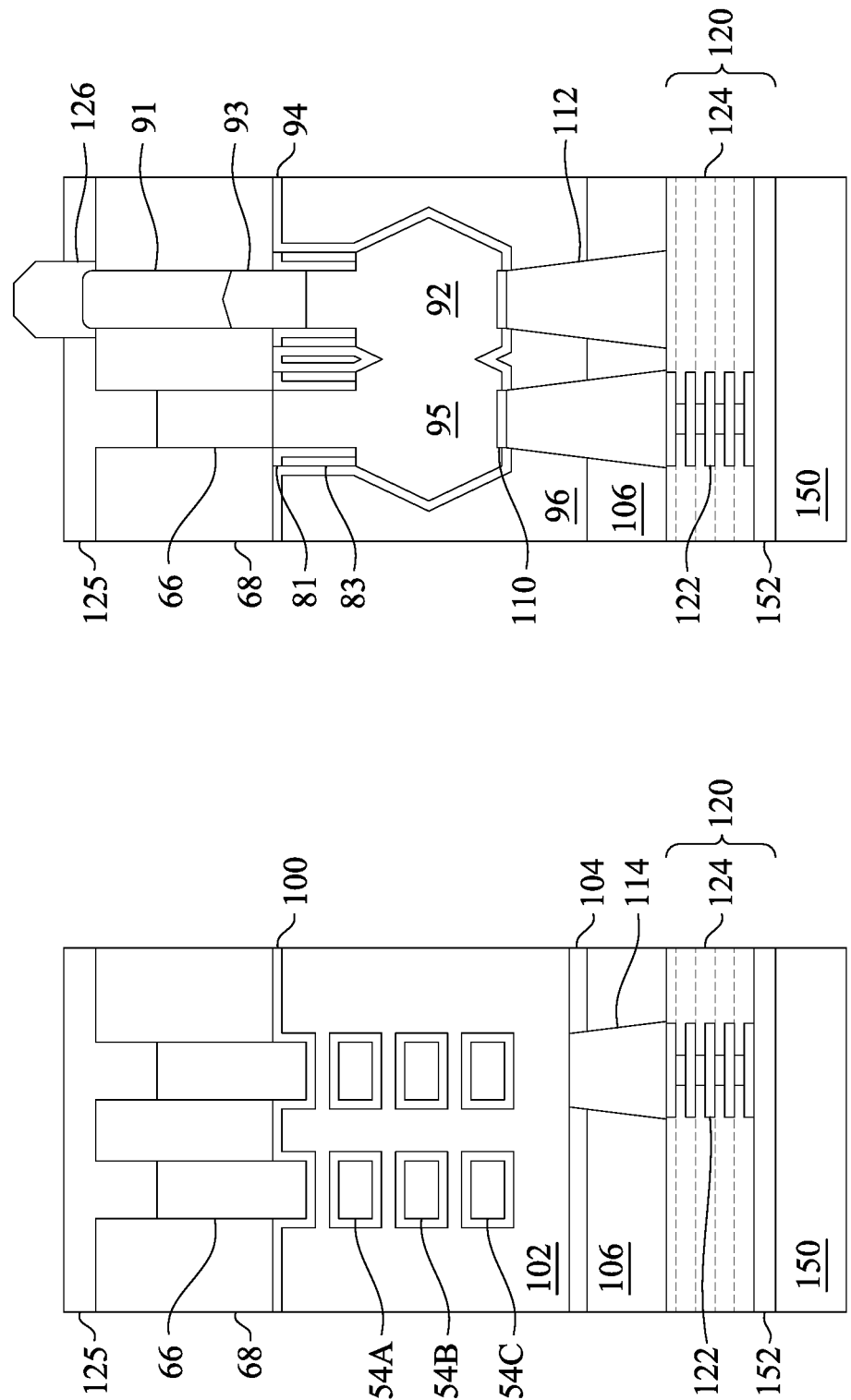
Figure 25C:
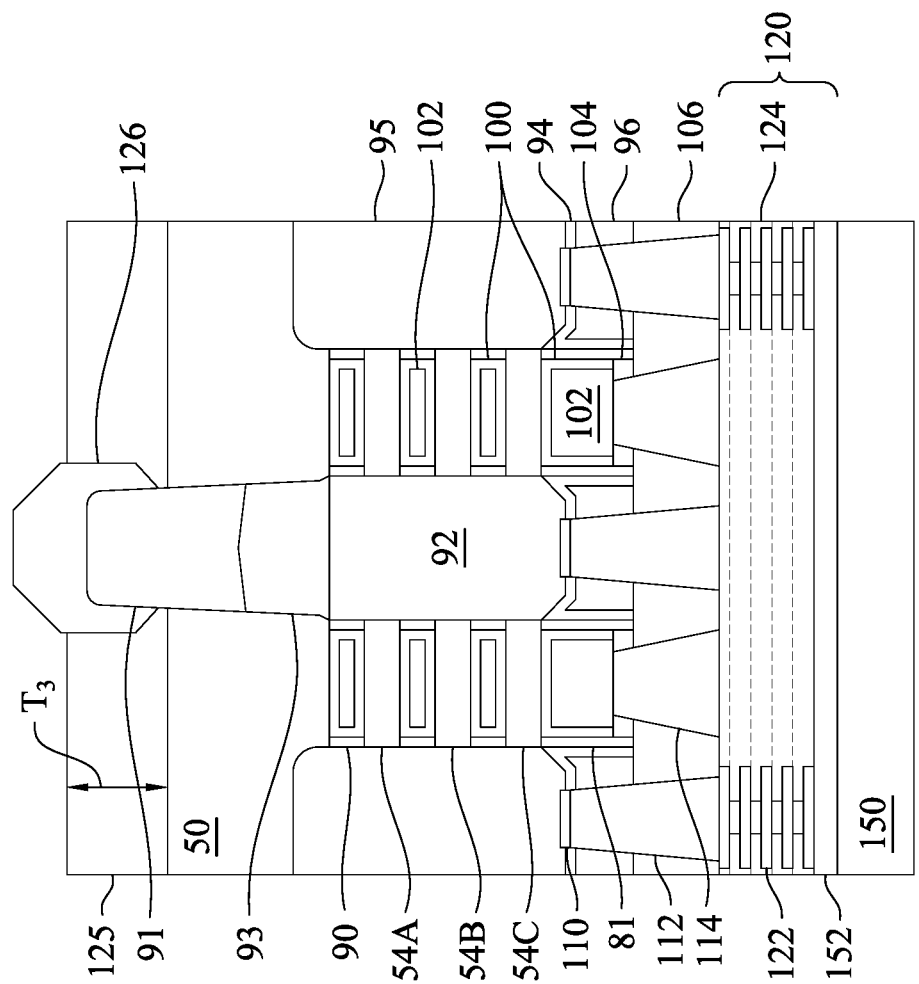

In FIGS. 25A through 25C, a second dielectric layer 125 is deposited on the backside of the device. As illustrated in FIGS. 25A through 25C, the second dielectric layer 125 may be deposited over the substrate 50 and the STI regions 68. In some embodiments, the second dielectric layer 125 may also be deposited over the third epitaxial materials 126 and may be etched back such that portions of the third epitaxial materials 126 protrude from the second dielectric layer 125. The second dielectric layer 125 may be deposited by a process such as CVD, ALD, or the like. The second dielectric layer 125 may physically contact sidewalls of the third epitaxial materials 126, sidewalls of the first epitaxial materials 91, sidewalls and backside surfaces of the STI regions 68, and backside surfaces of the substrate 50. The second dielectric layer 125 may comprise a material such silicon oxide or the like, although any suitable material, such as low-dielectric constant (low-k) materials having a k-value less than about 3.5, may be utilized. The second dielectric layer 125 may have a thickness $T_3$ over the backside surfaces of the substrate 50 from about 15 nm to about 30 nm. Controlling the thickness of the second dielectric layer 125 may be used to control the length of subsequently formed backside vias extending through the second dielectric layer 125.

In FIGS. 26A through 26D, the third epitaxial materials 126, the first epitaxial materials 91, and the second epitaxial materials 93 are removed to form fifth recesses 128 and second silicide regions 129 are formed in the fifth recesses 128. The third epitaxial materials 126, the first epitaxial materials 91, and the second epitaxial materials 93 may be removed by a suitable etching process, which may be an isotropic etching process, such as a wet etching process. The etching process may have a high etch selectivity to materials of the third epitaxial materials 126, the first epitaxial materials 91, and the second epitaxial materials 93. As such, the third epitaxial materials 126, the first epitaxial materials 91, and the second epitaxial materials 93 may be removed without significantly removing materials of the second dielectric layer 125, the STI regions 68, the substrate 50, or the first epitaxial source/drain regions 92. As discussed previously, the second epitaxial materials 93 may be formed of materials having lower germanium concentrations such that the etching rate of the second epitaxial materials 93 is lower in order to protect the first epitaxial source/drain regions 92 from excessive etching during the etching process used to remove the third epitaxial materials 126, the first epitaxial materials 91, and the second epitaxial materials 93. The fifth recesses 128 may expose sidewalls of the second dielectric layer 125, sidewalls of the STI regions 68, and backside surfaces of the first epitaxial source/drain regions 92.

Figure 26C:
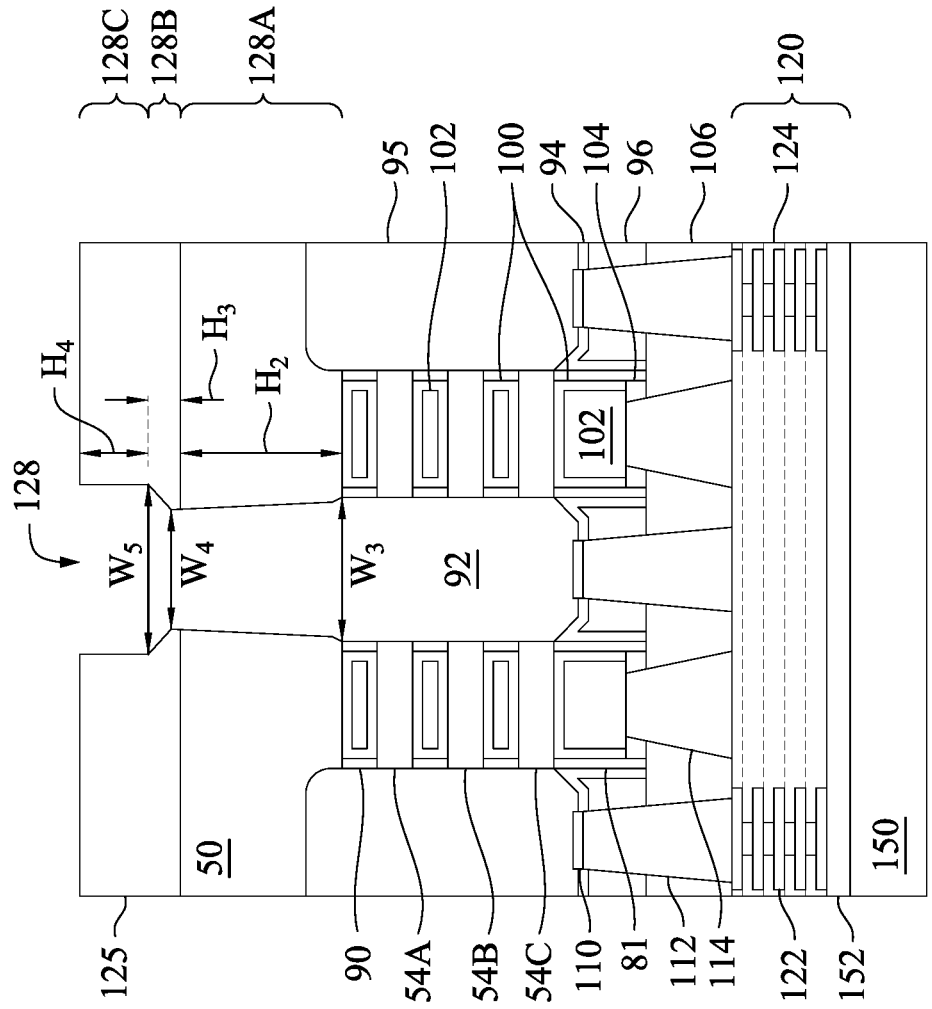

As illustrated in FIG. 26C, the fifth recesses 128 may be hammer-shaped in a cross-sectional view, with a first portion 128A having a tapered profile with a width that continuously decreases in a direction from front-side surfaces of the substrate 50 towards backside surfaces of the substrate 50; a second portion 128B having a tapered profile with a width that continuously decreases in a direction from backside surfaces of the second dielectric layer 125 towards the backside surfaces of the substrate 50; and a third portion 128C with vertical sidewalls. The first portion 128A may taper from a width $W_3$ to a width $W_4$ and have a height $H_2$ from about 20 nm to about 50 nm. The width $W_3$ may range from about 15 nm to about 30 nm, the width $W_4$ may range from about 10 nm to about 30 nm, and a ratio of the width $W_3$ to the width $W_4$ may range from about 1 to about 1.8. The second portion 128B may taper from a width $W_5$ to a width $W_4$ and have a height $H_3$ from about 2 nm to about 10 nm. The width $W_5$ may range from about 20 nm to about 70 nm and a ratio of the width $W_5$ to the width $W_4$ may range from about 1 to about 1.8. The third portion 128C may have the width $W_5$ and a height $H_4$ ranging from about 5 nm to about 20 nm. In some embodiments, a ratio of the width $W_5$ to an average width of the first portion 128A may be from about 2 to about 7. Forming the fifth recesses 128 including the second portion 128B and the third portion 128C increases the contact area for subsequently formed backside vias, which reduces contact resistance and improves RC time delay.

Figure 26D:
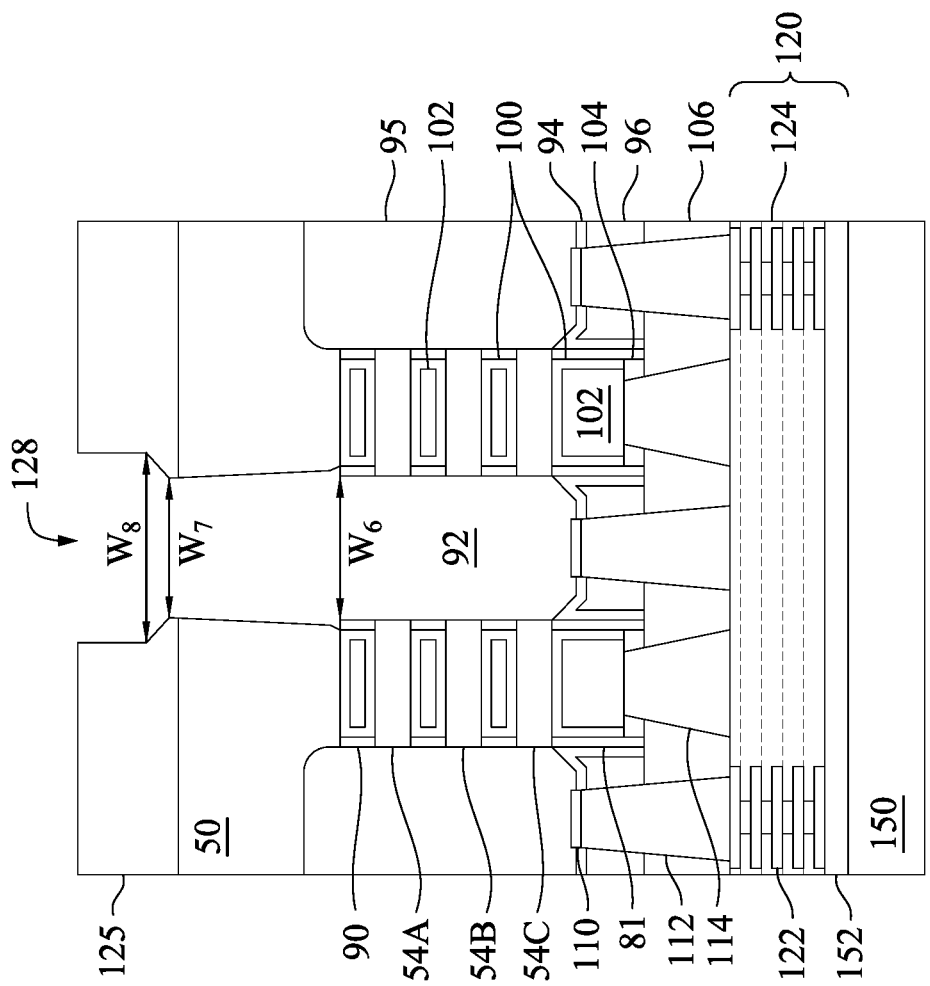

In FIG. 26D, the fifth recesses 128 may be widened by an additional suitable etching process, which may be an isotropic etching process, such as a wet etching process. The additional etching process may have a high etch selectivity to materials of the second dielectric layer 125 and the substrate 50. As such, materials of the second dielectric layer 125 and the substrate 50 may be removed without significantly removing materials of the first epitaxial source/drain regions 92. Following the additional etching process, the first portion 128A may taper from a width $W_6$ to a width $W_7$. The width $W_6$ may range from about 17 nm to about 32 nm, the width $W_7$ may range from about 12 nm to about 32 nm, and a ratio of the width $W_6$ to the width $W_7$ may range from about 1 to about 1.8. The second portion 128B may taper from a width $W_8$ to a width $W_7$. The width $W_8$ may range from about 20 nm to about 70 nm and a ratio of the width $W_8$ to the width $W_7$ may range from about 1.1 to about 1.8. The third portion 128C may have the width $W_8$. Performing the additional etching process to widen the fifth recesses 128 further increases the contact area for subsequently formed backside vias, which further reduces contact resistance and improves RC time delay.

Second silicide regions 129 may then be formed in the fifth recesses 128 on backsides of the first epitaxial source/drain regions 92. The second silicide regions 129 may be similar to the first silicide regions 110, described above with respect to FIGS. 19A through 19C. For example, the second silicide regions 129 may be formed of a like material and using a like process as the first silicide regions 110.

In FIGS. 27A through 27D, backside vias 130 are formed in the fifth recesses 128. The backside vias 130 may extend through the second dielectric layer 125 and may be electrically coupled to the first epitaxial source/drain regions 92 through the second silicide regions 129. The backside vias 130 may each comprise one or more layers, such as barrier layers, diffusion layers, and fill materials. For example, in some embodiments, the backside vias 130 each include a barrier layer and a conductive material, and are each electrically coupled to an underlying conductive feature (e.g., a second silicide region 129). The backside vias 130 are electrically coupled to the first epitaxial source/drain regions 92 through the second silicide regions 129. The barrier layer may include titanium, titanium nitride, tantalum, tantalum nitride, or the like. The conductive material may be copper, a copper alloy, silver, gold, tungsten, cobalt, aluminum, nickel, or the like.

Figure 27B:
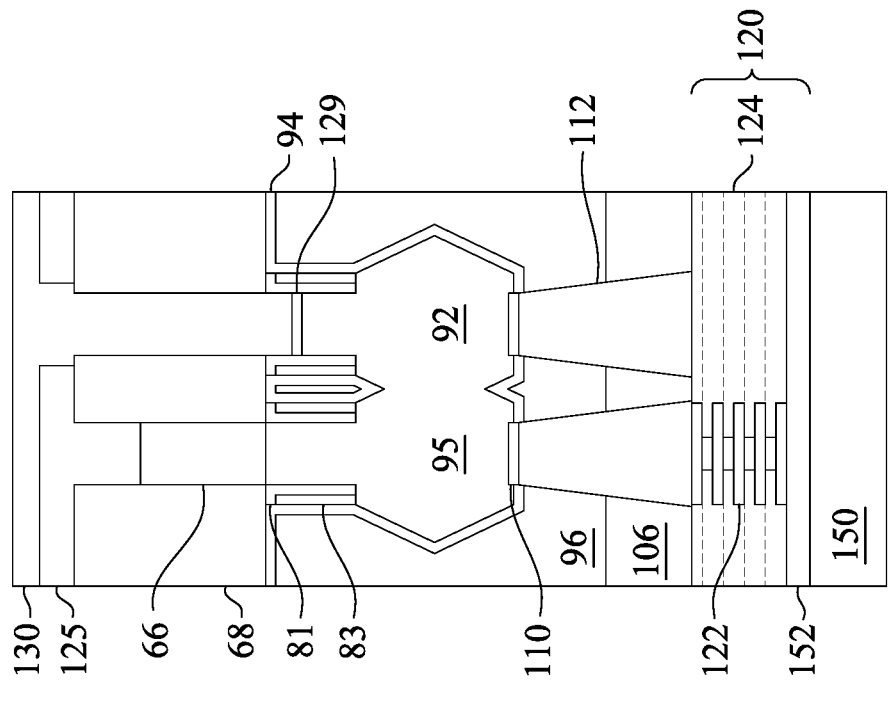
Figure 27A:
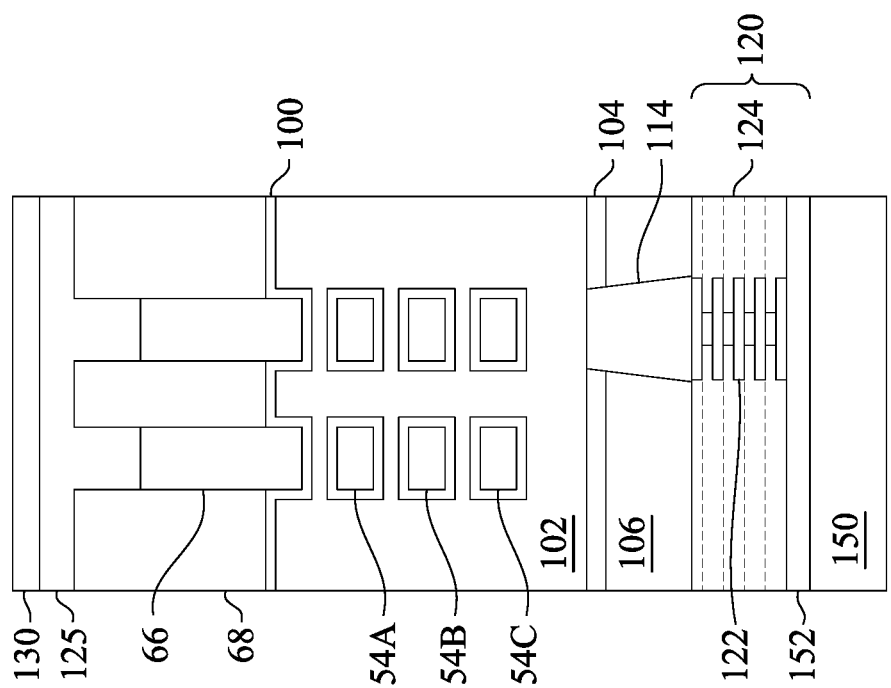
Figure 27C:
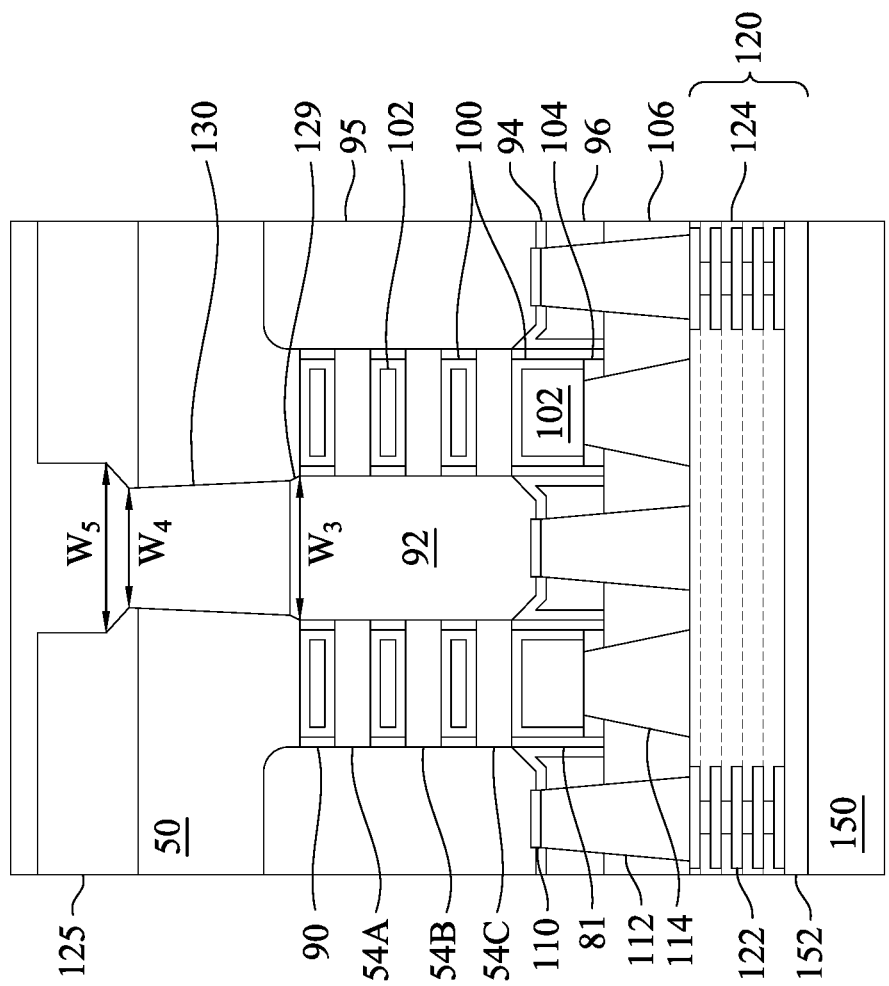
Figure 27D:
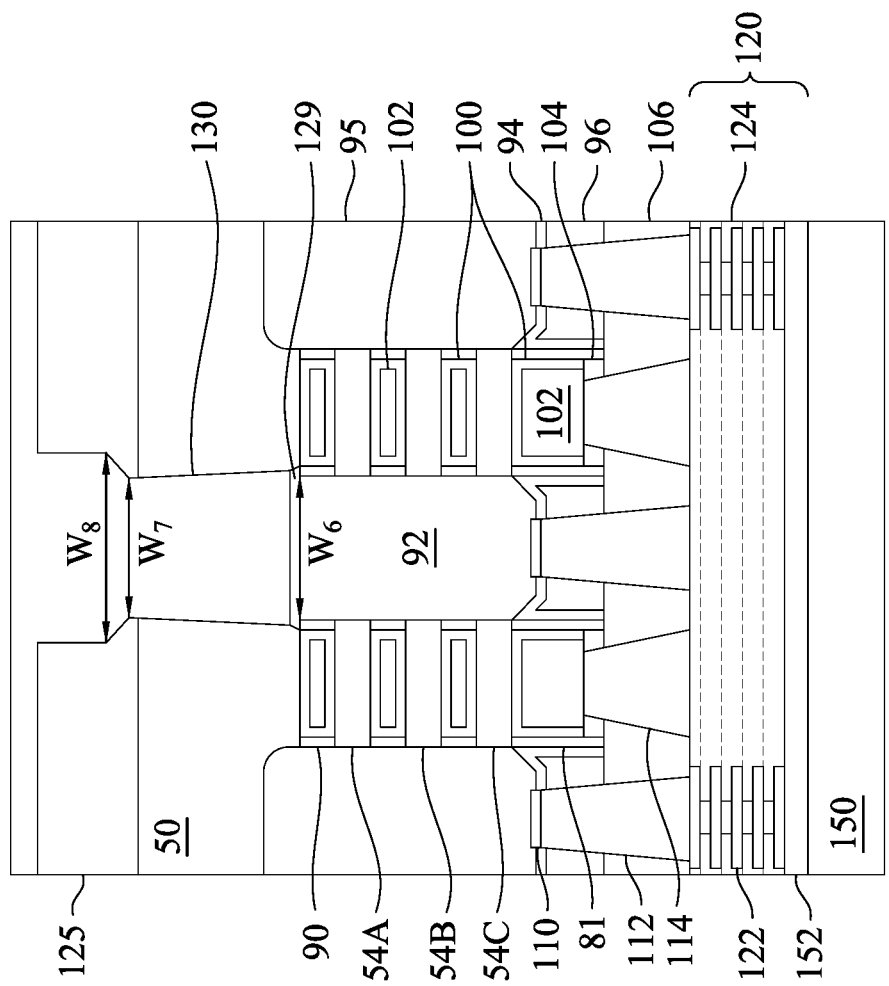

As illustrated in FIGS. 27B through 27D, the backside vias 130 may have hammer shapes in which backside vias 130 portions of the backside vias 130 have octagonal shapes. The backside vias 130 may have the widths $W_4$-$W_6$, as illustrated in FIG. 27C, or the widths $W_7$-$W_9$, as illustrated in FIG. 27D. By epitaxially growing the third epitaxial materials 126 over the first epitaxial materials 91, widths of backside portions of the backside vias 130 are enlarged, which reduces contact resistance of the backside vias 130, reduces RC time delay, and improves device performance.

Figure 28B:
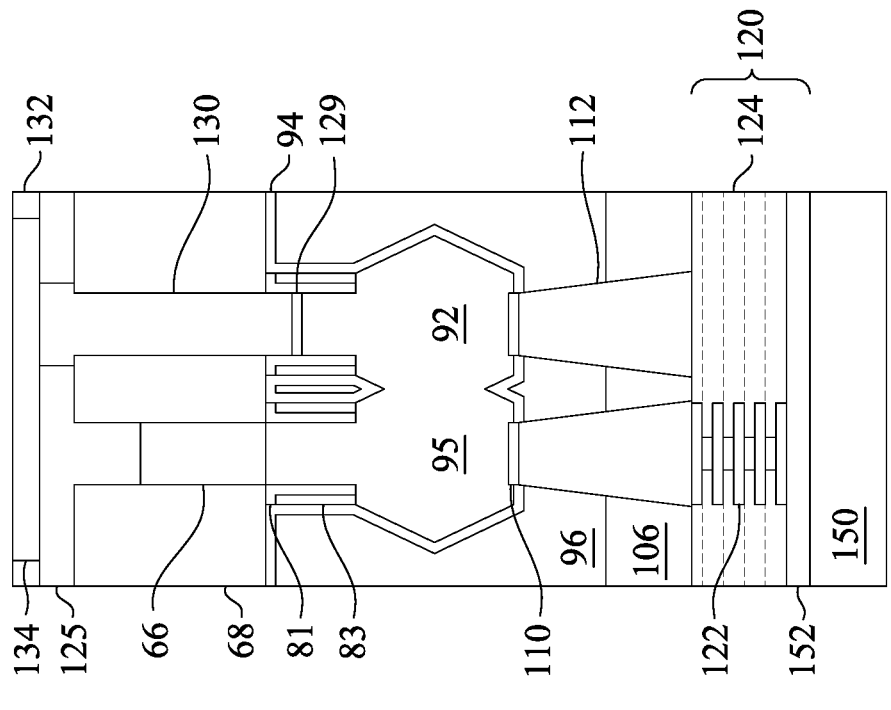
Figure 28A:
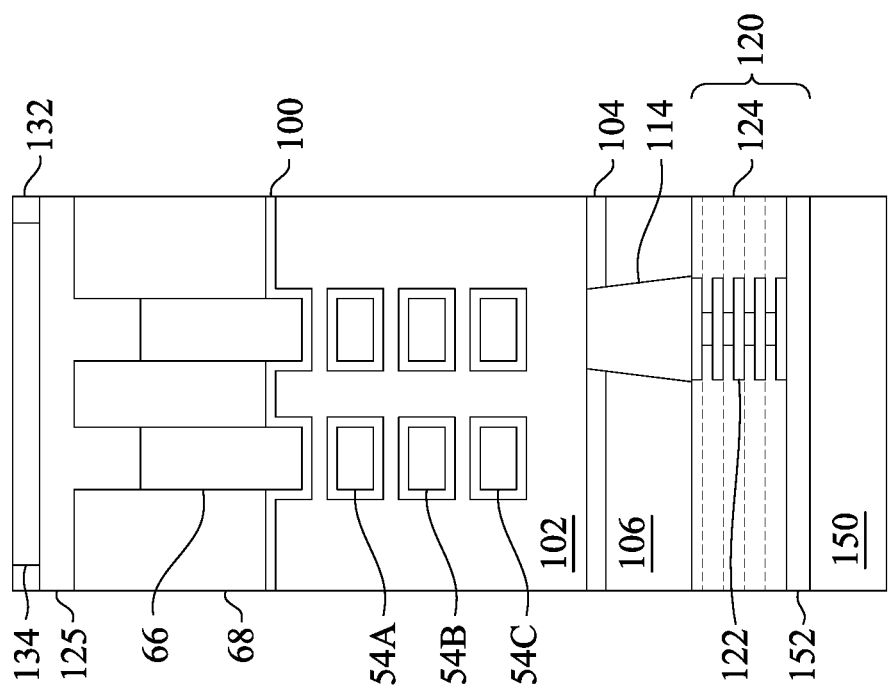
Figure 28C:
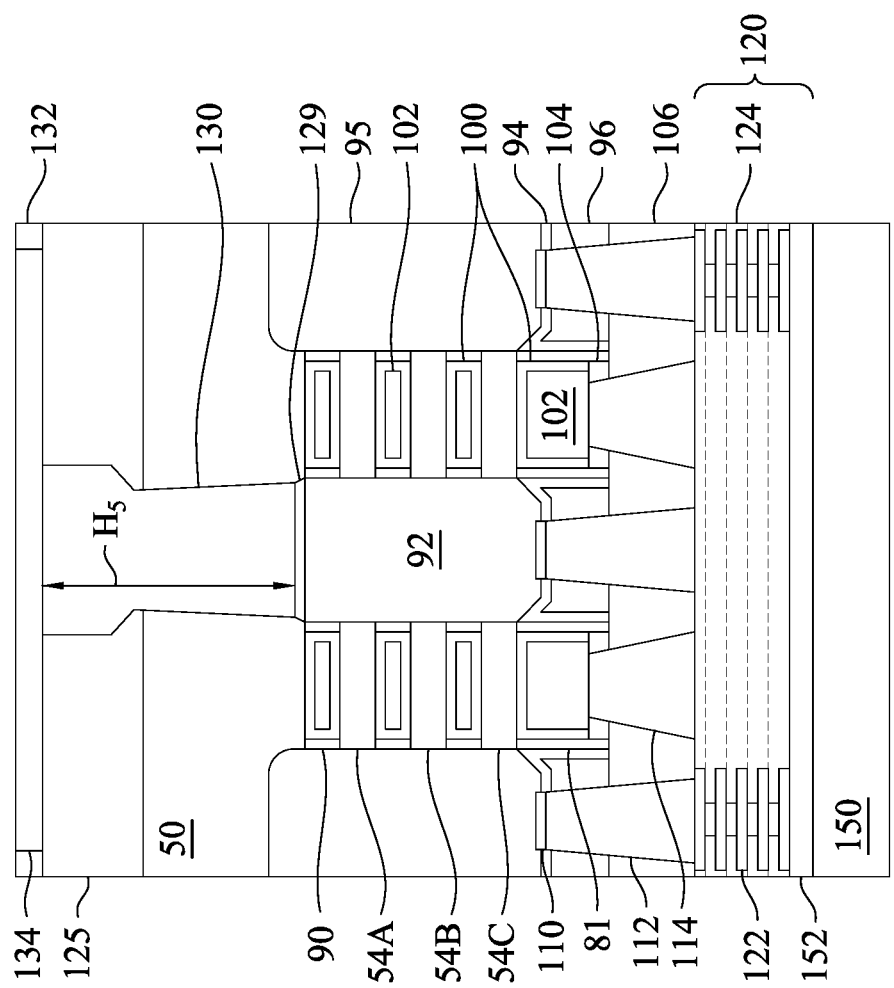

In FIGS. 28A through 28C, the backside vias 130 are planarized and second conductive lines 134 and a third dielectric layer 132 are formed. A planarization process, such as a CMP, may be performed to level backside surfaces of the backside vias 130 with backside surfaces of the second dielectric layer 125. Following the planarization process, the backside vias 130 may have heights $H_5$ ranging from about 30 nm to about 80 nm. The second conductive lines 134 and the third dielectric layer 132 may then be formed over the backside vias 130 and the second dielectric layer 125. The third dielectric layer 132 may be similar to the second ILD 106. For example, the third dielectric layer 132 may be formed of materials and using processes the same as or similar to those used for the second ILD 106.

The second conductive lines 134 are formed in the third dielectric layer 132. Forming the second conductive lines 134 may include patterning recesses in the third dielectric layer 132 using a combination of photolithography and etching processes, for example. A pattern of the recesses in the third dielectric layer 132 may correspond to a pattern of the second conductive lines 134. The second conductive lines 134 are then formed by depositing a conductive material in the recesses. In some embodiments, the second conductive lines 134 comprise a metal layer, which may be a single layer or a composite layer comprising a plurality of sub-layers formed of different materials. In some embodiments, the second conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The second conductive lines 134 may be formed using, for example, CVD, ALD, PVD, plating or the like. The second conductive lines 134 are electrically coupled to the first epitaxial source/drain regions 92 through the backside vias 130 and the second silicide regions 129. A planarization process (e.g., a CMP, a grinding, an etch-back, or the like) may be performed to remove excess portions of the second conductive lines 134 formed over the third dielectric layer 132.

In some embodiments, the second conductive lines 134 are backside power rails, which are conductive lines that electrically connect the first epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the second conductive lines 134 may be at least twice a width of first level conductive lines (e.g., the first conductive features 122 and/or the first conductive lines 118) of the front-side interconnect structure 120.

Figure 29B:
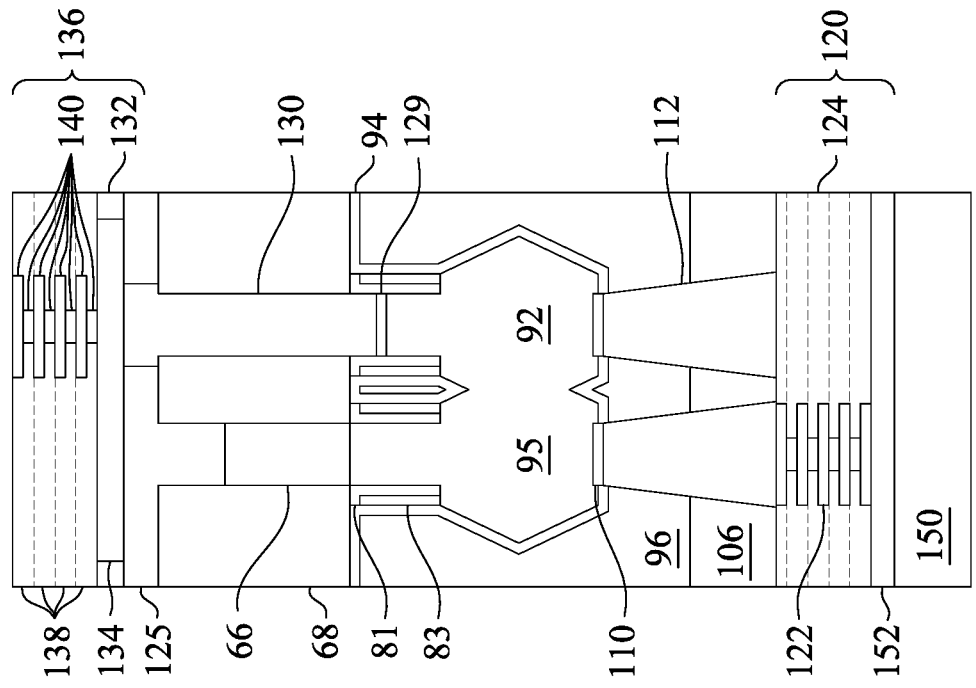
Figure 29A:
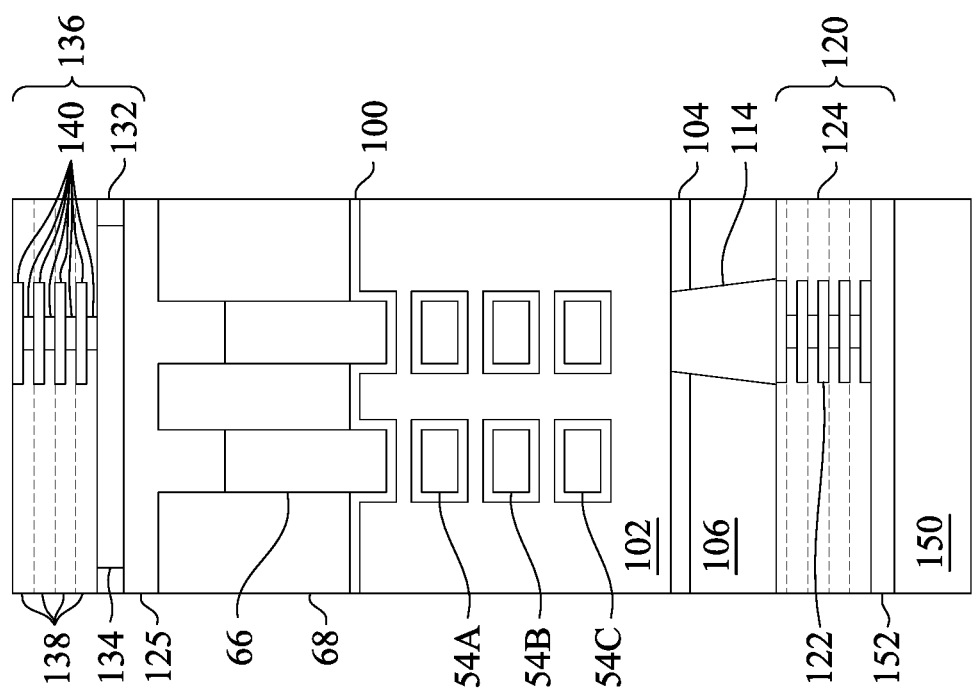
Figure 29C:
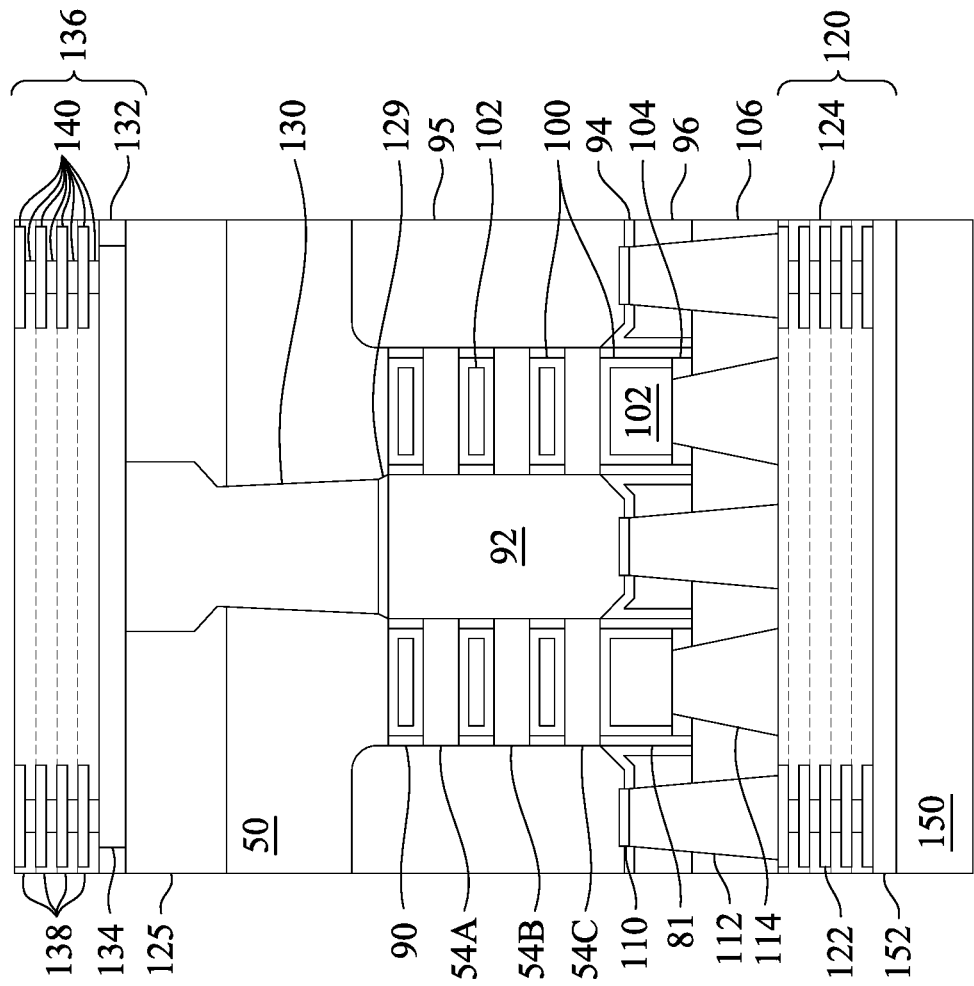

In FIGS. 29A through 29C, remaining portions of a backside interconnect structure 136 are formed over the third dielectric layer 132 and the second conductive lines 134. The backside interconnect structure 136 may be referred to as a backside interconnect structure because it is formed on a backside of the transistor structures 109 (e.g., a side of the transistor structures 109 opposite the side of the transistor structure 109 on which active devices are formed). The backside interconnect structure 136 may comprise the second dielectric layer 125, the third dielectric layer 132, the backside vias 130, and the second conductive lines 134. As illustrated in FIG. 29C, the backside vias 130 may comprise first tapered sidewalls which narrow in a direction towards the backside interconnect structure 136, second tapered sidewalls which extend from the first tapered sidewalls and widen in the direction towards the backside interconnect structure 136, and third vertical sidewalls which extend from the second tapered sidewalls and are perpendicular to a major surface of the substrate 50.

The remaining portions of the backside interconnect structure 136 may comprise materials and be formed using processes the same as or similar to those used for the front-side interconnect structure 120, discussed above with respect to FIGS. 21A through 21C. In particular, the backside interconnect structure 136 may comprise stacked layers of second conductive features 140 formed in fourth dielectric layers 138. The second conductive features 140 may include routing lines (e.g., for routing to and from subsequently formed contact pads and external connectors). The second conductive features 140 may further be patterned to include one or more embedded passive devices such as, resistors, capacitors, inductors, or the like. The embedded passive devices may be integrated with the second conductive lines 134 (e.g., the power rail) to provide circuits (e.g., power circuits) on the backside of the nano-FETs.

Figure 30B:
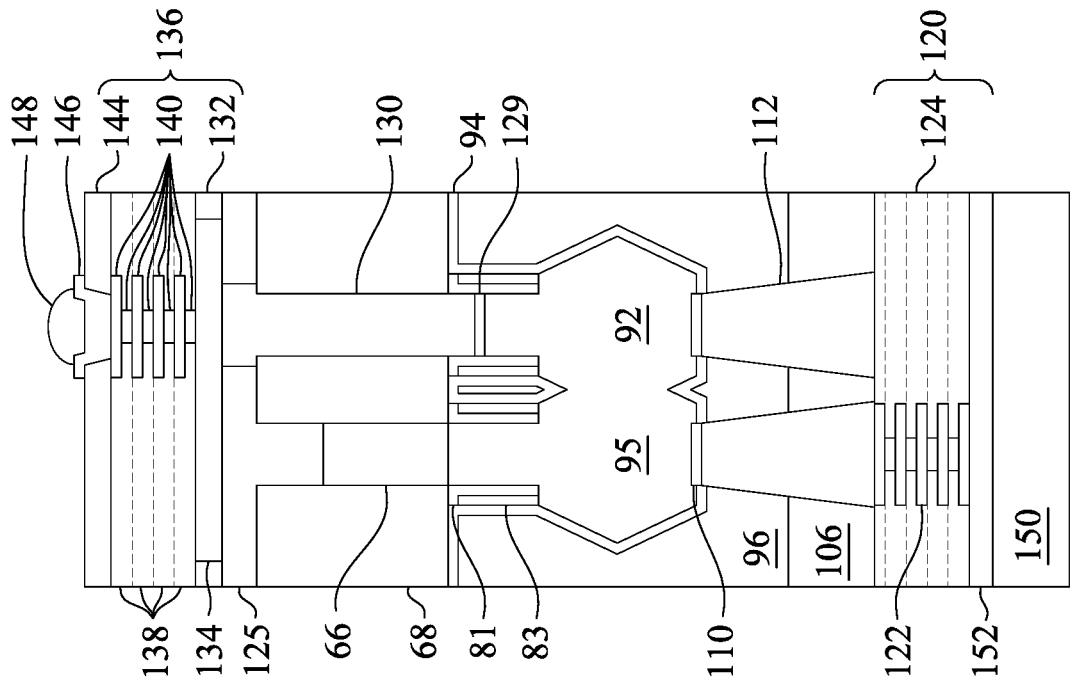
Figure 30A:
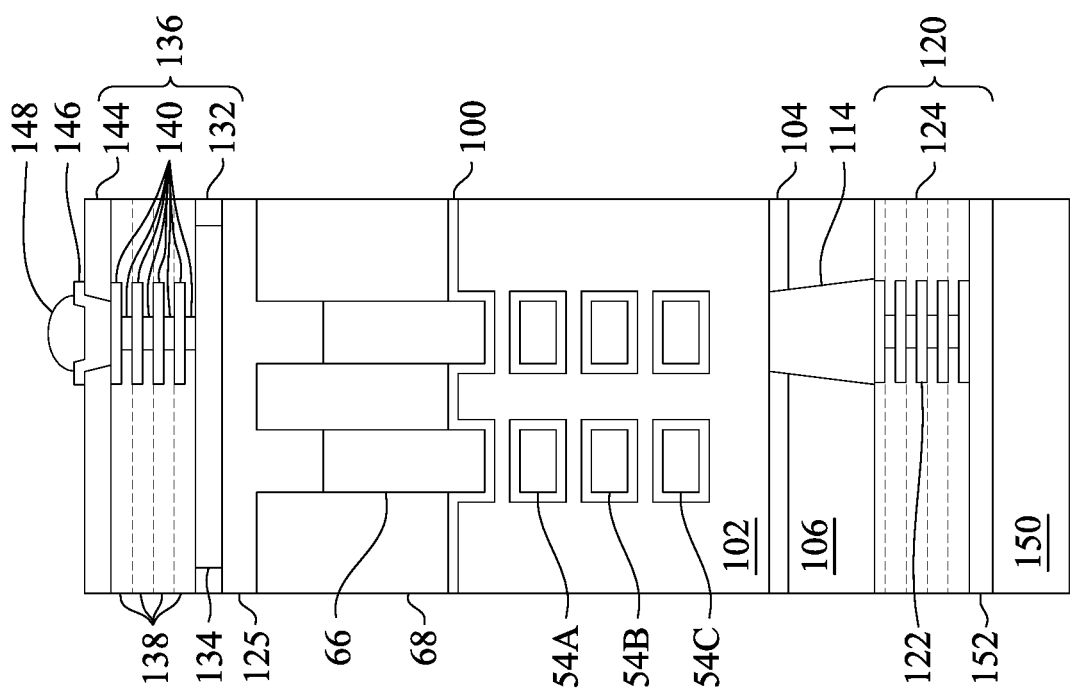
Figure 30C:
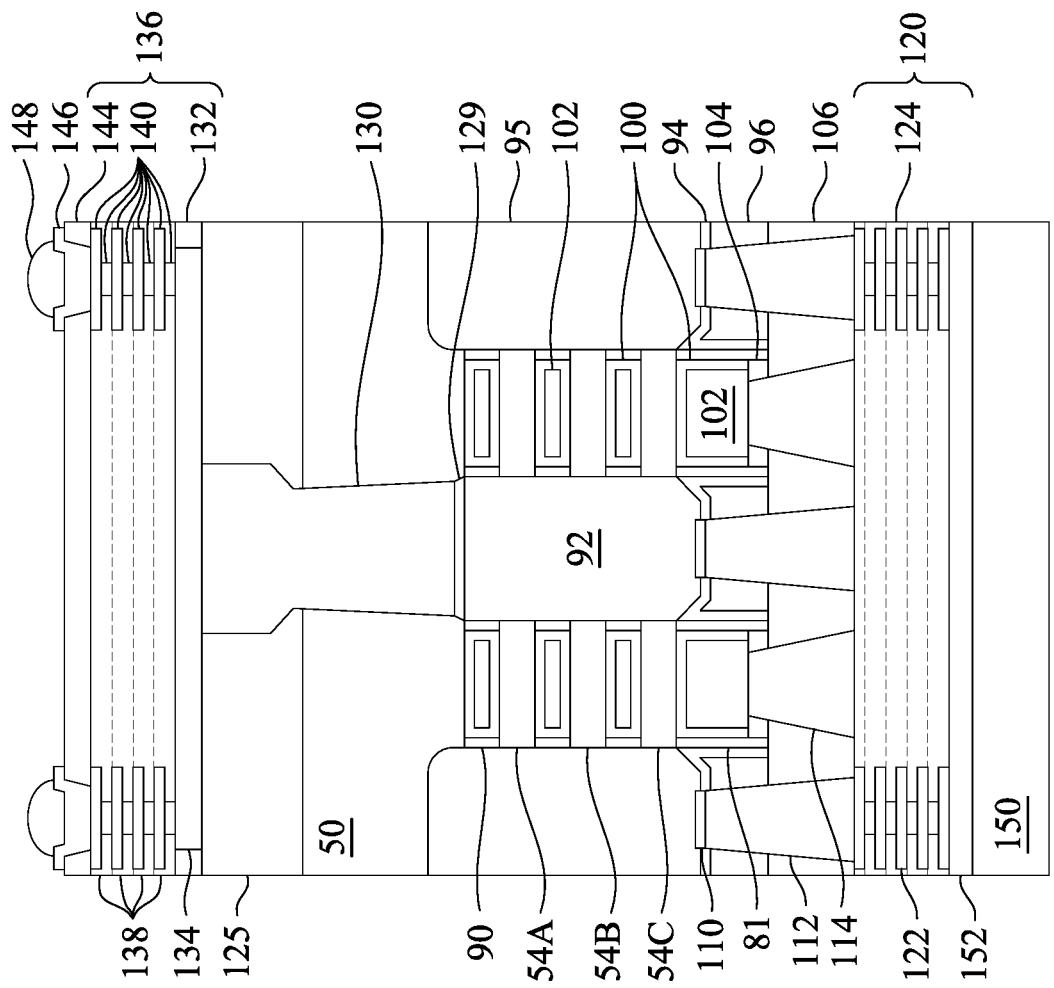

In FIGS. 30A through 30C, a passivation layer 144, UBMs 146, and external connectors 148 are formed over the backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the second conductive features 140 in the backside interconnect structure 136 and the external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost second conductive features 140 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the nano-FETs described above.

Embodiments may achieve advantages. For example, forming backside vias, which include enlarged backside portions provides a larger contact area for the backside vias and reduces contact resistance in the backside vias. This in turn leads to reduced RC time delay and improved device performance.

In accordance with an embodiment, a device includes a first transistor structure in a first device layer; a front-side interconnect structure on a front-side of the first device layer; a first dielectric layer on a backside of the first device layer; a first contact extending through the first dielectric layer to a source/drain region of the first transistor structure; and a backside interconnect structure on a backside of the first dielectric layer and the first contact, the first contact including a first portion having first tapered sidewalls and a second portion having second tapered sidewalls, widths of the first tapered sidewalls narrowing in a direction towards the backside interconnect structure, and widths of the second tapered sidewalls widening in a direction towards the backside interconnect structure. In an embodiment, the first contact further includes a third portion having vertical sidewalls. In an embodiment, the third portion extends from a surface of the first contact facing the backside interconnect structure to the second portion, the second portion extends from the third portion to the first portion, and the first portion extends from the second portion to a surface of the first contact facing the first device layer. In an embodiment, a ratio of a width of the third portion to an average width of the first portion is from 2 to 7. In an embodiment, the first transistor structure includes a gate structure, a semiconductor substrate extending between the gate structure and the first dielectric layer, the semiconductor substrate surrounding the first tapered sidewalls, and the first dielectric layer surrounding the second tapered sidewalls. In an embodiment, a surface of the first contact facing the backside interconnect structure and a surface of the first dielectric layer facing the backside interconnect structure are level with one another. In an embodiment, the device further includes a power rail electrically coupled to the first contact, the first contact being electrically coupled to the source/drain region through a silicide region.

In accordance with another embodiment, a device includes a first substrate; a first device layer over the first substrate, the first device layer including a first transistor structure; a first dielectric layer on a backside of the first device layer; a first backside via electrically coupled to a first source/drain region of the first transistor structure, the first backside via extending through the first substrate and the first dielectric layer, the first backside via having a first width in the first substrate and a second width in the first dielectric layer, the second width being greater than the first width; and a first interconnect structure over the first dielectric layer and the first backside via, the first interconnect structure including a power rail electrically coupled to the first source/drain region through the first backside via. In an embodiment, a portion of the first backside via extending through the first dielectric layer includes tapered sidewalls having widths which widen in a direction towards the first interconnect structure. In an embodiment, a portion of the first backside via extending through the first substrate includes tapered sidewalls having widths which narrow in a direction towards the first interconnect structure. In an embodiment, a portion of the first backside via extending through the first dielectric layer includes straight sidewalls having a constant width. In an embodiment, the widths of the tapered sidewalls are from 10 nm to 30 nm and the constant width of the straight sidewalls is from 20 nm to 70 nm. In an embodiment, a ratio of the second width to the first width is from 2 to 7.

In accordance with yet another embodiment, a method includes forming a first transistor on a first substrate; exposing a first epitaxial material, exposing the first epitaxial material including thinning a backside of the first substrate; epitaxially growing a second epitaxial material over the first epitaxial material; and replacing the second epitaxial material and the first epitaxial material with a backside via, the backside via being electrically coupled to a source/drain region of the first transistor. In an embodiment, the first epitaxial material and the second epitaxial material each include silicon germanium having an atomic concentration of germanium from 20% to 60%. In an embodiment, the method further includes etching a first recess in the first substrate; forming the first epitaxial material in the first recess; forming a third epitaxial material over the first epitaxial material; and forming the source/drain region over the third epitaxial material, the source/drain region filling a remaining portion of the first recess. In an embodiment, the first epitaxial material, the second epitaxial material, and the third epitaxial material include silicon germanium, the third epitaxial material has a lower atomic concentration of germanium than the first epitaxial material and the second epitaxial material. In an embodiment, the first epitaxial material and the second epitaxial material each have an atomic concentration of germanium from 20% to 60%, and the third epitaxial material has an atomic concentration of germanium from 0% to 20%. In an embodiment, the second epitaxial material is grown with an octagonal shape in a cross-sectional view. In an embodiment, the method further includes forming a dielectric layer over the first substrate, the dielectric layer surrounding a first portion of the second epitaxial material, a second portion of the second epitaxial material being exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate stack on a semiconductor substrate;
   etching the semiconductor substrate to form a first recess adjacent the gate stack;
   epitaxially growing a first epitaxial material in the first recess;
   epitaxially growing a source/drain region in the first recess on the first epitaxial material;
   etching a backside of the semiconductor substrate to expose the first epitaxial material; and
   epitaxially growing a second epitaxial material on the first epitaxial material.

2. The method of claim 1, further comprising forming a dielectric mask on the semiconductor substrate before epitaxially growing the second epitaxial material on the first epitaxial material.

3. The method of claim 1, further comprising:
   forming a dielectric layer on the semiconductor substrate and the second epitaxial material; and
   removing the second epitaxial material and the first epitaxial material to form a second recess.

4. The method of claim 3, further comprising forming a first contact in the second recess, wherein the first contact is in contact with the source/drain region, the semiconductor substrate, and the dielectric layer.

5. The method of claim 1, wherein the first epitaxial material has first tapered sidewalls, wherein the second epitaxial material has second tapered sidewalls, wherein widths of the first tapered sidewalls narrow in a direction away from the source/drain region, and wherein widths of the second tapered sidewalls widen in the direction away from the source/drain region.

6. The method of claim 5, wherein the second epitaxial material further comprises vertical sidewalls extending in a direction perpendicular to a major surface of the semiconductor substrate.

7. The method of claim 1, wherein the first epitaxial material and the second epitaxial material comprise silicon germanium having an atomic concentration of germanium in a range from 20% to 60%.

8. A method comprising:
providing a first transistor structure on a first substrate;
etching the first substrate to expose a first epitaxial material;
epitaxially growing a second epitaxial material on the first epitaxial material;
depositing a first dielectric layer on the second epitaxial material and a backside of the first transistor structure;
etching the second epitaxial material and the first epitaxial material to form a first recess exposing a first source/drain region of the first transistor structure;
forming a first backside via in the first recess, wherein the first backside via is electrically coupled to the first source/drain region of the first transistor structure; and
forming a first interconnect structure on the first dielectric layer and the first backside via.

9. The method of claim 8, wherein the first backside via is formed in contact with the first substrate and the first dielectric layer.

10. The method of claim 8, wherein the first epitaxial material and the second epitaxial material comprise silicon germanium.

11. The method of claim 8, further comprising:
forming a third epitaxial material on the first epitaxial material; and
forming the first source/drain region on the first epitaxial material, wherein the first epitaxial material has a greater germanium concentration than the third epitaxial material.

12. The method of claim 8, wherein forming the first interconnect structure comprises forming a power rail electrically coupled to the first source/drain region through the first backside via.

13. The method of claim 8, wherein the first epitaxial material comprises tapered sidewalls having widths which narrow in a first direction away from the first source/drain region, wherein the second epitaxial material comprises tapered sidewalls having widths which widen in the first direction, and wherein the second epitaxial material comprises straight sidewalls having a constant width.

14. A method comprising:
forming a first transistor on a first substrate;
etching a backside of the first substrate to expose a first epitaxial material;
forming a first dielectric material on the first substrate and the first epitaxial material;
removing the first epitaxial material to form a first recess exposing a first source/drain region of the first transistor; and
depositing a backside via in the first recess and contacting the first source/drain region, the first substrate, and the first dielectric material.

15. The method of claim 14, further comprising forming a silicide in the first recess on the first source/drain region, wherein the backside via is formed on the silicide.

16. The method of claim 14, further comprising epitaxially growing a second epitaxial material on the first epitaxial material after etching the backside of the first substrate to expose the first epitaxial material and before forming the first dielectric material.

17. The method of claim 14, wherein forming the first transistor comprises:
forming a gate structure on the first substrate;
etching a second recess in the first substrate adjacent the gate structure;
epitaxially growing the first epitaxial material in the second recess;
epitaxially growing a second epitaxial material in the second recess on the first epitaxial material; and
epitaxially growing the first source/drain region on the second epitaxial material.

18. The method of claim 17, wherein the first epitaxial material comprises silicon germanium having an atomic concentration of germanium in a range from 20% to 60%, and wherein the second epitaxial material comprises silicon germanium having an atomic concentration of 20% or less.

19. The method of claim 17, wherein removing the first epitaxial material to form the first recess further comprises removing the second epitaxial material.

20. The method of claim 14, further comprising:
epitaxially growing a second epitaxial material on the first epitaxial material, wherein removing the first epitaxial material to form the first recess further comprises removing the second epitaxial material; and
after forming the first recess, performing an isotropic etch process to widen the first recess.

* * * * *